United States Patent
Nozaki

(10) Patent No.: US 10,437,149 B2
(45) Date of Patent: Oct. 8, 2019

(54) PHOTOSENSITIVE RESIN COMPOSITION, PLANOGRAPHIC PRINTING PLATE PRECURSOR, METHOD FOR PRODUCING PLANOGRAPHIC PRINTING PLATE, AND POLYMER COMPOUND

(71) Applicant: FUJIFILM CORPORATION, Minato-ku, Tokyo (JP)

(72) Inventor: Atsuyasu Nozaki, Shizuoka (JP)

(73) Assignee: FUJIFILM CORPORATION, Tokyo (JP)

(*) Notice: Subject to any disclaimer, the term of this patent is extended or adjusted under 35 U.S.C. 154(b) by 0 days.

(21) Appl. No.: 15/655,887

(22) Filed: Jul. 21, 2017

(65) Prior Publication Data
US 2017/0329225 A1 Nov. 16, 2017

Related U.S. Application Data

(63) Continuation of application No. PCT/JP2016/054405, filed on Feb. 16, 2016.

(30) Foreign Application Priority Data

Feb. 19, 2015 (JP) ................. 2015-030739

(51) Int. Cl.
| | | |
|---|---|---|
| *G03F 7/20* | (2006.01) | |
| *G03F 7/039* | (2006.01) | |
| *C08G 64/12* | (2006.01) | |
| *C08G 18/32* | (2006.01) | |
| *C08G 73/14* | (2006.01) | |
| *G03F 7/095* | (2006.01) | |
| *B41C 1/10* | (2006.01) | |
| *B41N 1/14* | (2006.01) | |
| *C08G 18/28* | (2006.01) | |
| *C08G 18/73* | (2006.01) | |
| *C08G 75/30* | (2006.01) | |
| *G03F 7/004* | (2006.01) | |
| *G03F 7/11* | (2006.01) | |

(52) U.S. Cl.
CPC .......... *G03F 7/039* (2013.01); *B41C 1/10* (2013.01); *B41C 1/1008* (2013.01); *B41N 1/14* (2013.01); *C08G 18/2865* (2013.01); *C08G 18/32* (2013.01); *C08G 18/3246* (2013.01); *C08G 18/73* (2013.01); *C08G 64/12* (2013.01); *C08G 73/14* (2013.01); *C08G 75/30* (2013.01); *G03F 7/0045* (2013.01); *G03F 7/095* (2013.01); *G03F 7/11* (2013.01); *B41C 1/1016* (2013.01); *B41C 2210/02* (2013.01); *B41C 2210/06* (2013.01); *B41C 2210/26* (2013.01)

(58) Field of Classification Search
CPC ...................................... G03F 7/11
See application file for complete search history.

(56) References Cited

U.S. PATENT DOCUMENTS

| | | | |
|---|---|---|---|
| 2005/0064325 A1* | 3/2005 | Nakamura | B41C 1/1008 430/270.1 |
| 2005/0069812 A1* | 3/2005 | Maemoto | B41C 1/1008 430/270.1 |
| 2011/0223536 A1* | 9/2011 | Shibuya | G03F 7/0395 430/270.1 |

FOREIGN PATENT DOCUMENTS

| | | | |
|---|---|---|---|
| EP | 3128367 A1 | | 2/2017 |
| JP | 02156241 A | * | 6/1990 |
| JP | H02-156241 A | | 6/1990 |
| JP | 2005-106910 A | | 4/2005 |

OTHER PUBLICATIONS

International Search Report issued in International Application No. PCT/JP2016/054405 dated May 17, 2016.
Written Opinion of the ISA issued in International Application No. PCT/JP2016/054405 dated May 17, 2016.
Extended European Search Report dated Feb. 8, 2018, issued in corresponding EP Patent Application No. 16752458.6.
English language translation of the following: Office action dated Jul. 31, 2018 from the JPO in a Japanese patent application No. 2017-500677 corresponding to the instant patent application.
English language translation of the following: Office action dated Feb. 26, 2019 from the JPO in a Japanese patent application No. 2017-500677 corresponding to the instant patent application.

* cited by examiner

*Primary Examiner* — Chanceity N Robinson
(74) *Attorney, Agent, or Firm* — SOLARIS Intellectual Property Group, PLLC

(57) ABSTRACT

Provided is a photosensitive resin composition, including: a polymer compound which has a polycyclic structure and a sulfonamide group in a main chain thereof; and an infrared absorbent, wherein the polycyclic structure has at least one structure selected from the group consisting of a fused cyclic hydrocarbon structure and a fused polycyclic aromatic structure.

16 Claims, No Drawings

PHOTOSENSITIVE RESIN COMPOSITION, PLANOGRAPHIC PRINTING PLATE PRECURSOR, METHOD FOR PRODUCING PLANOGRAPHIC PRINTING PLATE, AND POLYMER COMPOUND

CROSS-REFERENCE TO RELATED APPLICATIONS

This application is a continuation application of International Application No. PCT/JP2016/054405, filed Feb. 16, 2016, the disclosure of which is incorporated herein by reference in its entirety. Further, this application claims priority from Japanese Patent Application No. 2015-030739, filed Feb. 19, 2015, the disclosure of which is incorporated herein by reference in its entirety.

BACKGROUND OF THE INVENTION

1. Field of the Invention

The present invention relates to a photosensitive resin composition, a planographic printing plate precursor, a method for producing a planographic printing plate, and a polymer compound.

2. Description of the Related Art

In recent years, the development of lasers has been remarkable, and in particular, solid-state lasers and semiconductor lasers having an emission region in a near infrared region to an infrared region, with a high output and a small size, have become easily available. In the field of planographic printing, as an exposure light source when manufacturing a printing plate directly from digital data from a computer or the like, these lasers are very useful.

A positive type planographic printing plate precursor for infrared laser has an alkali-soluble binder resin and an infrared absorbent which absorbs light and generates heat, as essential components. In the unexposed portion (image portion), the infrared absorbent and the like act as a development restrainer which substantially decreases the solubility of a binder resin in a developer due to an interaction with the binder resin, and in the exposed portion (non-image portion), the interaction between the infrared absorbent and the like and the binder resin weakens due to generated heat, the infrared absorbent and the like dissolve in an alkaline developer, and as a result, a planographic printing plate is formed.

As the planographic printing plate in the related art, the planographic printing plates described in JP1990-156241A (JP-H02-156241A) or JP2005-106910A are known.

SUMMARY OF THE INVENTION

Since the image forming capability of a positive type planographic printing plate precursor for infrared laser as described above depends on the heat generated by infrared laser exposure to the image recording layer (hereinafter, also simply referred to as a "recording layer") surface, in the vicinity of a support, an image is formed by diffusion of heat to the support, that is, the heat quantity to be used for solubilization of the recording layer is reduced, and thus, sensitivity becomes low. Therefore, there is a problem in which development restraining ability loss effects of the recording layer in the non-image portion are not sufficiently obtained, the difference between the image portion and the non-image portion is reduced, and thus, highlight reproducibility is insufficient.

In addition, to solve the above-described problem of the highlight reproducibility, using a recording layer formed of a material having characteristics in which a non-image portion can be more easily developed, that is, the solubility in an alkali aqueous solution is better may be considered, but there is a problem in which such a recording layer is chemically weakened even in the image portion region and easily damaged by an ink washing solvent used in the developer or during printing, or the plate cleaner, that is, is poor in chemical resistance, and in the unexposed portion region, there is demand for a resin material having characteristics in which the chemical resistance and the durability of the coating film are excellent and the developability thereof becomes excellent after the dissolution suppressing action is removed by exposure.

For the same purpose as described above, various improved techniques have been proposed, and for example, a technique for a planographic printing plate precursor in which a recording layer containing a polyurethane resin having sulfonamide in the main chain which is insoluble in water and soluble in an alkaline aqueous solution, a photosensitive composition containing a photosensitive compound which acts as a positive type (for example, refer to JP1990-156241A (JP-H02-156241A)) or a water-insoluble and alkali-soluble resin having an active hydrogen in the main chain, on a support, and an infrared absorbent, of which the solubility in an alkaline aqueous solution is increased by exposure is provided has been disclosed (for example, refer to JP2005-106910A). According to these planographic printing plate precursors, it is possible to provide a positive type planographic printing plate precursor having excellent printing durability and excellent chemical resistance.

However, in recent years, diversifying and varying of print materials (paper, ink, and the like) have progressed, and even in the case of using the same printing plate, there is a problem in which the number of printable sheets (hereinafter, referred to as "printing durability") is greatly reduced depending on the type of a print material, in the former technique, chemical resistance is excellent, but there is problem in which, in particular, since the film hardness of the resin used in the lower layer is not sufficient, the printing durability in printing using a low quality print material (paper or ink) is greatly reduced and since the development speed (developability) to an alkali aqueous solution is not sufficient, the difference between the image portion and the non-image portion is reduced, and thus, highlight reproducibility is not sufficient, and in the latter technique, the printing durability and the highlight reproducibility in printing using a high quality print material (paper or ink) are excellent, but there is problem in which, in particular, since the film hardness of the resin used in the lower layer is not sufficient, the printing durability in printing using a low quality print material (paper or ink) is greatly reduced, and thus, this technique also has room for improvement. Therefore, it is difficult to maintain and improve a plurality of characteristics such as printing durability depending on the film hardness of the lower layer, chemical resistance, the development speed (highlight reproducibility) to an alkali aqueous solution.

An object of the present invention is to provide a photosensitive resin composition which enables production of a planographic printing plate precursor having a non-image portion which has good solubility in an alkali aqueous solution and which enables production of a planographic printing plate having excellent chemical resistance and excellent printing durability, a planographic printing plate precursor obtained by using the photosensitive resin composition, a method for producing a planographic printing plate, and a new polymer compound.

The above-described object of the present invention has been achieved by the means according to the following <1>, <9>, <13>, or <14>. <1>, <9>, <13>, or <14> are described below with <2> to <8>, <10> to <12>, and <15> to <18> which are preferable embodiments.

<1> A photosensitive resin composition, comprising:

a polymer compound which has a polycyclic structure and a sulfonamide group in a main chain thereof; and an infrared absorbent.

<2> The photosensitive resin composition according to <1>, wherein the polycyclic structure comprises at least one structure selected from the group consisting of a fused cyclic hydrocarbon structure, a fused polycyclic aromatic structure, and a structure formed by a plurality of aromatic hydrocarbons being bonded through a single bond.

<3> The photosensitive resin composition according to <1> or <2>, wherein the polymer compound comprises a structure represented by any one of the following Formulae A-1 to A-6.

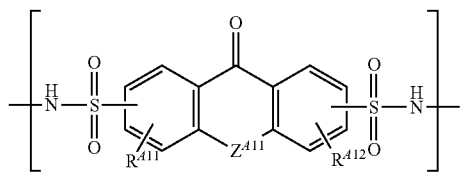

(A-1)

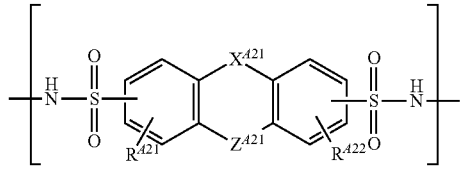

(A-2)

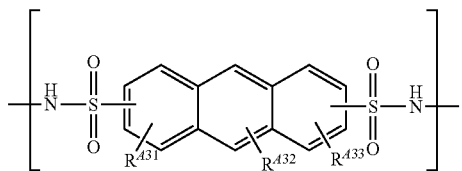

(A-3)

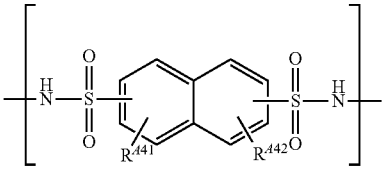

(A-4)

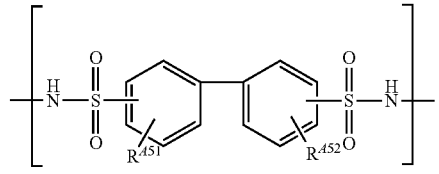

(A-5)

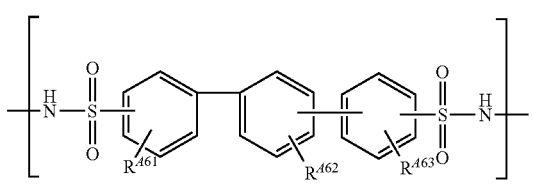

(A-6)

In Formulae A- to A-6, $R^{A11}$, $R^{A12}$, $R^{A21}$, $R^{A22}$, $R^{A31}$ to $R^{A33}$, $R^{A41}$, $R^{A42}$, $R^{A51}$, $R^{A52}$, and $R^{A61}$ to $R^{A63}$ each independently represent a hydrogen atom, a sulfonamide group, a hydroxyl group, a carboxy group, an alkyl group, or a halogen atom; $Z^{A11}$ and $Z^{A21}$ each independently represent —C(R)$_2$—, —O—, —NR—, —S—, or a single bond, wherein R represents a hydrogen atom or an alkyl group; and $X^{A21}$ represents —C(R')$_2$—, —O—, —NR'—, —S—, or a single bond, wherein R' represents a hydrogen atom or an alkyl group.

<4> The photosensitive resin composition according to any one of <1> to <3>, wherein the polymer compound comprises a structure represented by any one of the following Formulae B-1 to B-6.

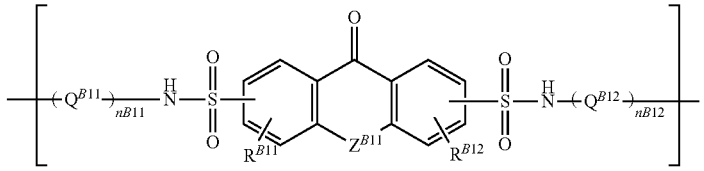

(B-1)

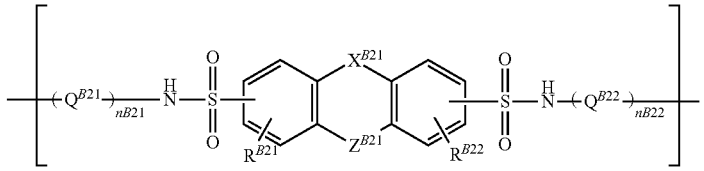

(B-2)

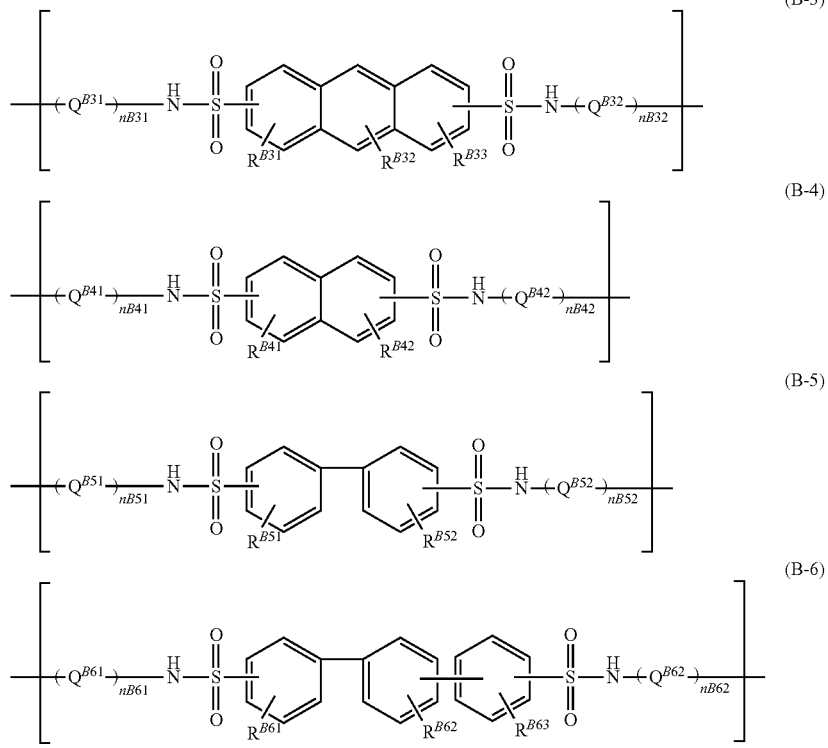

In Formulae B-1 to B-6, $R^{B11}$, $R^{B12}$, $R^{B21}$, $R^{B22}$, $R^{B31}$ to $R^{B33}$, $R^{B41}$, $R^{B42}$, $R^{B51}$, $R^{B52}$, and $R^{B61}$ to $R^{B63}$ each independently represent a hydrogen atom, a sulfonamide group, a hydroxyl group, a carboxy group, an alkyl group, or a halogen atom; $Z^{B11}$ and $Z^{B21}$ each independently represent —C(R)$_2$—, —O—, —NR—, —S—, or a single bond, wherein R represents a hydrogen atom or an alkyl group; $X^{B21}$ represents —C(R')$_2$—, —O—, —NR'—, —S—, or a single bond, wherein R' represents a hydrogen atom or an alkyl group; $Q^{B11}$, $Q^{B12}$, $Q^{B21}$, $Q^{B22}$, $Q^{B31}$, $Q^{32}$, $Q^{B41}$, $Q^{B42}$, $Q^{B51}$, $Q^{B52}$, $Q^{B61}$, and $Q^{B62}$ each independently represent an alkylene group, an arylene group, a divalent saturated alicyclic hydrocarbon group, a divalent unsaturated alicyclic hydrocarbon group, or a divalent group formed by a plurality of these groups being linked to each other; and nB11, nB12, nB21, nB22, nB31, nB32, nB41, nB42, nB51, nB52, nB61, and nB62 each independently represent an integer of 1 or larger.

<5> The photosensitive resin composition according to <4>, wherein the polymer compound comprises a structure represented by the following Formula C-1 or C-2 as the structure represented by Formula B-1 or comprises a structure represented by the following Formula C-3 or C-4 as the structure represented by Formula B-2.

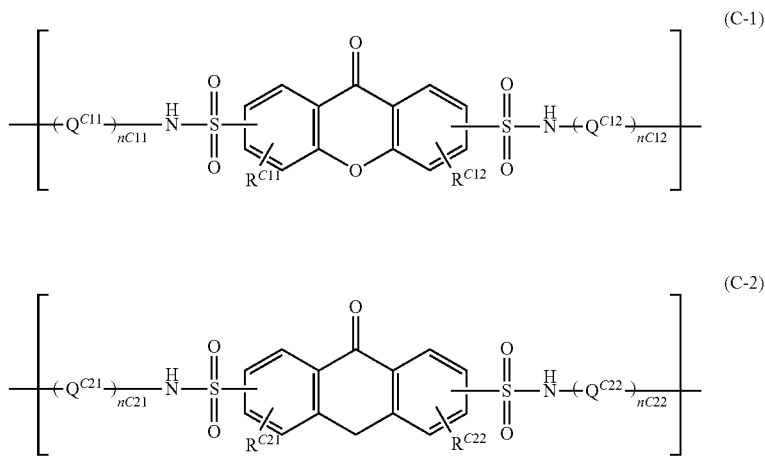

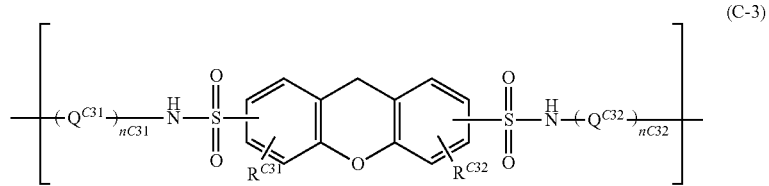

(C-3)

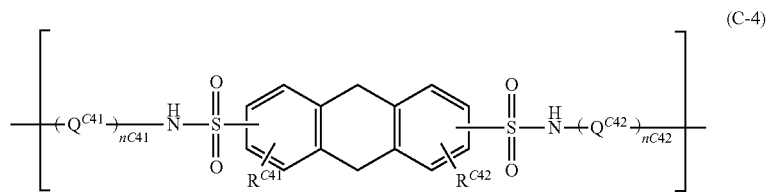

(C-4)

In Formulae C-1 to C-4, $R^{C11}$, $R^{C12}$, $R^{C21}$, $R^{C22}$, $R^{C31}$, $R^{C32}$, $R^{C41}$, and $R^{C42}$ each independently represent a hydrogen atom, a sulfonamide group, a hydroxyl group, a carboxy group, an alkyl group, or a halogen atom; $Q^{C11}$, $Q^{C12}$, $Q^{C21}$, $Q^{C22}$, $Q^{C31}$, $Q^{C32}$, $Q^{C41}$, and $Q^{C42}$ each independently represent an alkylene group, an arylene group, a divalent saturated alicyclic hydrocarbon group, a divalent unsaturated alicyclic hydrocarbon group, or a divalent group formed by a plurality of these groups being linked to each other; and nC11, nC12, nC21, nC22, nC31, nC32, nC41, and nC42 each independently represent an integer of 1 or larger.

<6> The photosensitive resin composition according to <5>, wherein the polymer compound comprises the structure represented by Formula C-1 or C-2.

<7> The photosensitive resin composition according to any one of <1> to <6>, wherein the polymer compound further comprises an alkyleneoxy group in the main chain thereof.

<8> The photosensitive resin composition according to any one of <1> to <7>, wherein the polymer compound further comprises at least one selected from the group consisting of a urea bond, a urethane bond, an imide bond, an amide bond, a carbonate bond, and a linking group formed by two or more of these bonds being bonded to each other, in the main chain thereof.

<9> A planographic printing plate precursor, comprising:
a support having a hydrophilic surface; and
an image recording layer which comprises the photosensitive resin composition according to any one of <1> to <8>, on the support.

<10> The planographic printing plate precursor according to <9>, which is a positive type planographic printing plate precursor.

<11> The planographic printing plate precursor according to <9> or <10>, which is a positive type planographic printing plate precursor, wherein the image recording layer comprises a lower layer and an upper layer in this order, on the support having the hydrophilic surface, and wherein at least one of the lower layer or the upper layer comprises the photosensitive resin composition.

<12> The planographic printing plate precursor according to any one of <9> to <11>, further comprising an undercoat layer between the support having a hydrophilic surface and the image recording layer.

<13> A method for producing a planographic printing plate, comprising in the following order:
image-wise exposing the planographic printing plate precursor according to any one of <9> to <12>; and
performing development using an alkali aqueous solution having a pH of 8.5 to 13.5.

<14> A polymer compound, comprising a structure represented by any one of the following Formulae B-1 to B-6.

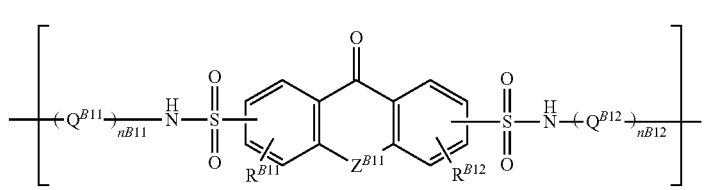

(B-1)

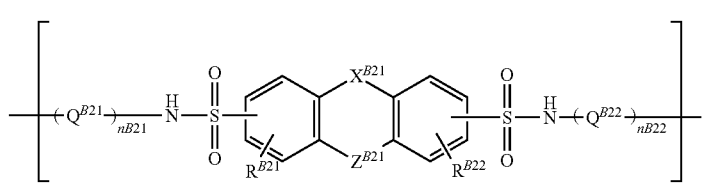

(B-2)

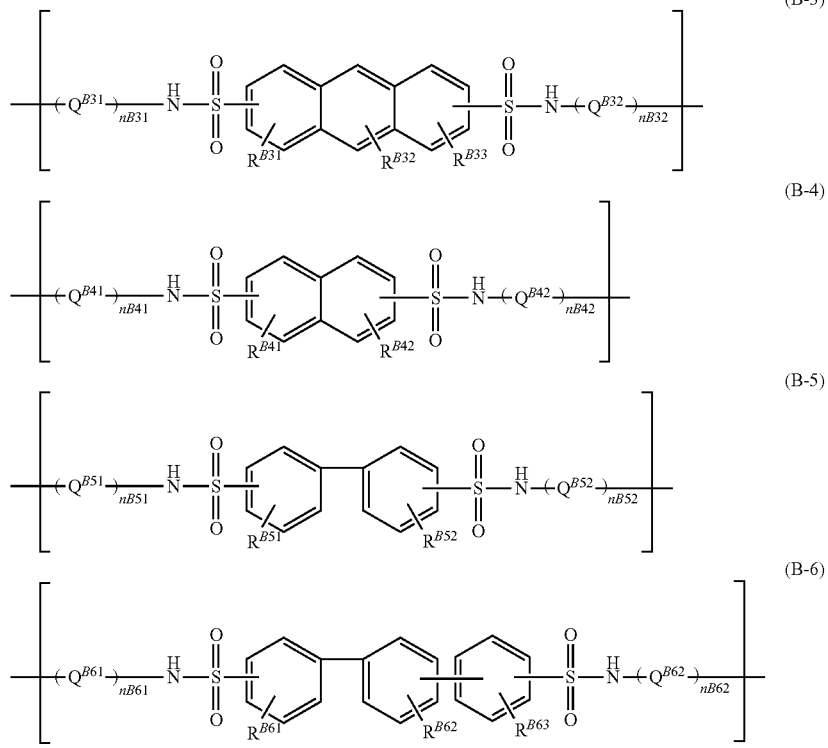

In Formulae B-1 to B-6, $R^{B11}$, $R^{B12}$, $R^{B21}$, $R^{B22}$, $R^{B31}$ to $R^{B33}$, $R^{B41}$, $R^{B42}$, $R^{B51}$, $R^{B52}$, and $R^{B61}$ to $R^{B63}$ each independently represent a hydrogen atom, a sulfonamide group, a hydroxyl group, a carboxy group, an alkyl group, or a halogen atom; $Z^{B11}$ and $Z^{B21}$ each independently represent —C(R)$_2$—, —O—, —NR—, —S—, or a single bond, wherein R represents a hydrogen atom or an alkyl group; $X^{B21}$ represents —C(R')$_2$—, —O—, —NR'—, —S—, or a single bond, wherein R' represents a hydrogen atom or an alkyl group; $Q^{B11}$, $Q^{B12}$, $Q^{B21}$, $Q^{B22}$, $Q^{B31}$, $Q^{32}$, $Q^{B41}$, $Q^{B42}$, $Q^{B51}$, $Q^{B52}$, $Q^{B61}$, and $Q^{B62}$ each independently represent an alkylene group, an arylene group, a divalent saturated alicyclic hydrocarbon group, a divalent unsaturated alicyclic hydrocarbon group, or a divalent group formed by a plurality of these groups being linked to each other; and nB11, nB12, nB21, nB22, nB31, nB32, nB41, nB42, nB51, nB52, nB61, and nB62 each independently represent an integer of 1 or larger.

<15> The polymer compound according to <14>, which comprises a structure represented by the following Formula C-1 or C-2 as the structure represented by Formula B-1 or comprises a structure represented by the following Formula C-3 or C-4 as the structure represented by Formula B-2.

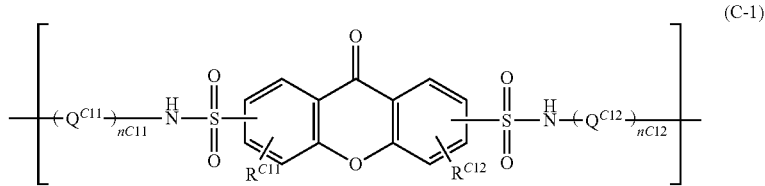

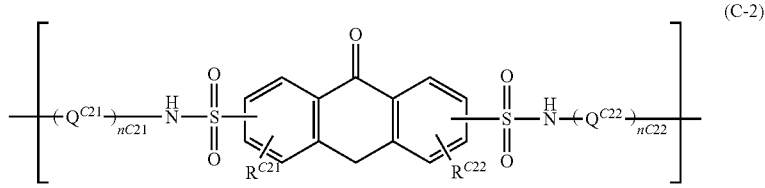

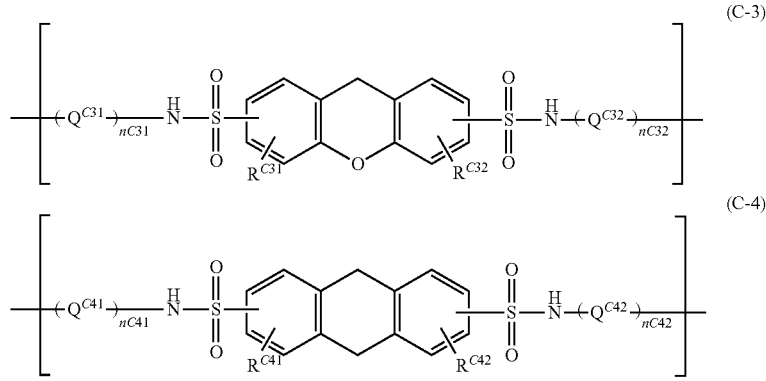

In Formulae C-1 to C-4, $R^{C11}$, $R^{C12}$, $R^{C21}$, $R^{C22}$, $R^{C31}$, $R^{C32}$, $R^{41}$, and $R^{42}$ each independently represent a hydrogen atom, a sulfonamide group, a hydroxyl group, a carboxy group, an alkyl group, or a halogen atom; $Q^{C11}$, $Q^{C21}$, $Q^{C22}$, $Q^{C31}$, $Q^{C32}$, $Q^{C41}$, and $Q^{C42}$ each independently represent an alkylene group, an arylene group, a divalent saturated alicyclic hydrocarbon group, a divalent unsaturated alicyclic hydrocarbon group, or a divalent group formed by a plurality of these groups being linked to each other; and nC11, nC12, nC21, nC22, nC31, nC32, nC41, and nC42 each independently represent an integer of 1 or larger.

<16> The polymer compound according to <15>, which comprises the structure represented by Formula C-1 or C-2.

<17> The polymer compound according to any one of <14> to <16>, comprising an alkyleneoxy group in a main chain thereof.

<18> The polymer compound according to any one of <14> to <17>, further comprising at least one selected from the group consisting of a urea bond, a urethane bond, an imide bond, an amide bond, a carbonate bond, and a linking group formed by two or more of these bonds being bonded to each other, in the main chain.

According to the present invention, it is possible to provide a photosensitive resin composition which enables production of a planographic printing plate precursor having a non-image portion which has good solubility in an alkali aqueous solution and which enables production of a planographic printing plate having excellent chemical resistance and excellent printing durability, a planographic printing plate precursor obtained by using the photosensitive resin composition, a method for producing a planographic printing plate, and a new polymer compound.

DESCRIPTION OF THE PREFERRED EMBODIMENTS

Hereinafter, the content of the present invention will be described in detail. The description of the constitutive elements as described below is based on representative embodiments of the present invention, but the present invention is not limited to such embodiments. Moreover, in the present specification, "to" is used to show a range in which numerical values described before and after "to" indicate the upper limit value and the lower limit value.

Regarding the description of a group (atomic group) in the present specification, when the description does not indicate whether a group is substituted or unsubstituted, the description includes both a group having a substituent and a group not having a substituent. For example, "alkyl group" includes not only an alkyl group (an unsubstituted alkyl group) which does not have a substituent, but also an alkyl group (a substituted alkyl group) which has a substituent.

In addition, the chemical structural formulae in the present specification are described using simplified structural formulae in which hydrogen atoms have been omitted, in some cases.

Moreover, in the present specification, "(meth)acrylate" represents acrylate and methacrylate, "(meth)acrylic" represents acrylic and methacrylic, and "(meth)acryloyl" represents acryloyl and methacryloyl.

In addition, in the present invention, "% by mass" has the same meaning as "% by weight" and "part(s) by mass" has the same meaning as "part(s) by weight".

Further, the "*" portions in the chemical formulae each independently represent a binding position with another structure.

In addition, in the present invention, preferable aspects in a combination are more preferable.

(Photosensitive Resin Composition)

A photosensitive resin composition of the present invention includes a polymer compound which has a polycyclic structure and a sulfonamide group in a main chain; and an infrared absorbent.

In the present invention, a "main chain" indicates relatively the longest bonding chain in a molecule of a polymer compound constituting a resin and a "side chain" indicates a carbon chain branched from the main chain.

As a result of conducting extensive studies, the inventors of the present invention found that it is possible to provide a planographic printing plate precursor having excellent chemical resistance, printing durability, and non-image portion development time when the photosensitive resin composition contains a polymer compound which has a polycyclic structure and a sulfonamide group in a main chain; and an infrared absorbent.

Although the action mechanism of the excellent effects due to containing the above materials is not clear, it is estimated as follows.

As the result of studies conducted by the present inventors, it was found that the film hardness of a resin is important for the printing durability in printing and the film hardness is significantly influenced by an interaction between polymer compounds. In particular, in low quality print materials, the effect is significant, and in general acrylic resins or polyurethane resins, sufficient film hardness is less likely to be imparted. It is thought that this is because inorganic salt particles (calcium carbonate, kaolin, or the like) included in a print material (paper, ink, or the like) are eluted during printing, this polishes the image portion of the printing plate, and as a result, abrasion is promoted. In contrast, it is considered that the interaction between polymer compounds is high, resistance to chemicals (cleaners or organic compounds) used for printing is extremely high, the strength of the image portion is excellent, and the printing durability is excellent because the polymer compound of the present invention has polycyclic structures having a high interaction between polymer compounds, such as a xanthone structure, an anthracene structure, a naphthalene structure, a biphenyl structure, and a terphenyl structure, in the main chain. It is assumed that the infiltration rate of a developer is high and the developability of an exposed portion is excellent in addition to an increase in alkali solubility of a polymer compound when the polymer compound includes a sulfonamide group. The printing durability is excellent because the polymer compound includes a plurality of bonds with an extremely high interaction. It is estimated that this is caused by improvement of the film hardness of the resin and effects of suppressing abrasion of the image portion of the printing plate.

In addition, as the result of studies conducted by the present inventors, it was found that it is effective for chemical resistance to increase the aggregating properties of a polymer compound. The polymer compound of the present invention has a bond such as a urea bond, a urethane bond, an imide bond, an amide bond, or a carbonate bond and a high-polar group such as a sulfonamide group, in addition to a xanthone structure, an anthracene structure, a naphthalene structure, a biphenyl structure, and a terphenyl structure with high aggregating properties, in the main chain, and thus the polymer compound has excellent chemical resistance. As a result, it is thought that both strength of an image portion and chemical resistance can be achieved.

Hereinafter, first, a polymer compound and an infrared absorbent which are essential components of the photosensitive resin composition of the present invention will be described.

<Polymer Compound>

The polymer compound used in the present invention (hereinafter, also referred to as a "specific polymer compound") has a polycyclic structure and a sulfonamide group in a main chain.

[Polycyclic Structure]

The polycyclic structure indicates a fused cyclic hydrocarbon structure, a fused polycyclic aromatic structure, and a structure formed by a plurality of aromatic hydrocarbons being bonded through a single bond. As the polycyclic structure, a naphthalene derivative structure, an anthracene derivative structure, a biphenyl structure, or a terphenyl structure is preferable. Among the naphthalene derivative structure and the anthracene derivative structure, a xanthone structure, an anthrone structure, a xanthene structure, a dihydroanthracene structure, and an anthracene structure are preferable, and from the viewpoints of chemical resistance, printing durability, and developability, a xanthone structure, an anthrone structure, a biphenyl structure, and a naphthalene structure are more preferable, and a xanthone structure and an anthrone structure are still more preferable.

[Acid Group in Main Chain and Side Chain]

The specific polymer compound includes a sulfonamide group in a main chain skeleton.

It is preferable that the specific polymer compound includes other acid groups in a side chain. As an acid group in the side chain, a phenolic hydroxyl group, a sulfonamide group, or a carboxy group is preferable.

[Structures A-1 to A-6]

Further, it is preferable that the specific polymer compound of the present invention has a structure represented by any one of the following Formulae A-1 to A-6.

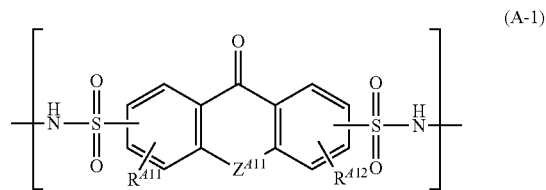

(A-1)

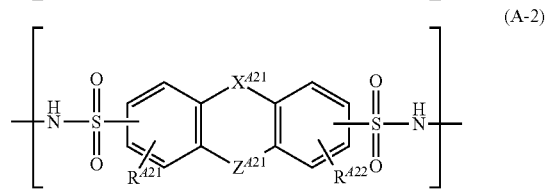

(A-2)

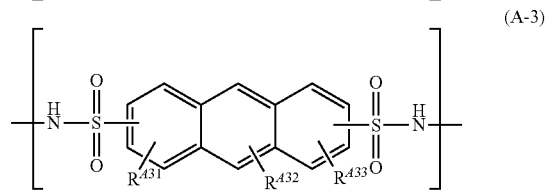

(A-3)

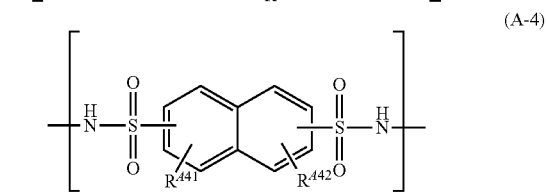

(A-4)

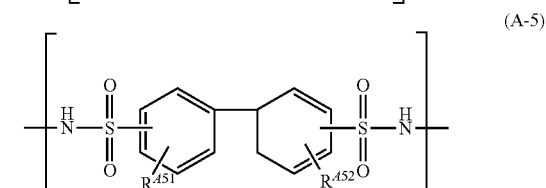

(A-5)

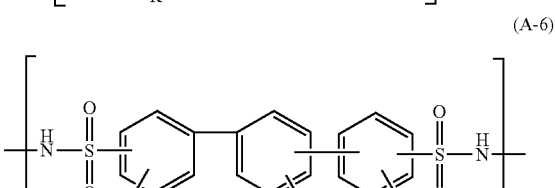

(A-6)

In Formulae A-1 to A-6, $R^{A11}$, $R^{A12}$, $R^{A21}$, $R^{A22}$, $R^{A31}$ to $R^{A33}$, $R^{A41}$, $R^{A42}$, $R^{A51}$, $R^{A52}$, and $R^{A61}$ to $R^{A63}$ each independently represent a hydrogen atom, a sulfonamide group, a hydroxyl group, a carboxy group, an alkyl group, or a halogen atom, preferably a hydrogen atom, an alkyl group, or a halogen atom, and more preferably a hydrogen atom. From the viewpoint of improving developability, an acid group such as a sulfonamide group, a hydroxyl group, or a carboxy group is preferable.

$Z^{A11}$ and $Z^{A21}$ each independently represent —C(R)$_2$—, —O—, —NR—, —S—, or a single bond, preferably —C(R)$_2$— or —O—, and more preferably —O—.

R represents a hydrogen atom or an alkyl group and preferably a hydrogen atom.

$X^{A21}$ represents —C(R')$_2$—, —O—, —NR'—, —S—, or a single bond and preferably —C(R')$_2$—.

R' represents a hydrogen atom or an alkyl group and preferably a hydrogen atom.

The content of the structure represented by any of Formulae A-1 to A-6 in the specific polymer compound of the present invention is preferably in a range of 10% to 90% by mass, more preferably in a range of 30% to 80% by mass, and still more preferably in a range of 50% to 75% by mass.

It is preferable that the polymer compound has a structure represented by any one of the following Formulae B-1 to B-6.

$Z^{B11}$ and $Z^{B21}$ each independently represent —C(R)$_2$—, —O—, —NR—, —S—, or a single bond, preferably —C(R)$_2$— or —O—, and more preferably —O—.

R represents a hydrogen atom or an alkyl group and preferably a hydrogen atom.

$X^{B21}$ represents —C(R')$_2$—, —O—, —NR'—, —S—, or a single bond and preferably —C(R')$_2$—.

R' represents a hydrogen atom or an alkyl group and preferably a hydrogen atom.

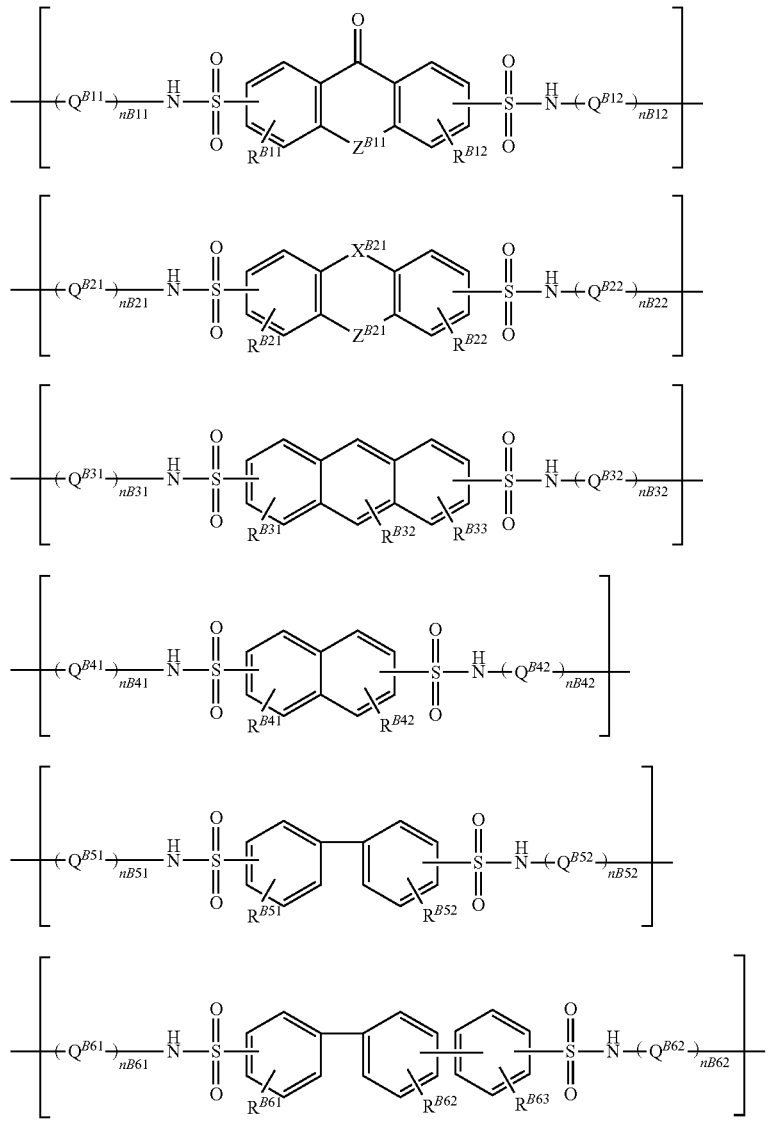

In Formulae B-1 to B-6, $R^{B11}$, $R^{B12}$, $R^{B21}$, $R^{B22}$, $R^{B31}$ to $R^{B33}$, $R^{B41}$, $R^{B42}$, $R^{B51}$, $R^{B52}$, and $R^{B61}$ to $R^{B63}$ each independently represent a hydrogen atom, a sulfonamide group, a hydroxyl group, a carboxy group, an alkyl group, or a halogen atom, preferably a hydrogen atom, an alkyl group, or a halogen atom, and more preferably a hydrogen atom. From the viewpoint of improving developability, an acid group such as a sulfonamide group, a hydroxyl group, or a carboxy group is preferable.

$Q^{B11}$, $Q^{B12}$, $Q^{B21}$, $Q^{B22}$, $Q^{B31}$, $Q^{B32}$, $Q^{B41}$, $Q^{B42}$, $Q^{B51}$, $Q^{B52}$, $Q^{B61}$, and $Q^{B62}$ each independently represent an alkylene group, an arylene group, a divalent saturated alicyclic hydrocarbon group, a divalent unsaturated alicyclic hydrocarbon group, or a divalent group formed by a plurality of these groups being linked to each other. As the alkylene group, an alkylene group having 1 to 20 carbon atoms is preferable, an alkylene group having 2 to 15 carbon atoms is more preferable, and an alkylene group having 2 to 8 carbon atoms is still more preferable. Further, the alkylene group may contain oxygen atoms in the carbon chain. Examples of the substituent which may be included in the alkylene group include an alkyl group, an aryl group, and a halogen atom. As the arylene group, an arylene group having 6 to 20 carbon atoms is preferable, a phenylene group or a naphthylene group is more preferable, and a phenylene group is still more preferable. The arylene group may contain heteroatoms in the ring structure, and examples of the heteroatoms include an oxygen atom, a nitrogen atom, and a sulfur atom. As the divalent saturated alicyclic hydrocarbon group, a divalent saturated alicyclic hydrocarbon group having 4 to 10 carbon atoms is preferable, a divalent saturated alicyclic hydrocarbon group having 4 to 8 carbon atoms is more preferable, and a divalent saturated alicyclic hydrocarbon group having 6 to 8 carbon atoms is still more preferable. In addition, the divalent saturated alicyclic hydrocarbon group may contain a substituent. Examples of the substituent include an alkyl group, an aryl group, and a halogen atom. Examples of the divalent unsaturated alicyclic hydrocarbon group include a cyclopentenyl group, a cyclopentadienyl group, a cyclohexenyl group, a cyclohexadienyl group, and a cycloheptenyl group. As the divalent group formed by a plurality of these groups being linked to each other, a group formed by a plurality of alkylene groups and arylene groups or a plurality of alkylene groups and divalent saturated alicyclic hydrocarbon groups, being bonded to each other, is preferable or a group formed by bonding an alkylene group, an arylene group, and an alkylene group in this order or bonding an alkylene group, a divalent saturated alicyclic hydrocarbon group, and an alkylene group in this order is preferable.

nB11, nB12, nB21, nB22, nB31, nB32, nB41, nB42, nB51, nB52, nB61, and nB62 each independently represent an integer of 1 or larger, preferably an integer of 1 to 3, and more preferably 1.

The content of the structure represented by any of Formulae B-1 to B-6 in the specific polymer compound of the present invention is preferably in a range of 10% to 90% by mass, more preferably in a range of 30% to 80% by mass, and still more preferably in a range of 50% to 70% by mass.

It is preferable that the polymer compound has a structure represented by the following Formula C-1 or C-2 as the structure represented by Formula B-1 or has a structure represented by the following Formula C-3 or C-4 as the structure represented by Formula B-2.

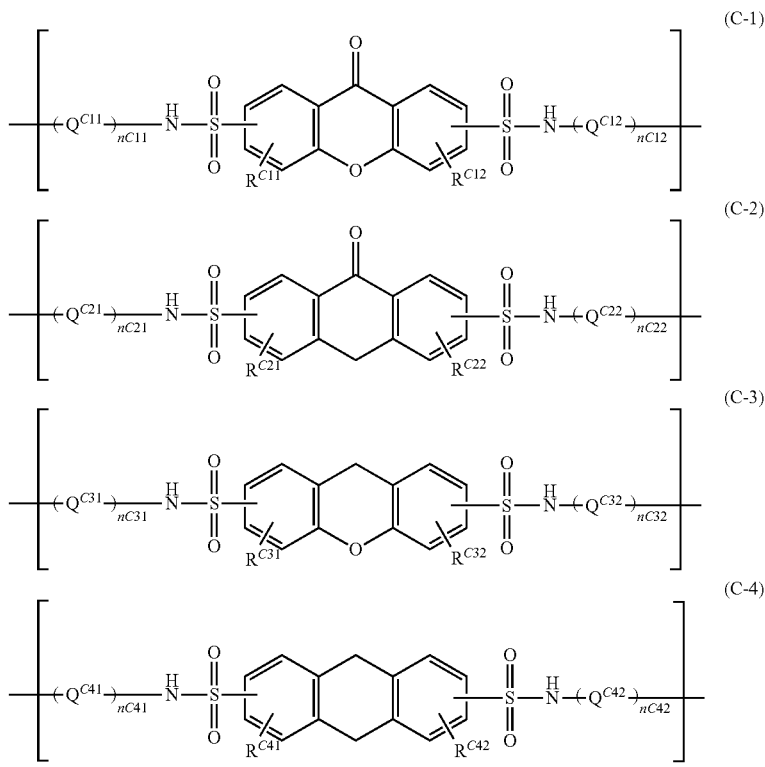

In Formulae C-1 to C-4, $R^{C11}$, $R^{C12}$, $R^{C21}$, $R^{C22}$, $R^{C31}$, $R^{C32}$, $R^{C41}$, and $R^{C42}$ each independently represent a hydrogen atom, a sulfonamide group, a hydroxyl group, a carboxy group, an alkyl group, or a halogen atom, preferably a hydrogen atom, an alkyl group, or a halogen atom, and more preferably a hydrogen atom. From the viewpoint of improving developability, an acid group such as a sulfonamide group, a hydroxyl group, or a carboxy group is preferable.

$Q^{C11}$, $Q^{C12}$, $Q^{C21}$, $Q^{C22}$, $Q^{C31}$, $Q^{C32}$, $Q^{C41}$, and $Q^{C42}$ each independently represent an alkylene group, an arylene group, a divalent saturated alicyclic hydrocarbon group, a divalent unsaturated alicyclic hydrocarbon group, or a divalent group formed by a plurality of these groups being linked to each other. As the alkylene group, an alkylene group having 1 to 20 carbon atoms is preferable, an alkylene group having 2 to 15 carbon atoms is more preferable, and an alkylene group having 2 to 8 carbon atoms is still more preferable. Examples of the substituent which may be included in the alkylene group include an alkyl group, an aryl group, and a halogen atom. Further, the alkylene group may contain oxygen atoms in the carbon chain. As the arylene group, an arylene group having 6 to 20 carbon atoms is preferable, a phenylene group or a naphthylene group is more preferable, and a phenylene group is still more preferable. The arylene group may contain heteroatoms in the ring structure, and examples of the heteroatoms include an oxygen atom, a nitrogen atom, and a sulfur atom. As the divalent saturated alicyclic hydrocarbon group, a divalent saturated alicyclic hydrocarbon group having 4 to 10 carbon atoms is preferable, a divalent saturated alicyclic hydrocarbon group having 4 to 8 carbon atoms is more preferable, and a divalent saturated alicyclic hydrocarbon group having 6 to 8 carbon atoms is still more preferable. In addition, the divalent saturated alicyclic hydrocarbon group may contain a substituent. Examples of the substituent include an alkyl group, an aryl group, and a halogen atom. Examples of the divalent unsaturated alicyclic hydrocarbon group include a cyclopentenyl group, a cyclopentadienyl group, a cyclohexenyl group, a cyclohexadienyl group, and a cycloheptenyl group. As the divalent group formed by a plurality of these groups being linked to each other, a group formed by a plurality of alkylene groups and arylene groups or a plurality of alkylene groups and divalent saturated alicyclic hydrocarbon groups, being bonded to each other, is preferable or a group formed by bonding an alkylene group, an arylene group, and an alkylene group in this order or bonding an alkylene group, a divalent saturated alicyclic hydrocarbon group, and an alkylene group in this order is preferable.

nC11, nC12, nC21, nC22, nC31, nC32, nC41, and nC42 each independently represent an integer of 1 or larger, preferably an integer of 1 to 3, and more preferably 1.

The content of the structure represented by any of Formulae C-1 to C-4 in the specific polymer compound of the present invention is preferably in a range of 10% to 90% by mass, more preferably in a range of 30% to 80% by mass, and still more preferably in a range of 50% to 70% by mass.

The specific polymer compound of the present invention has preferably a structure represented by any one of Formulae A-1 to A-6, more preferably a structure represented by any one of Formulae B-1 to B-6, still more preferably a structure represented by any one of Formulae C-1 to C-4, and particularly preferably a structure represented by Formula C-1 or C-2.

[Alkyleneoxy Group]

It is preferable that the specific polymer compound of the present invention further includes an alkyleneoxy group in the main chain.

According to the above-described embodiment, it is possible to obtain a photosensitive resin composition which enables production of a planographic printing plate having excellent image formability and enables production of a planographic printing plate having excellent printing durability.

As the alkyleneoxy group, an alkyleneoxy group having 2 to 10 carbon atoms is preferable, an alkyleneoxy group having 2 to 8 carbon atoms is more preferable, an alkyleneoxy group having 2 to 4 carbon atoms is still more preferable, and an ethyleneoxy group, a propyleneoxy group, or an isopropyleneoxy group is particularly preferable.

Further, the alkyleneoxy group may be a polyalkyleneoxy group.

As the polyalkyleneoxy group, a polyalkyleneoxy group having 2 to 50 repeating units is preferable, a polyalkyleneoxy group having 2 to 40 repeating units is more preferable, and a polyalkyleneoxy group having 2 to 30 repeating units is still more preferable.

The preferable number of carbon atoms in the repeating units constituting the polyalkyleneoxy group is the same as the preferable number of carbon atoms of the alkyleneoxy group.

[Urea Bond, Urethane Bond, Imide Bond, Amide Bond, and Carbonate Bond]

It is preferable that the specific polymer compound of the present invention further includes at least one selected from the group consisting of a urea bond, a urethane bond, an imide bond, an amide bond, a carbonate bond, and a linking group formed by two or more of these bonds being bonded to each other, in the main chain.

Further, it is preferable that the main chain skeleton of the specific polymer compound of the present invention is at least one selected from the group consisting of a urea bond, a urethane bond, an imide bond, an amide bond, a carbonate bond, and a linking group formed by two or more of these bonds being bonded to each other.

Further, as the main chain skeleton of the specific polymer compound, a urethane bond is preferable from the viewpoints of image formability, printing durability, and production suitability and a urea bond is preferable from the viewpoints of chemical resistance, printing durability, and developability.

It is preferable that the specific polymer compound of the present invention is a compound having a combination of a plurality of constitutional units represented by any one of the following Formulae D-1 to D-5.

A combination of three constitutional units included in the specific polymer compound is described in each of Formulae D-1, D-2, D-4, and D-5 and a combination of four constitutional units included in the specific polymer compound is described in Formula D-3.

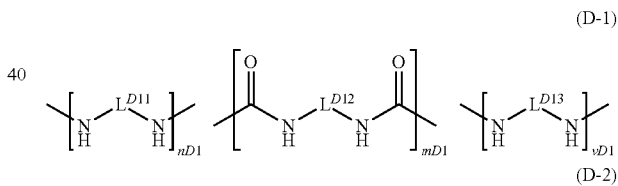

(D-1)

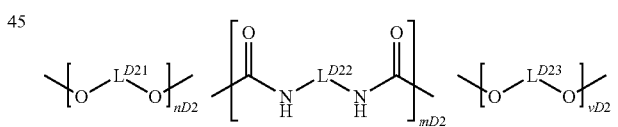

(D-2)

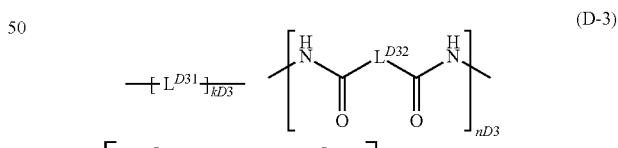

(D-3)

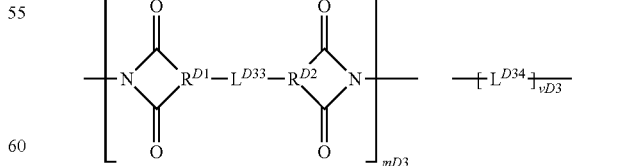

(D-4)

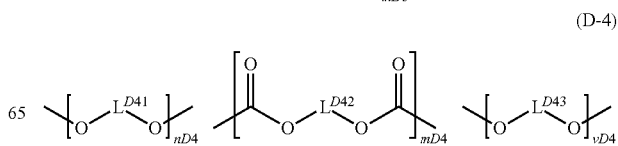

-continued (D-5)

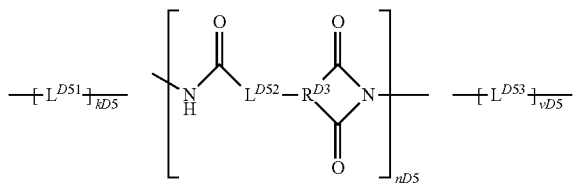

In Formulae D- to D-5, $L^{D11}$, $L^{D21}$, $L^{D31}$, $L^{D41}$, and $L^{D51}$ each independently represent any of the structures represented by Formulae B-1 to B-6 and C-1 to C-4, and more preferably contain the structure represented by any one of Formulae C-1 to C-4 and particularly preferably contain the structure represented by Formula C-1 or C-2.

$L^{D12}$, $L^{D22}$, $L^{D32}$, $L^{D33}$, $L^{D42}$, and $L^{D52}$ each independently represent an alkylene group, an arylene group, a carbonyl group, a sulfonyl group, an amide bond, a urethane bond, a single bond, or a linking group formed by two or more of these bonds being bonded to each other, preferably an alkylene group having 1 to 20 carbon atoms, an arylene group having 6 to 20 carbon atoms, a carbonyl group, a sulfonyl group, an amide bond, a urethane bond, a single bond, or a linking group formed by two or more of these bonds being bonded to each other, more preferably an alkylene group having 1 to 15 carbon atoms, a phenylene group, a naphthylene group, a carbonyl group, a sulfonyl group, an amide bond, a urethane bond, a single bond, or a linking group formed by two or more of these bonds being bonded to each other, and still more preferably an alkylene group having 1 to 15 carbon atoms, a phenylene group, a naphthylene group, or a linking group formed by two or more of these bonds being bonded to each other.

$L^{D13}$, $L^{D23}$, $L^{D34}$, $L^{D43}$, and $L^{D53}$ each independently represent an alkylene group, an alkyleneoxy group, an arylene group, a carbonyl group, a sulfonyl group, an amide bond, a urethane bond, a single bond, or a linking group formed by two or more of these bonds being bonded to each other, preferably an alkylene group having 1 to 20 carbon atoms, an alkyleneoxy group having 2 to 10 carbon atoms, an arylene group having 6 to 20 carbon atoms, a carbonyl group, a sulfonyl group, an amide bond, a urethane bond, a single bond, or a linking group formed by two or more of these bonds being bonded to each other, more preferably an alkylene group having 1 to 15 carbon atoms, an alkyleneoxy group having 2 to 8 carbon atoms, a phenylene group, a naphthylene group, a carbonyl group, a sulfonyl group, an amide bond, a urethane bond, a single bond, or a linking group formed by two or more of these bonds being bonded to each other, and still more preferably an alkylene group having 1 to 15 carbon atoms, an alkyleneoxy group having 2 to 4 carbon atoms, a phenylene group, a naphthylene group, or a linking group formed by two or more of these bonds being bonded to each other.

Further, the alkyleneoxy group may form a polyalkyleneoxy group. As the polyalkyleneoxy group, a polyalkyleneoxy group having 2 to 50 repeating units is preferable, a polyalkyleneoxy group having 2 to 40 repeating units is more preferable, and a polyalkyleneoxy group having 2 to 30 repeating units is still more preferable. The preferable number of carbon atoms in the repeating units constituting the polyalkyleneoxy group is the same as the preferable number of carbon atoms of the alkyleneoxy group.

In a case where $L^{D13}$, $L^{D23}$, $L^{D34}$, $L^{D43}$, or $L^{D53}$ represents an alkyleneoxy group, it is possible to obtain a photosensitive resin composition which enables production of a planographic printing plate having excellent image formability and enables production of a planographic printing plate having excellent printing durability.

$R^{D1}$ to $R^{D3}$ each independently represent a group formed by removing three hydrogen atoms from an alkane or a group formed by removing three hydrogen atoms from an aromatic hydrocarbon ring, preferably a group formed by removing three hydrogen atoms from an alkane having 1 to 20 carbon atoms or a group formed by removing three hydrogen atoms from an aromatic hydrocarbon ring having 6 to 20 carbon atoms, more preferably a group formed by removing three hydrogen groups from an alkane having 1 to 20 carbon atoms or a group formed by removing three hydrogen atoms from an aromatic hydrocarbon ring having 6 to 20 carbon atoms, and still more preferably a group formed by removing three hydrogen atoms from an alkane having 1 to 6 carbon atoms or a group formed by removing three hydrogen atoms from benzene.

The alkane may be linear or cyclic.

Further, $R^{D1}$, $R^{D2}$, and $L^{D32}$ may form a ring and it is preferable that $R^{D1}$, $R^{D2}$, and $L^{D32}$ form a benzene ring or a cyclohexane ring.

nD1, mD1, and vD1 represent a content ratio (mass ratio) in a case where the total mass of molecules of the polymer compound is set to 100, and nD1:mD1:vD1 is preferably in a range of 90:10:0 to 30:60:10 and more preferably in a range of 80:20:0 to 60:30:10. Further, the total value of nD1 and mD1 is preferably 90 or greater and more preferably 95 or greater. The total value of nD1, mD1, and vD1 is preferably 90 or greater, more preferably 95 or greater, and still more preferably 98 or greater.

nD2, mD2, and vD2 represent a content ratio (mass ratio) in a case where the total mass of molecules of the polymer compound is set to 100, and nD2:mD2:vD2 is preferably in a range of 90:10:0 to 30:60:10 and more preferably in a range of 80:20:0 to 60:30:10. Further, the total value of nD2 and mD2 is preferably 90 or greater and more preferably 95 or greater. The total value of nD2, mD2, and vD2 is preferably 90 or greater, more preferably 95 or greater, and still more preferably 98 or greater.

kD3, nD3, mD3, and vD3 represent a content ratio (mass ratio) in a case where the total mass of molecules of the polymer compound is set to 100 and any one of mD3 and nD3 may be 0. In a case where both mD3 and nD3 do not represent 0, mD3:nD3 is preferably in a range of 10:90 to 90:10 and more preferably in a range of 30:70 to 70:30. Further, kD3:(mD3+nD3):vD3 is preferably in a range of 80:20:0 to 30:60:10 and more preferably in a range of 70:30:0 to 50:40:10. The total value of kD3, mD3, and nD3 is preferably 90 or greater and more preferably 95 or greater. The total value of kD3, mD3, nD3, and vD3 is preferably 90 or greater, more preferably 95 or greater, and still more preferably 98 or greater.

nD4, mD4, and vD4 represent a content ratio (mass ratio) in a case where the total mass of molecules of the polymer compound is set to 100, and nD4:mD4:vD4 is preferably in a range of 90:10:0 to 30:60:10 and more preferably in a range of 80:20:0 to 50:40:10. Further, the total value of nD4 and mD4 is preferably 90 or greater and more preferably 95 or greater. The total value of nD4, mD4, and vD4 is preferably 90 or greater, more preferably 95 or greater, and still more preferably 98 or greater.

kD5, mD5, and vD5 represent a content ratio (mass ratio) in a case where the total mass of molecules of the polymer compound is set to 100, and kD5:mD5:vD5 is preferably in a range of 90:10:0 to 40:50:10 and more preferably in a range of 70:30:0 to 50:40:10. Further, the total value of kD5 and mD5 is preferably 90 or greater and more preferably 95 or greater. The total value of kD5, mD5, and vD5 is preferably 90 or greater, more preferably 95 or greater, and still more preferably 98 or greater.

The compound having a combination of a plurality of constitutional units represented by Formula D-1 can be produced by a sequential polymerization reaction of a diamine compound formed by an amino group being bonded to both terminals of the structure represented by $L^{D11}$, a diisocyanate compound formed by an isocyanate group being bonded to both terminals of the structure represented by $L^{D12}$, and optionally a diamine compound formed by an amino group being bonded to a terminal of the structure represented by $L^{D13}$.

The terminal of the compound having a combination of a plurality of constitutional units represented by Formula D-1 is not particularly limited, is typically an amino group or an isocyanate group, and may be blocked by a known terminal blocking agent such as a monoamine, a monoalcohol, or a monoisocyanate.

The compound having a combination of a plurality of constitutional units represented by Formula D-2 can be produced by a sequential polymerization reaction of a diol compound formed by a hydroxy group being bonded to both terminals of the structure represented by $L^{D21}$, a diisocyanate compound formed by an isocyanate group being bonded to both terminals of the structure represented by $L^{D22}$, and optionally a diol compound formed by a hydroxy group being bonded to a terminal of the structure represented by $L^{D23}$.

The terminal of the compound having a combination of a plurality of constitutional units represented by Formula D-2 is not particularly limited, is typically a hydroxy group or an isocyanate group, and may be blocked by a known terminal blocking agent such as a monoamine, a monoalcohol, or a monoisocyanate.

The compound having a combination of a plurality of constitutional units represented by Formula D-3 can be produced by a sequential polymerization reaction of a diamine compound formed by an amino group being bonded to both terminals of the structure represented by $L^{D31}$, a bifunctional acid halide compound formed by an acid halide group being bonded to both terminals of the structure represented by $L^{D32}$ and/or a compound having two acid anhydrides formed by an acid anhydride structure being bonded to both terminals of the structure represented by $L^{D33}$, and optionally a diamine compound formed by an amino group being bonded to a terminal of the structure represented by $L^{D34}$.

The terminal of the compound having a combination of a plurality of constitutional units represented by Formula D-3 is not particularly limited, is typically an amino group, an acid halide group, or a carboxy group, and may be blocked by a known terminal blocking agent such as a monoamine, a monoalcohol, a monoacid halide, or a monoacid anhydride.

The compound having a combination of a plurality of constitutional units represented by Formula D-4 can be produced by sequential polymerization of a diol compound formed by a hydroxy group being bonded to both terminals of the structure represented by $L^{D41}$, a diol compound formed by a hydroxy group being bonded to both terminals of the structure represented by $L^{D42}$, and optionally a diol compound formed by a hydroxy group being bonded to a terminal of the structure represented by $L^{D43}$.

The terminal of the compound having a combination of a plurality of constitutional units represented by Formula D-4 is not particularly limited, is typically an amino group, an acid halide group, or a carboxy group, and may be blocked by a known terminal blocking agent such as a monoalcohol or a monoamine.

The compound having a combination of a plurality of constitutional units represented by Formula D-5 can be produced by sequential polymerization of a diamine compound formed by an amino group being bonded to both terminals of the structure represented by $L^{D51}$, a compound formed by an acid halide group and an acid anhydride group being bonded to each of the terminals of the structure represented by $L^{D52}$, and optionally a diamine compound formed by an amino group being bonded to a terminal of the structure represented by $L^{D53}$.

The terminal of the compound having a combination of a plurality of constitutional units represented by Formula D-5 is not particularly limited, is typically an amino group, an acid halide group, a carboxy group, or an acid anhydride group, and may be blocked by a known terminal blocking agent such as a monoalcohol or a monoamine.

It is preferable that the specific polymer compound of the present invention is a polymer compound having a combination of a plurality of constitutional units represented by Formula D-1 or D-2.

Further, the weight-average molecular weight of the specific polymer compound of the present invention is preferably in a range of 10,000 to 500,000, more preferably in a range of 10,000 to 200,000, and still more preferably in a range of 20,000 to 100,000.

The weight-average molecular weight can be calculated by a standard polystyrene conversion method using gel permeation chromatography (GPC). A column filled with a polystyrene crosslinked gel (TSKgel SuperAWM-H; manufactured by Tosoh Corporation) can be used as the GPC column, and N-methylpyrrolidone (0.01 mol/L of each of phosphoric acid and lithium bromide) can be used as the GPC solvent.

Hereinafter, specific examples of the specific polymer compound will be described.

[Polyurea Having Polycyclic Structure and Sulfonamide Group in Main Chain]

In the present invention, the polyurea having a polycyclic structure and a sulfonamide group in the main chain is a polymer generated by a sequential polymerization reaction of a specific diamine compound having a polycyclic structure and a sulfonamide group in the main chain and a compound (diisocyanate compound) having two or more isocyanate groups. Further, the polyurea is not particularly limited as long as the polyurea has a polycyclic structure and a sulfonamide group in the main chain.

In addition, the main chain of the diamine compound indicates a carbon chain serving as the main chain of a polymer compound in a case where a polymer compound such as polyurea is formed.

Specific preferred examples of the polyurea which can be used in the present invention are shown in Tables 1 to 3. Specific examples PU-1 to PU-55 indicate specific polymer compounds formed by reacting a diamine compound having a polycyclic structure and a sulfonamide group in the main chain, a compound having two or more isocyanate groups, and optionally other diamine compounds, listed in Tables 1 to 3, at ratios (molar ratios) listed in Tables 1 to 3.

In addition, the tables show molar ratios used for synthesis of polyureas and weight-average molecular weights (Mw) of obtained specific polyureas, but the polyurea used in the present invention is not limited to these.

Moreover, the weight-average molecular weight of a polymer is a value measured according to the GPC method.

TABLE 1

| Specific polymer compound | Diamine compound-1 (molar ratio thereof contained) | Diamine compound-2 (molar ratio thereof contained) | Diisocyanate compound-1 (molar ratio thereof contained) | Diisocyanate compound-2 (molar ratio thereof contained) | Weight-average molecular weight (ten thousand) |
|---|---|---|---|---|---|
| PU-1  | SA-1 50 | — | HDI 50    | — | 4.8 |
| PU-2  | SA-1 50 | — | H6 XDI 50 | — | 5.1 |
| PU-3  | SA-1 50 | — | NDI 50    | — | 4.6 |
| PU-4  | SA-1 50 | — | DMBPDI 50 | — | 4.9 |
| PU-5  | SA-2 50 | — | HDI 50    | — | 5.3 |
| PU-6  | SA-2 50 | — | H6 XDI 50 | — | 5.2 |
| PU-7  | SA-2 50 | — | NDI 50    | — | 5.0 |
| PU-8  | SA-2 50 | — | DMBPDI 50 | — | 5.1 |
| PU-9  | SA-2 50 | — | HDI 25    | H6 XDI 25 | 4.8 |
| PU-10 | SA-3 50 | — | HDI 50    | — | 4.8 |
| PU-11 | SA-4 50 | — | HDI 50    | — | 4.6 |
| PU-12 | SA-5 50 | — | HDI 50    | — | 4.8 |
| PU-13 | SA-6 50 | — | HDI 50    | — | 4.9 |
| PU-14 | SA-6 50 | — | H6 XDI 50 | — | 4.6 |
| PU-15 | SA-6 50 | — | NDI 50    | — | 5.2 |
| PU-16 | SA-6 50 | — | DMBPDI 50 | — | 5.2 |
| PU-17 | SA-7 50 | — | HDI 50    | — | 5.4 |
| PU-18 | SA-7 50 | — | H6 XDI 50 | — | 4.5 |
| PU-19 | SA-7 50 | — | NDI 50    | — | 4.8 |
| PU-20 | SA-7 50 | — | DMBPDI 50 | — | 4.9 |

TABLE 2

| Specific polymer compound | Diamine compound-1 (molar ratio thereof contained) | Diamine compound-2 (molar ratio thereof contained) | Diisocyanate compound-1 (molar ratio thereof contained) | Diisocyanate compound-2 (molar ratio thereof contained) | Weight-average molecular weight (ten thousand) |
|---|---|---|---|---|---|
| PU-21 | SA-1 25 | SA-7 25 | HDI 50    | —         | 4.7 |
| PU-22 | SA-1 25 | SA-6 25 | HDI 50    | —         | 4.7 |
| PU-23 | SA-6 25 | SA-7 25 | HDI 50    | —         | 4.8 |
| PU-24 | SA-1 50 | —       | HDI 25    | NDI 25    | 4.9 |
| PU-25 | SA-1 50 | —       | HDI 25    | DMBPDI 25 | 4.8 |
| PU-26 | SA-8 50 | —       | H6 XDI 50 | —         | 5.8 |
| PU-27 | SA-9 50 | —       | HDI 50    | —         | 5.1 |
| PU-28 | SA-9 50 | —       | H6 XDI 50 | —         | 4.8 |
| PU-29 | SA-9 50 | —       | NDI 50    | —         | 4.2 |

TABLE 2-continued

| Specific polymer compound | Diamine compound-1 (molar ratio thereof contained) | Diamine compound-2 (molar ratio thereof contained) | Diisocyanate compound-1 (molar ratio thereof contained) | Diisocyanate compound-2 (molar ratio thereof contained) | Weight-average molecular weight (ten thousand) |
|---|---|---|---|---|---|
| PU-30 | SA-10 50 | — | H6 XDI 50 | — | 4.5 |
| PU-31 | SA-11 50 | — | H6 XDI 50 | — | 4.9 |
| PU-32 | SA-12 50 | — | H6 XDI 50 | — | 5.2 |
| PU-33 | SA-13 50 | — | H6 XDI 50 | — | 5.3 |
| PU-34 | SA-14 50 | — | H6 XDI 50 | — | 5.1 |
| PU-35 | SA-15 50 | — | H6 XDI 50 | — | 5.1 |
| PU-36 | SA-16 50 | — | H6 XDI 50 | — | 5.1 |
| PU-37 | SA-17 50 | — | H6 XDI 50 | — | 5.1 |
| PU-38 | SA-1 40 | DABA 10 | H6 XDI 50 | — | 4.7 |
| PU-39 | SA-1 47.5 | PEDA-2 2.5 | HDI 50 | — | 4.8 |
| PU-40 | SA-1 47.5 | PEDA-2 2.5 | H6 XDI 50 | — | 4.7 |

TABLE 3

| Specific polymer compound | Diamine compound-1 (molar ratio thereof contained) | Diamine compound-2 (molar ratio thereof contained) | Diisocyanate compound-1 (molar ratio thereof contained) | Diisocyanate compound-2 (molar ratio thereof contained) | Weight-average molecular weight (ten thousand) |
|---|---|---|---|---|---|
| PU-41 | SA-1 47.5 | TOTDDA 2.5 | HDI 50 | — | 4.7 |
| PU-42 | SA-1 45 | TOTDDA 5 | HDI 50 | — | 4.8 |
| PU-43 | SA-1 47.5 | TOTDDA 2.5 | H6 XDI 50 | — | 5.1 |
| PU-44 | SA-18 50 | — | H6 XDI 50 | — | 5.3 |
| PU-45 | SA-18 50 | — | HDI 50 | — | 5.1 |
| PU-46 | SA-19 50 | — | H6 XDI 50 | — | 4.4 |
| PU-47 | SA-20 50 | — | H6 XDI 50 | — | 4.5 |
| PU-48 | SA-18 47.5 | PEDA-2 2.5 | H6 XDI 50 | — | 4.9 |
| PU-49 | SA-18 45 | PEDA-2 5 | H6 XDI 50 | — | 5.2 |
| PU-50 | SA-18 47.5 | PEDA-2 2.5 | HDI 50 | — | 4.8 |
| PU-51 | SA-18 45 | PEDA-2 5 | HDI 50 | — | 4.9 |
| PU-52 | SA-18 47.5 | TOTDDA 2.5 | H6 XDI 50 | — | 4.9 |
| PU-53 | SA-18 45 | TOTDDA 5 | H6 XDI 50 | — | 5.1 |
| PU-54 | SA-18 47.5 | TOTDDA 2.5 | HDI 50 | — | 5.2 |
| PU-55 | SA-18 45 | TOTDDA 5 | HDI 50 | — | 5.1 |

Specific structures of preferable compounds which include the compounds listed in Tables 1 to 3 and are used for synthesis of polyurea used in the present invention are as follows.
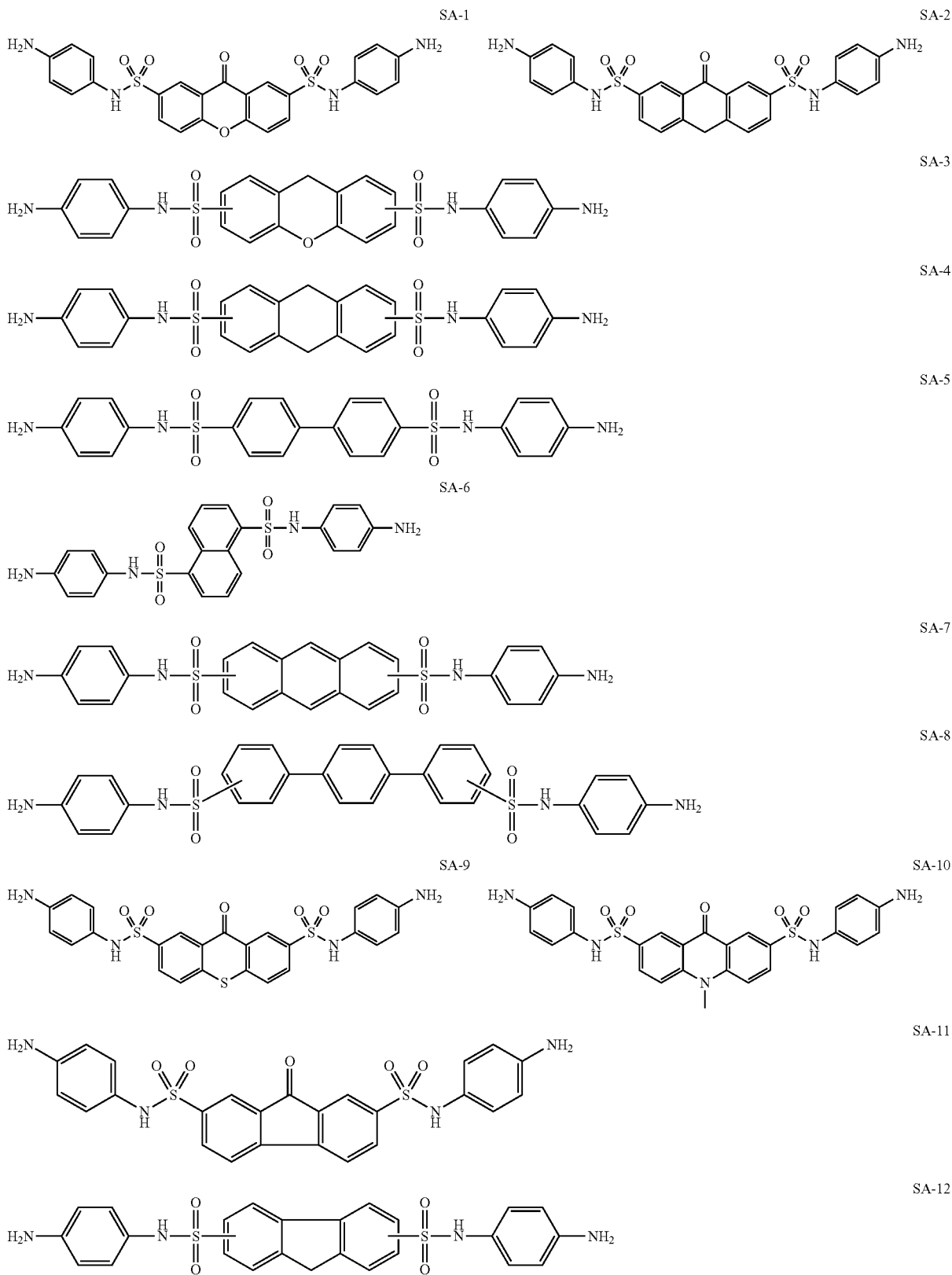

-continued
SA-13
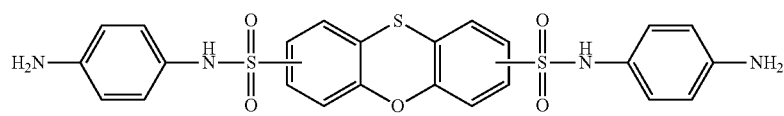
SA-14
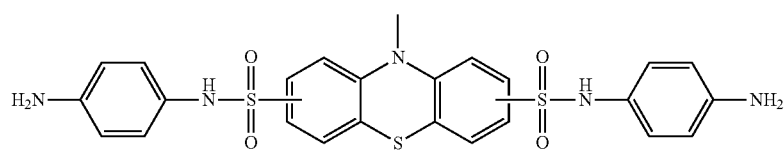
SA-15
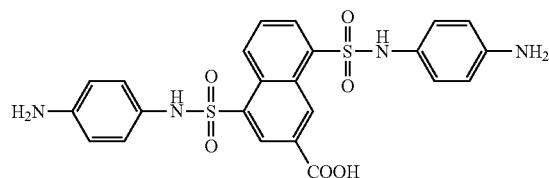
SA-16
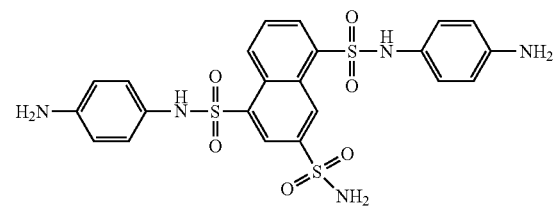
SA-17
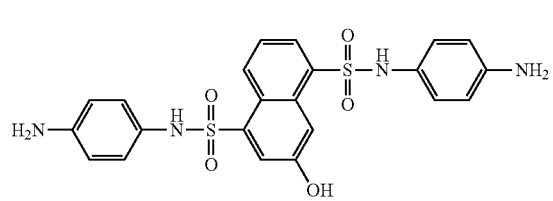
SA-18
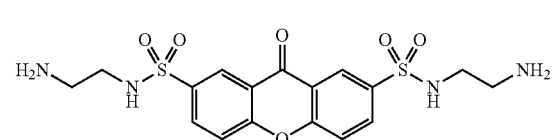
SA-19
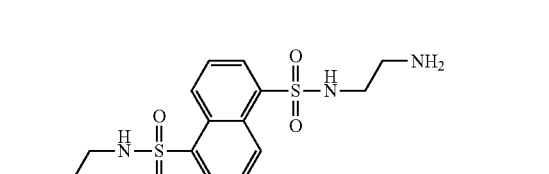
SA-20
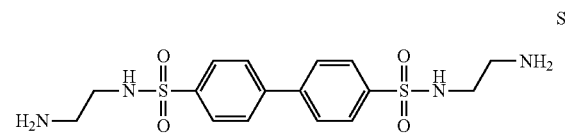
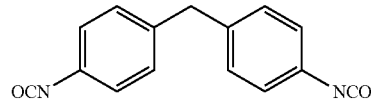
MDI
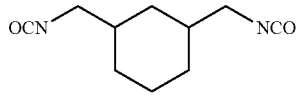
H6 XDI
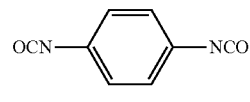
PPDI
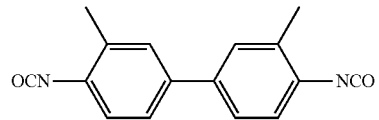
DMBPDI
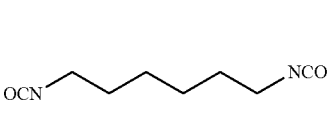
HDI
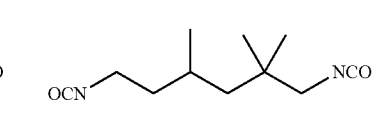
TMHDI
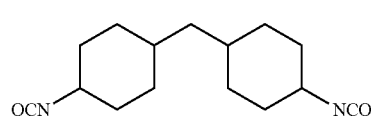
H12 MDI
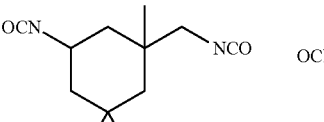
IPDI
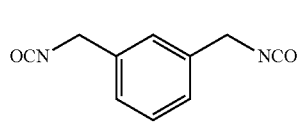
H6 XDI
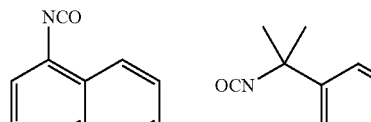
NDI
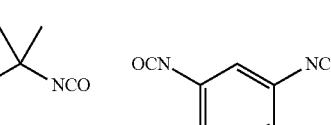
TMXDI
TDI
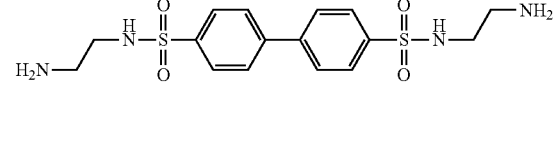
NBDI

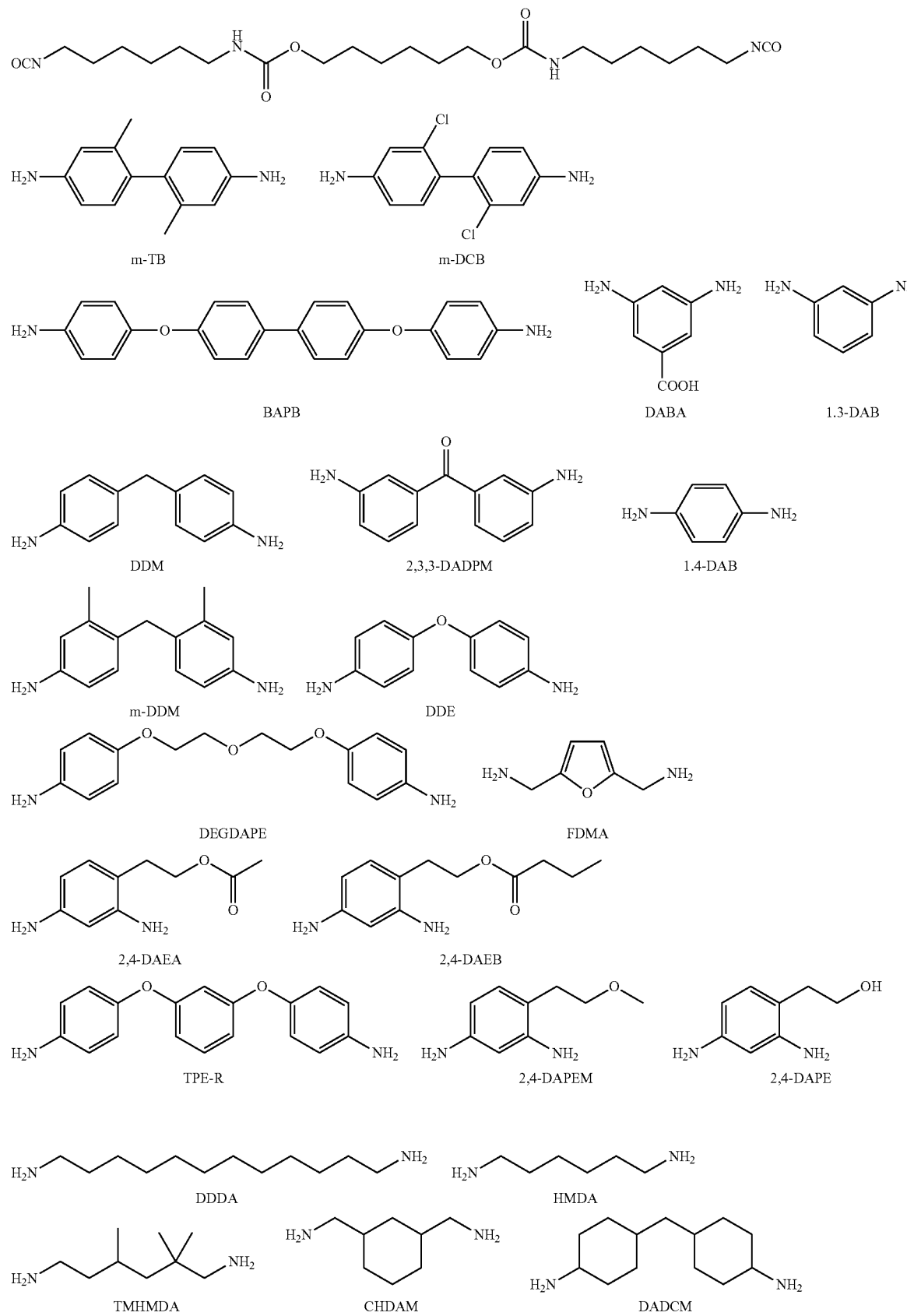

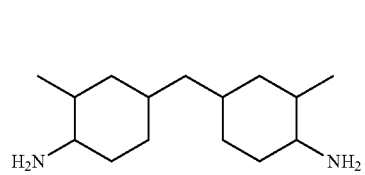
DAMDCM

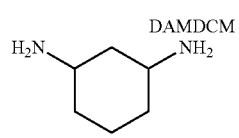
IPDA

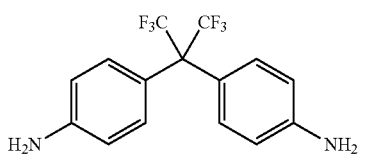
6FAP

1,3-CHDA

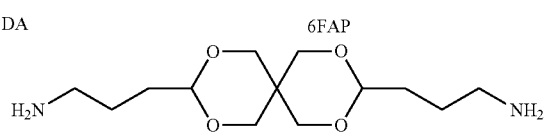
1,4-CHDA     APTOSU

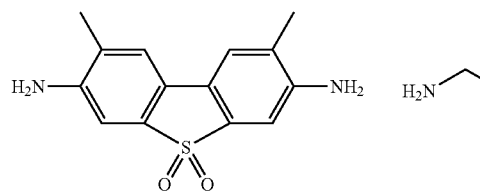
TSN     BAPMA

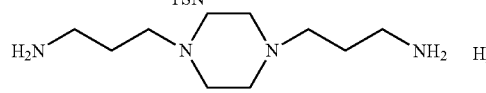
BAPPRZ     TOTDDA

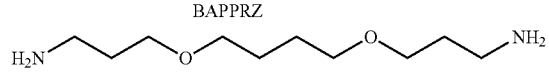
DODDA

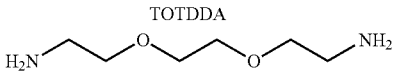
1,2-BAEE

PEDA-1     PEDA-2

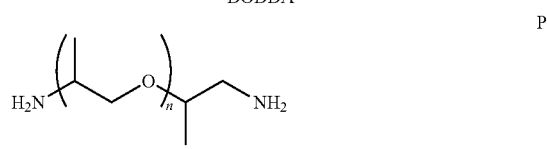

(Mn = 230)     (Mn = 400)

PEDA-3     PEDA-4

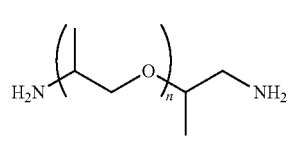
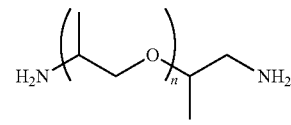

(Mn = 1000)     (Mn = 2000)

Among these, PU-1, PU-2, PU-3, PU-5, PU-7, PU-15, PU-17, PU-43, PU-44, and PU-53 are preferable as polyurea.

[Polyurethane Having Polycyclic Structure and Sulfonamide Group in Main Chain]

The polyurethane which is used in the present invention and has a polycyclic structure and a sulfonamide group in the main chain is a polymer generated by a sequential polymerization reaction of a specific diol compound having a polycyclic structure and a sulfonamide group in the main chain and a compound having two or more isocyanate groups. Further, the polyurethane is not particularly limited as long as the polyurethane has a polycyclic structure and a sulfonamide group in the main chain.

In addition, the main chain of the diol compound indicates a carbon chain serving as the main chain of a polymer compound in a case where a polymer compound such as polyurethane is formed.

Specific preferred examples of the polyurethane which can be used in the present invention are shown in Tables 4 to 6. Specific examples PT-1 to PT-66 indicate specific polymer compounds formed by reacting a diol compound having a polycyclic structure and a sulfonamide group in the main chain and a compound having two or more isocyanate groups, listed in Tables 4 to 6, at ratios (molar ratios) listed in Tables 4 to 6.

In addition, the tables show molar ratios used for synthesis of polyurethanes and weight-average molecular weights (Mw) of obtained specific polyurethanes, but the polyurethane used in the present invention is not limited to these.

Moreover, the weight-average molecular weight of a polymer is a value measured according to the GPC method.

TABLE 4

| Specific polymer compound | Diol compound-1 (molar ratio thereof contained) | Diol compound-2 (molar ratio thereof contained) | Diisocyanate compound-1 (molar ratio thereof contained) | Diisocyanate compound-2 (molar ratio thereof contained) | Weight-average molecular weight (ten thousand) |
|---|---|---|---|---|---|
| PT-1 | SB-1 50 | — | HDI 50 | — | 4.6 |
| PT-2 | SB-1 50 | — | H6 XDI 50 | — | 5.2 |
| PT-3 | SB-1 50 | — | NDI 50 | — | 4.8 |
| PT-4 | SB-1 50 | — | DMBPDI 50 | — | 4.9 |
| PT-5 | SB-2 50 | — | HDI 50 | — | 4.8 |
| PT-6 | SB-2 50 | — | H6 XDI 50 | — | 4.7 |
| PT-7 | SB-2 50 | — | NDI 50 | — | 4.7 |
| PT-8 | SB-2 50 | — | DMBPDI 50 | — | 5.1 |
| PT-9 | SB-2 50 | — | HDI 25 | H6 XDI 25 | 4.8 |
| PT-10 | SB-3 50 | — | HDI 50 | — | 5.9 |
| PT-11 | SB-4 50 | — | HDI 50 | — | 5.7 |
| PT-12 | SB-5 50 | — | HDI 50 | — | 4.8 |
| PT-13 | SB-6 50 | — | HDI 50 | — | 4.9 |
| PT-14 | SB-6 50 | — | H6 XDI 50 | — | 4.7 |
| PT-15 | SB-6 50 | — | NDI 50 | — | 5.1 |
| PT-16 | SB-6 50 | — | DMBPDI 50 | — | 5.2 |
| PT-17 | SB-7 50 | — | HDI 50 | — | 5.3 |
| PT-18 | SB-7 50 | — | H6 XDI 50 | — | 4.6 |
| PT-19 | SB-7 50 | — | NDI 50 | — | 4.8 |
| PT-20 | SB-7 50 | — | DMBPDI 50 | — | 4.9 |

TABLE 5

| Specific polymer compound | Diol compound-1 (molar ratio thereof contained) | Diol compound-2 (molar ratio thereof contained) | Diisocyanate compound-1 (molar ratio thereof contained) | Diisocyanate compound-2 (molar ratio thereof contained) | Weight-average molecular weight (ten thousand) |
|---|---|---|---|---|---|
| PT-21 | SB-1 25 | SB-7 25 | HDI 50 | — | 4.7 |
| PT-22 | SB-1 25 | SB-6 25 | HDI 50 | — | 5.1 |
| PT-23 | SB-6 25 | SB-7 25 | HDI 50 | — | 4.8 |
| PT-24 | SB-1 50 | — | H6 XDI 25 | NDI 25 | 5.3 |
| PT-25 | SB-1 50 | — | HDI 25 | DMBPDI 25 | 4.8 |
| PT-26 | SB-8 50 | — | H6 XDI 50 | — | 5.7 |
| PT-27 | SB-8 50 | — | NDI 50 | — | 5.8 |
| PT-28 | SB-9 50 | — | H6 XDI 50 | — | 5.6 |
| PT-29 | SB-9 50 | — | NDI 50 | — | 5.2 |
| PT-30 | SB-10 50 | — | H6 XDI 50 | — | 5.4 |

TABLE 5-continued

| Specific polymer compound | Diol compound-1 (molar ratio thereof contained) | Diol compound-2 (molar ratio thereof contained) | Diisocyanate compound-1 (molar ratio thereof contained) | Diisocyanate compound-2 (molar ratio thereof contained) | Weight-average molecular weight (ten thousand) |
|---|---|---|---|---|---|
| PT-31 | SB-10 50 | — — | NDI 50 | — — | 5.6 |
| PT-32 | SB-11 50 | — — | H6 XDI 50 | — — | 6.1 |
| PT-33 | SB-11 50 | — — | NDI 50 | — — | 5.8 |
| PT-34 | SB-12 50 | — — | H6 XDI 50 | — — | 5.9 |
| PT-35 | SB-12 50 | — — | NDI 50 | — — | 5.8 |
| PT-36 | SB-13 50 | — — | H6 XDI 50 | — — | 5.5 |
| PT-37 | SB-13 50 | — — | NDI 50 | — — | 5.5 |
| PT-38 | SB-14 50 | — — | H6 XDI 50 | — — | 5.4 |
| PT-39 | SB-14 50 | — — | NDI 50 | — — | 5.7 |
| PT-40 | SB-15 50 | — — | H6 XDI 50 | — — | 4.9 |

TABLE 6

| Specific polymer compound | Diol compound-1 (molar ratio thereof contained) | Diol compound-2 (molar ratio thereof contained) | Diisocyanate compound-1 (molar ratio thereof contained) | Diisocyanate compound-2 (molar ratio thereof contained) | Weight-average molecular weight (ten thousand) |
|---|---|---|---|---|---|
| PT-41 | SB-15 50 | — — | NDI 50 | — — | 5.2 |
| PT-42 | SB-16 50 | — — | H6 XDI 50 | — — | 5.9 |
| PT-43 | SB-16 50 | — — | NDI 50 | — — | 5.3 |
| PT-44 | SB-17 50 | — — | H6 XDI 50 | — — | 5.1 |
| PT-45 | SB-17 50 | — — | NDI 50 | — — | 5.1 |
| PT-46 | SB-18 45 | DO-7 5 | H6 XDI 50 | — — | 5.1 |
| PT-47 | SB-19 45 | DO-7 5 | H6 XDI 50 | — — | 5.2 |
| PT-48 | SB-1 49 | DO-6 1 | H6 XDI 50 | — — | 4.8 |
| PT-49 | SB-1 49 | DO-7 1 | H6 XDI 50 | — — | 4.9 |
| PT-50 | SB-1 49 | DO-6 1 | H6 XDI 50 | — — | 4.8 |
| PT-51 | SB-1 49 | DO-7 1 | HDI 50 | — — | 5.2 |
| PT-52 | SB-1 49 | DO-6 1 | HDI 50 | — — | 4.6 |
| PT-53 | SB-2 49 | DO-7 1 | H6 XDI 50 | — — | 4.7 |
| PT-54 | SB-2 49 | DO-6 1 | H6 XDI 50 | H6 XDI 25 | 4.8 |
| PT-55 | SB-2 49 | DO-7 1 | HDI 50 | — — | 5.2 |
| PT-56 | SB-2 49 | DO-6 1 | HDI 50 | — — | 4.1 |
| PT-57 | SB-1 47.5 | DO-9 2.5 | HDI 50 | — — | 4.3 |
| PT-58 | SB-1 45 | DO-9 5 | HDI 50 | — — | 4.9 |
| PT-59 | SB-1 45 | DO-12 5 | HDI 50 | — — | 4.7 |
| PT-60 | SB-1 40 | DO-12 10 | HDI 50 | — — | 5.2 |
| PT-61 | SB-15 50 | — — | TDI 50 | — — | 5.5 |

TABLE 6-continued

| Specific polymer compound | Diol compound-1 (molar ratio thereof contained) | Diol compound-2 (molar ratio thereof contained) | Diisocyanate compound-1 (molar ratio thereof contained) | Diisocyanate compound-2 (molar ratio thereof contained) | Weight-average molecular weight (ten thousand) |
|---|---|---|---|---|---|
| PT-62 | SB-15 45 | DO-6 5 | TDI 50 | — | 6.5 |
| PT-63 | SB-15 45 | DO-7 5 | TDI 50 | — | 6.4 |
| PT-64 | SB-15 50 | — | XDI 50 | — | 5.8 |
| PT-65 | SB-15 50 | — | XDI 35 | PPDI 15 | 5.6 |
| PT-66 | SB-15 50 | — | DMBPDI 50 | — | 5.9 |

Specific structures of preferable compounds which include the compounds listed in Tables 4 to 6 and are used for synthesis of polyurethane used in the present invention are as follows.

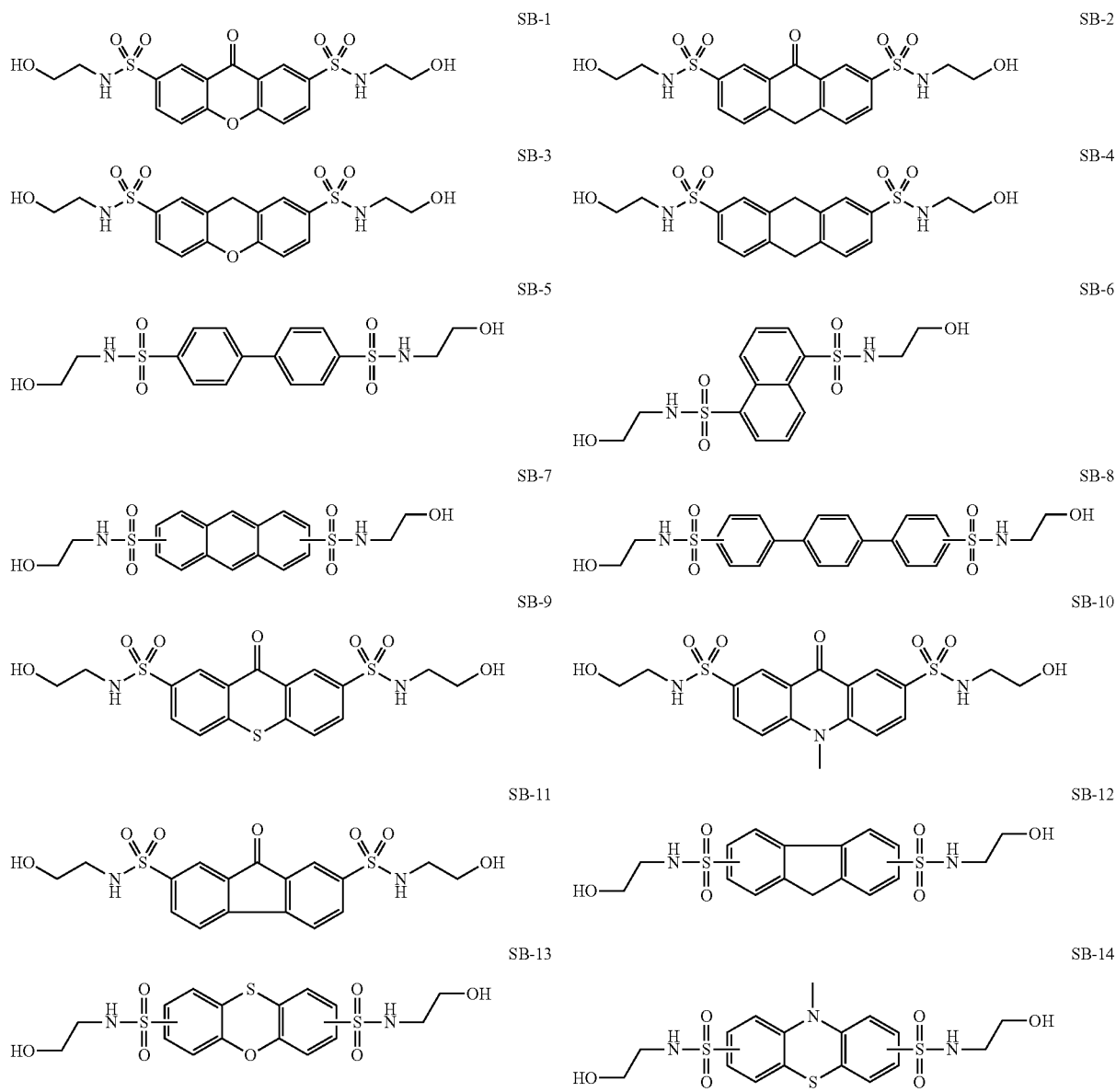

-continued
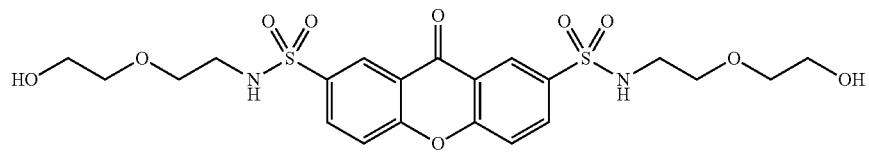
SB-15
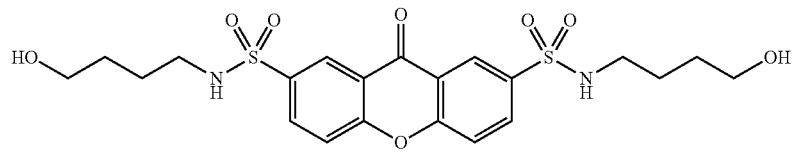
SB-16
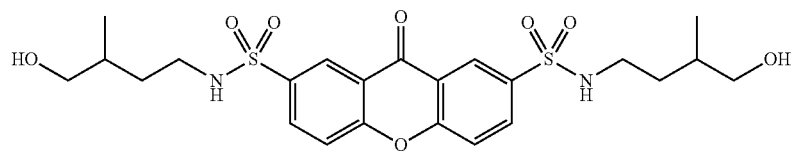
SB-17
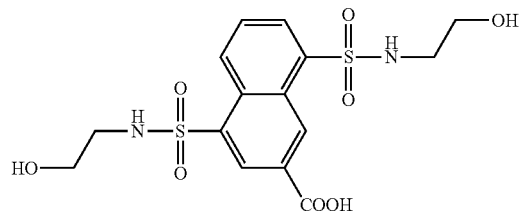
SB-18
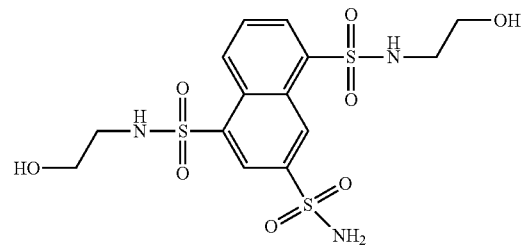
SB-19
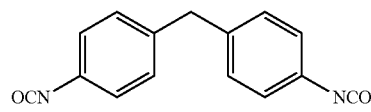
MDI
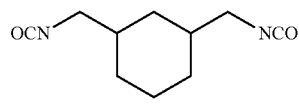
H6 XDI
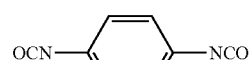
PPDI
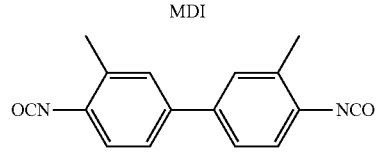
DMBPDI
HDI
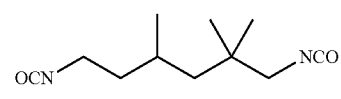
TMHDI
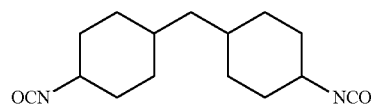
H12 MDI
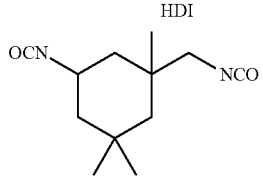
IPDI
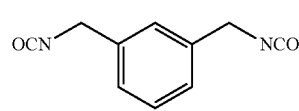
XDI
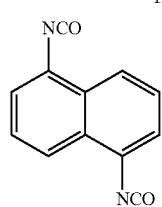
NDI
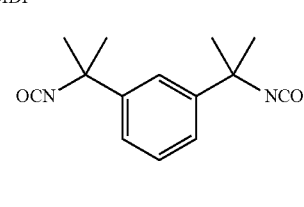
TMXDI
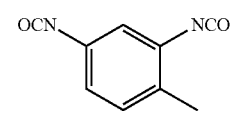
TDI
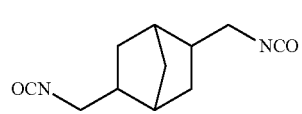
NBDI
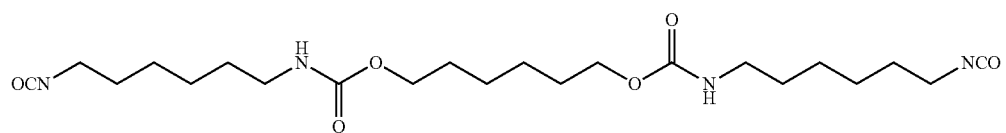
D-101

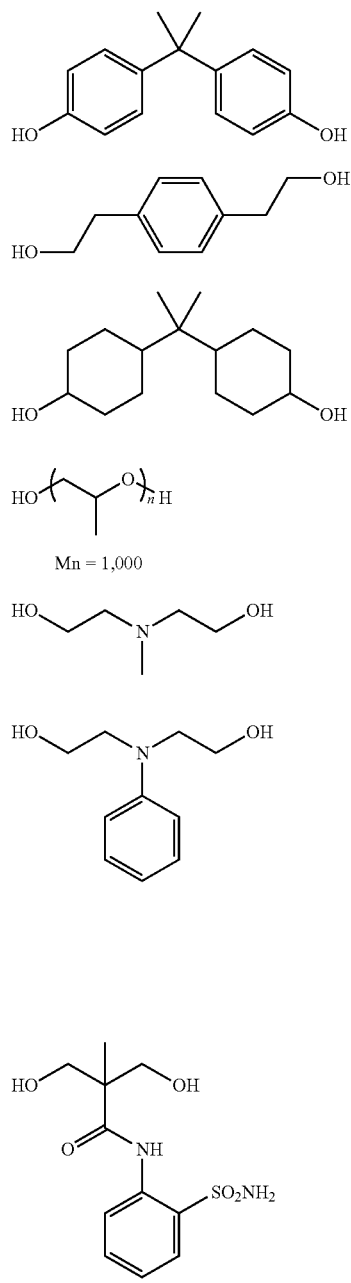

Among these, PT-1, PT-2, PT-3, PT-7, PT-8, PT-15, PT-18, PT-49, PT-51, PT-61, PT-62, PT-63, and PT-65 are preferable as polyurethane.

[Polyimide, Polyamide, or Polyamide Imide Having Polycyclic Structure and Sulfonamide Group in Main Chain]

In the present invention, the polyimide, polyamide, or polyamide imide having a polycyclic structure and a sulfonamide group in the main chain is a polymer generated by a sequential polymerization reaction of a specific diamine compound having a polycyclic structure and a sulfonamide group in the main chain and a compound having two or more acid halide groups or acid anhydride groups. Further, the polyimide, polyamide, or polyamide imide is not particularly limited as long as the polyimide, polyamide, or polyamide imide has a polycyclic structure and a sulfonamide group in the main chain.

Specific preferred examples of the polyimide, polyamide, or polyamide imide which can be used in the present invention are shown in Tables 7 and 8. Specific examples PA-1 to PA-32 indicate specific polymer compounds formed by reacting a diamine compound having a polycyclic structure and a sulfonamide group in the main chain and a compound having two or more acid halide groups or acid anhydride groups, listed in Tables 7 and 8, at ratios (molar ratios) listed in Tables 7 and 8.

In addition, the tables show molar ratios used for synthesis of polyimides, polyamides, or polyamide imides and weight-average molecular weights (Mw) of obtained specific polyimides, polyamides, or polyamide imides, but the polyimide, polyamide, or polyamide imide used in the present invention is not limited to these.

Moreover, the weight-average molecular weight of a polymer is a value measured according to the GPC method.

TABLE 7

| Specific polymer compound | Diamine compound-1 (molar ratio thereof contained) | Acid anhydride compound-1 (molar ratio thereof contained) | Acid halide compound-2 (molar ratio thereof contained) | Acid halide-containing acid anhydride compound-2 (molar ratio thereof contained) | Weight-average molecular weight (ten thousand) |
|---|---|---|---|---|---|
| PA-1 | SA-1 50 | — | — | TMAC 50 | 5.6 |
| PA-2 | SA-2 50 | — | — | TMAC 50 | 5.8 |
| PA-3 | SA-3 50 | — | — | TMAC 50 | 5.2 |
| PA-4 | SA-4 50 | — | — | TMAC 50 | 6.1 |
| PA-5 | SA-5 50 | — | — | TMAC 50 | 5.2 |
| PA-6 | SA-6 50 | — | — | TMAC 50 | 5.1 |
| PA-7 | SA-7 50 | — | — | TMAC 50 | 5.0 |
| PA-8 | SA-8 50 | — | — | TMAC 50 | 5.1 |
| PA-9 | SA-9 50 | — | — | TMAC 50 | 4.8 |
| PA-10 | SA-10 50 | — | — | TMAC 50 | 5.6 |
| PA-11 | SA-11 50 | — | — | TMAC 50 | 5.1 |
| PA-12 | SA-12 50 | — | — | TMAC 50 | 4.8 |
| PA-13 | SA-13 50 | — | — | TMAC 50 | 4.9 |
| PA-14 | SA-14 50 | — | — | TMAC 50 | 5.3 |
| PA-15 | SA-1 50 | PMDA 50 | — | — | 3.8 |
| PA-16 | SA-1 50 | BPDA 50 | — | — | 3.7 |

TABLE 8

| Specific polymer compound | Diamine compound-1 (molar ratio thereof contained) | Acid anhydride compound-1 (molar ratio thereof contained) | Acid halide compound-2 (molar ratio thereof contained) | Acid halide-containing acid anhydride compound-2 (molar ratio thereof contained) | Weight-average molecular weight (ten thousand) |
|---|---|---|---|---|---|
| PA-17 | SA-1 50 | — | HMDOC 50 | — | 4.6 |
| PA-18 | SA-1 50 | — | CHDOC 50 | — | 4.2 |
| PA-19 | SA-1 50 | PMDA 25 | HMDOC 25 | — | 4.8 |
| PA-20 | SA-1 50 | BPDA 25 | HMDOC 25 | — | 4.6 |
| PA-21 | SA-1 25 | PMDA 20 | HMDOC 30 | — | 4.8 |
| PA-22 | SA-1 25 | BPDA 30 | HMDOC 20 | — | 4.7 |
| PA-23 | SA-1 25 | BPDA 25 | HMDOC 25 | — | 4.8 |
| PA-24 | SA-5 50 | PMDA 50 | — | — | 3.9 |
| PA-25 | SA-5 50 | BPDA 50 | — | — | 4.2 |
| PA-26 | SA-5 50 | — | HMDOC 50 | — | 5.8 |

TABLE 8-continued

| Specific polymer compound | Diamine compound-1 (molar ratio thereof contained) | Acid anhydride compound-1 (molar ratio thereof contained) | Acid halide compound-2 (molar ratio thereof contained) | Acid halide-containing acid anhydride compound-2 (molar ratio thereof contained) | Weight-average molecular weight (ten thousand) |
|---|---|---|---|---|---|
| PA-27 | SA-5 50 | — | CHDOC 50 | — | 5.1 |
| PA-28 | SA-5 50 | PMDA 25 | HMDOC 25 | — | 4.8 |
| PA-29 | SA-5 50 | BPDA 25 | HMDOC 25 | — | 5.9 |
| PA-30 | SA-5 50 | PMDA 20 | HMDOC 30 | — | 5.6 |
| PA-31 | SA-5 50 | BPDA 30 | HMDOC 20 | — | 5.5 |
| PA-32 | SA-5 50 | BPDA 25 | HMDOC 25 | — | 5.4 |

Examples of preferable compounds which include the compounds listed in Tables 7 and 8 and are used for synthesis of polyimide, polyamide, or polyamide imide used in the present invention include the following compounds and SA-1 to SA-14.

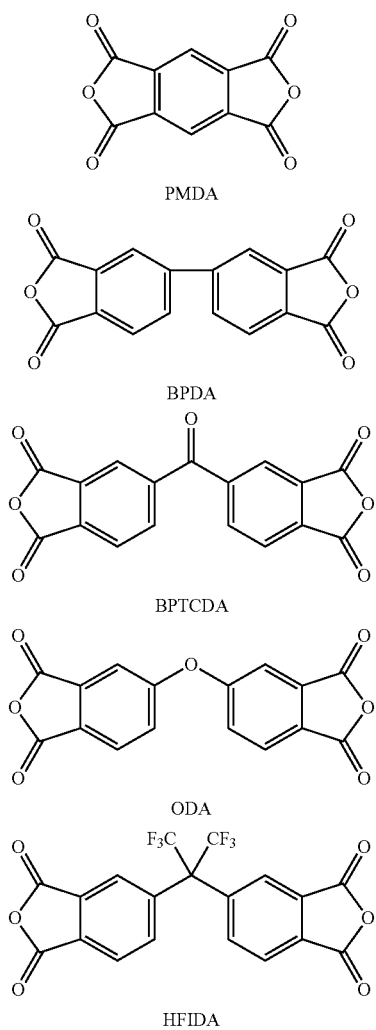

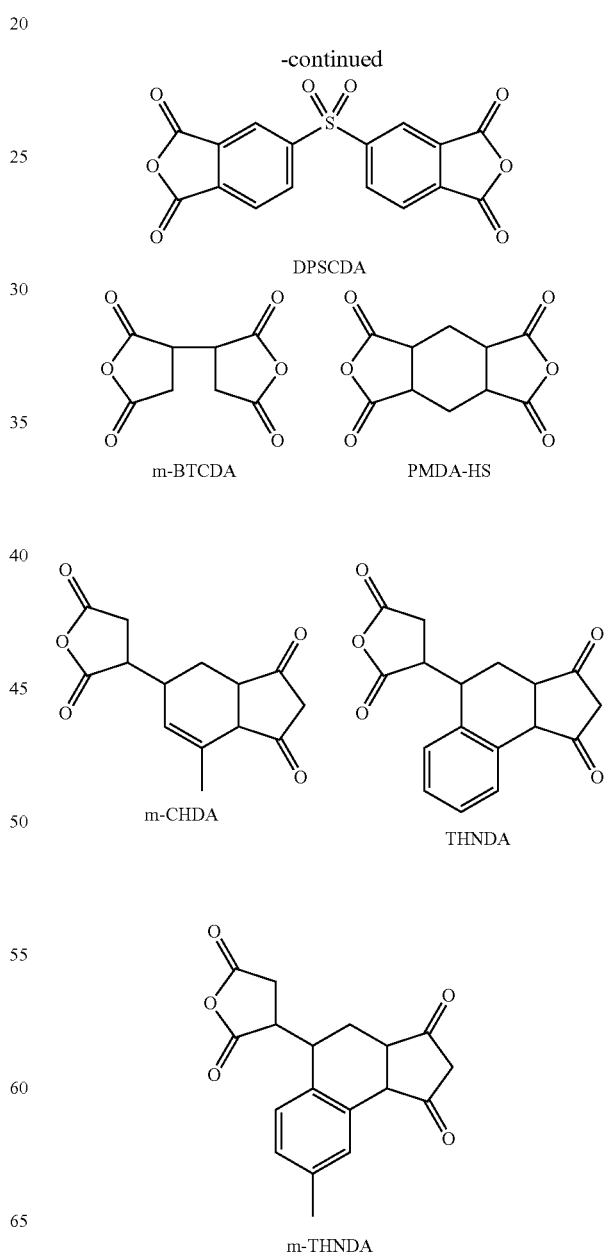

-continued

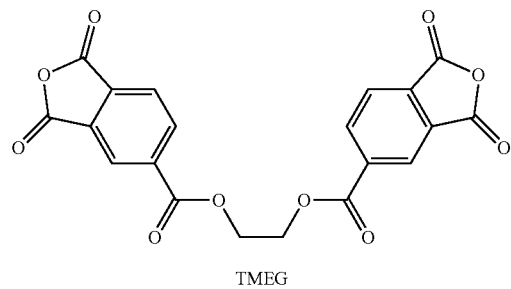

TMEG

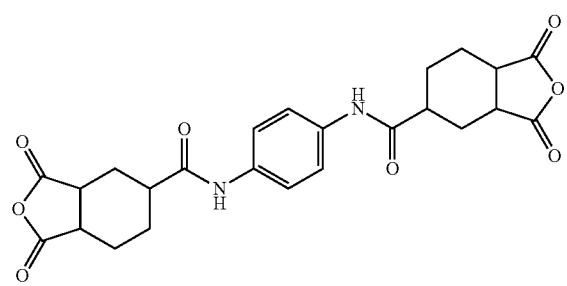

PPHT

PSHT

TMAC

NADOC

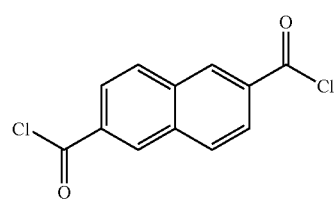

CHDOC

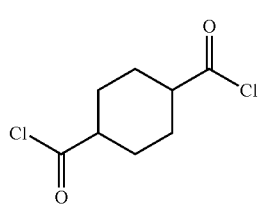

PXDOC

-continued

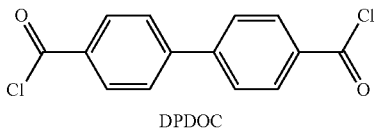

DPDOC

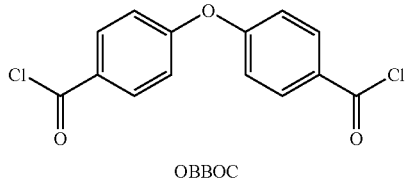

OBBOC

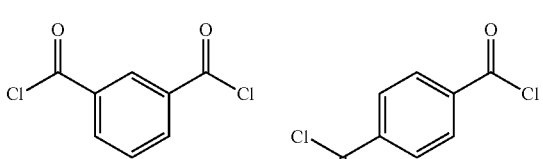

IPC

TPC

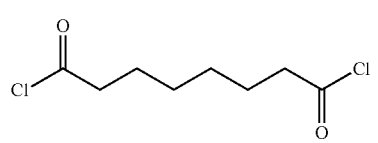

HMDOC

Among these, PA-1, PA-2, PA-5, PA-15, PA-17, PA-19, and PA-28 are preferable as polyimide, polyamide, or polyamide imide.

In the present invention, the polycarbonate having a polycyclic structure used for forming a lower layer and a sulfonamide group in the main chain is a polymer generated by a sequential polymerization reaction of a compound having a carbonate group such as alkyl carbonate and a diol compound having a polycyclic structure and a sulfonamide group in the main chain. Further, the polycarbonate is not particularly limited as long as the polycarbonate has a polycyclic structure and a sulfonamide group in the main chain.

Specific preferred examples of the polycarbonate which can be used in the present invention are shown in Table 9. Specific examples PK-1 to PK-13 indicate specific polymer compounds formed by reacting a diol compound having a polycyclic structure and a sulfonamide group in the main chain, other diol compounds, and a compound having a carbonate group such as alkyl carbonate, listed in Table 9, at ratios (molar ratios) listed in Table 9. In addition, the tables show molar ratios used for synthesis of polycarbonates and weight-average molecular weights (Mw) of the obtained polycarbonates, but the polycarbonate used in the present invention is not limited to these.

Moreover, the weight-average molecular weight of a polymer is a value measured according to the GPC method.

TABLE 9

| Specific polymer compound | Specific diol compound-1 (molar ratio thereof contained) | Specific diol compound-2 (molar ratio thereof contained) | Diol compound-1 (molar ratio thereof contained) | Diol compound-2 (molar ratio thereof contained) | Compound containing carbonate group (molar ratio thereof contained) | Weight-average molecular weight (ten thousand) |
|---|---|---|---|---|---|---|
| PK-1  | SB-1 70 | — | DO-1 30 | — | Diethyl carbonate 100 | 4.6 |
| PK-2  | SB-1 60 | — | DO-1 40 | — | Diethyl carbonate 100 | 4.2 |
| PK-3  | SB-1 70 | — | DO-1 25 | DO-6 5 | Diethyl carbonate 100 | 4.8 |
| PK-4  | SB-1 70 | — | DO-2 30 | — | Diethyl carbonate 100 | 4.5 |
| PK-5  | SB-1 60 | — | DO-2 40 | — | Diethyl carbonate 100 | 4.1 |
| PK-6  | SB-2 70 | — | DO-1 30 | — | Diethyl carbonate 100 | 4.3 |
| PK-7  | SB-2 70 | — | DO-1 25 | DO-6 5 | Diethyl carbonate 100 | 4.3 |
| PK-8  | SB-5 70 | — | DO-1 30 | — | Diethyl carbonate 100 | 3.9 |
| PK-9  | SB-5 70 | — | DO-1 25 | DO-6 5 | Diethyl carbonate 100 | 4.6 |
| PK-10 | SB-6 70 | — | DO-1 30 | — | Diethyl carbonate 100 | 4.5 |
| PK-11 | SB-6 70 | — | DO-1 25 | DO-7 5 | Diethyl carbonate 100 | 4.2 |
| PK-12 | SB-9 70 | — | DO-1 30 | — | Diethyl carbonate 100 | 4.8 |
| PK-13 | SB-9 70 | — | DO-1 25 | DO-7 5 | Diethyl carbonate 100 | 4.9 |

Examples of preferable compounds which include the compounds listed in Table 9 and are used for synthesis of polycarbonate used in the present invention include the following compounds and SB-1 to SB-19.

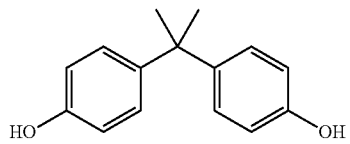

DO-1

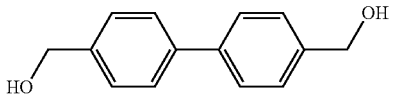

DO-2

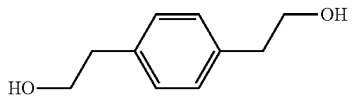

DO-3

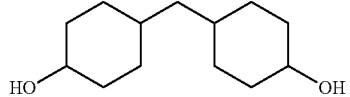

DO-4

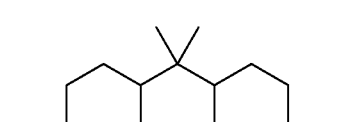

DO-5

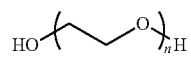

DO-6

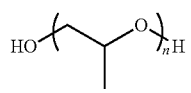

DO-7

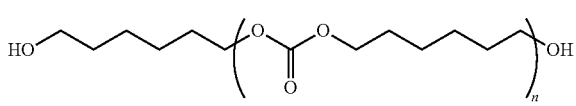

DO-8

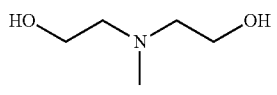

DO-9

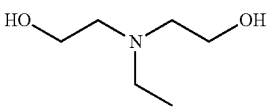

DO-10

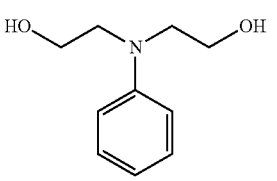

DO-11

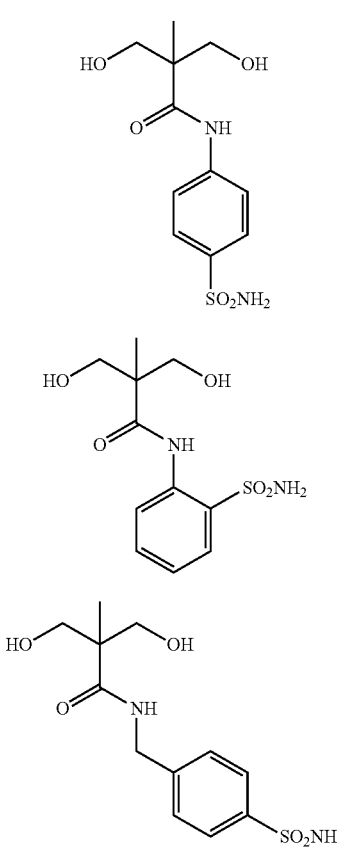

DO-12

DO-13

DO-14

Among these, PK-1, PK-3, PK-7, PK-10, and PK-12 are preferable as polycarbonate.

[Content]

The content of the specific polymer compound is preferably in a range of 10% to 90% by mass, more preferably in a range of 20% to 80% by mass, and still more preferably in a range of 30% to 80% by mass with respect to the total solid content mass in the photosensitive resin composition of the present invention.

When the content of the specific polymer compound is in the above-described range, it is possible to obtain a photosensitive resin composition having excellent coating properties.

<Infrared Absorbent>

The photosensitive resin composition of the present invention contains an infrared absorbent.

The infrared absorbent is not particularly limited as long as it is a dye which generates heat by absorbing infrared light, and various dyes known as an infrared absorbent can be used.

As the infrared absorbent which can be used in the present invention, commercially available dyes or known dyes described in documents (for example, "Dye Handbook", compiled by the Society of Synthetic Organic Chemistry, published in 1970) can be used. Specifically, dyes such as azo dyes, metal complex azo dyes, pyrazolone azo dyes, anthraquinone dyes, phthalocyanine dyes, carbonium dyes, quinone imine dyes, methine dyes, and cyanine dyes are exemplified. In the present invention, among these dyes, a dye absorbing at least infrared light or near infrared light is preferable from the viewpoint of being suitable for use in laser emitting infrared light or near infrared light, and a cyanine dye is particularly preferable.

Examples of such a dye absorbing at least infrared light or near infrared light include the cyanine dyes described in JP1983-125246A (JP-S58-125246A), JP1984-84356A (JP-S59-84356A), JP-1984-202829A (JP-S59-202829A), or JP1985-78787A (JP-S60-78787A), the methine dyes described in JP1983-173696A (JP-S58-173696A), JP1983-181690A (JP-S58-181690A), or JP1983-194595A (JP-S58-194595A), the naphthoquinone dyes described in JP1983-112793A (JP-S58-112793A), JP1983-224793A (JP-S58-224793A), JP1984-48187A (JP-S59-48187A), JP1984-73996A (JP-S59-73996A), JP1985-52940A (JP-S60-52940A), or JP1985-63744A (JP-S60-63744A), the squarylium coloring agents described in JP1983-112792A (JP-S58-112792A), and the cyanine dyes described in GB434875B.

In addition, as the dye, the near infrared absorbing sensitizers described in U.S. Pat. No. 5,156,938A are also suitably used, also, the substituted aryl benzo(thio)pyrylium salts described in U.S. Pat. No. 3,881,924A, the trimethinecyanine thiapyrylium salts described in JP1982-142645A (JP-S57-142645A) (U.S. Pat. No. 4,327,169A), the pyrylium-based compounds described in JP1983-181051A (JP-S58-181051A), JP1983-220143A (JP-S58-220143A), JP1984-41363A (JP-S59-41363A), JP1984-84248A (JP-S59-84248A), JP1984-84249A (JP-S59-84249A), JP1984-146063A (JP-S59-146063A), or JP1984-146061A (JP-S59-146061A), the cyanine coloring agents described in JP1984-216146A (JP-S59-216146A), the pentamethinethiopyrylium salts described in U.S. Pat. No. 4,283,475A, or the pyrylium compounds described in JP1993-13514B (JP-H05-13514B) or JP1993-19702B (JP-H05-19702B) are used, and as commercially available products, Epolight III-178, Epolight III-130, Epolight III-125, or the like manufactured by Epolin Inc. is particularly preferably used.

In addition, particularly preferable another examples of the dye include near infrared absorbing dyes described as Formula (I) or (II) in U.S. Pat. No. 4,756,993A.

Among these dyes, examples of a particularly preferable dye include a cyanine coloring agent, a phthalocyanine dye, an oxonol dye, a squarylium coloring agent, a pyrylium salt, a thiopyrylium dye, and a nickel thiolate complex. Furthermore, in a case where a cyanine coloring agent represented by the following Formula (a) is used in the upper layer in the present invention, a high polymerization activity is given and the stability and the economic efficiency become excellent, and thus, the cyanine coloring agent is most preferable.

Formula (a)

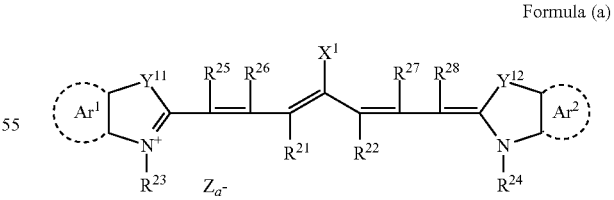

In Formula (a), $X^1$ represents a hydrogen atom, a halogen atom, a diarylamino group (—$NPh_2$), $X^2$-$L^1$, or a group shown below. $X^2$ represents an oxygen atom or a sulfur atom. $L^1$ represents a hydrocarbon group having 1 to 12 carbon atoms, an aromatic ring having a heteroatom, or a hydrocarbon group having 1 to 12 carbon atoms including a heteroatom. Here, the heteroatom represents N, S, O, a halogen atom, or Se.

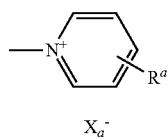

$X_a^-$

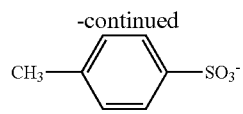

Cyanine dye A

In the formula, Xa has the same definition as Za described below, and Ra represents a substituent selected from a hydrogen atom, an alkyl group, an aryl group, a substituted or unsubstituted amino group, and a halogen atom.

$R^{21}$ and $R^{22}$ each independently represent a hydrocarbon group having 1 to 12 carbon atoms. From the viewpoint of storage stability of a photosensitive layer coating solution, each of $R^{21}$ and $R^{22}$ is preferably a hydrocarbon group having two or more carbon atoms, and $R^{21}$ and $R^{22}$ are particularly preferably bonded to each other to form a 5-membered ring or a 6-membered ring.

$Ar^1$ and $Ar^2$ may be the same as or different from each other, and $Ar^1$ and $Ar^2$ each represent an aromatic hydrocarbon group which may have a substituent. Examples of a preferable aromatic hydrocarbon group include a benzene ring and a naphthalene ring. In addition, examples of a preferable substituent include a hydrocarbon group having 12 or less carbon atoms, a halogen atom, and an alkoxy group having 12 or less carbon atoms.

$Y^{11}$ and $Y^{12}$ may be the same as or different from each other, and $Y^{11}$ and $Y^{12}$ each represent a sulfur atom or a dialkyl methylene group having 12 or less carbon atoms. $R^{23}$ and $R^{24}$ may be the same as or different from each other, and $R^{23}$ and $R^{24}$ each represent a hydrocarbon group having 20 or less carbon atoms which may have a substituent. Examples of a preferable substituent include an alkoxy group having 12 or less carbon atoms, a carboxyl group, and a sulfo group.

$R^{25}$, $R^{26}$, $R^{27}$, and $R^{28}$ may be the same as or different from each other, and $R^{25}$, $R^{26}$, $R^{27}$, and $R^{28}$ each represent a hydrogen atom or a hydrocarbon group having 12 or less carbon atoms. From the viewpoint of availability of a raw material, each of $R^{25}$, $R^{26}$, $R^{27}$, and $R^{28}$ is preferably a hydrogen atom. In addition, $Za^-$ represents a counter anion. Here, the cyanine coloring agent represented by Formula (a) has an anionic substituent in the structure thereof, and in a case where neutralization of the charge is not necessary, $Za^-$ is not necessary. From the viewpoint of storage stability of a photosensitive layer coating solution, $Za^-$ is preferably a halide ion, a perchlorate ion, a tetrafluoroborate ion, a hexafluorophosphate ion, or a sulfonate ion, and particularly preferably a perchlorate ion, a hexafluorophosphate ion, or an arylsulfonate ion.

Specific examples of the cyanine coloring agent represented by Formula (a) which can be suitably used include the cyanine coloring agents described in paragraphs 0017 to 0019 of JP2001-133969A, paragraphs 0012 to 0038 of JP2002-40638A, and paragraphs 0012 to 0023 of JP2002-23360A.

The infrared absorbent contained in the upper layer is particularly preferably a cyanine dye A shown below.

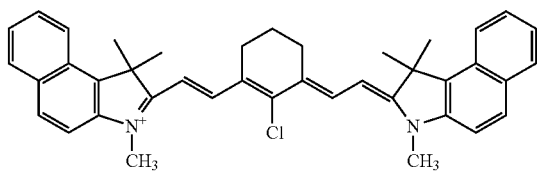

The addition amount when an infrared absorbent is added to the photosensitive resin composition of the present invention is preferably 0.01% to 50% by mass, more preferably 0.1% to 30% by mass, and particularly preferably 1.0% to 30% by mass, with respect to the total solid content in the photosensitive resin composition. If the addition amount is 0.01% by mass or greater, the layer becomes high sensitive, and if the addition amount is 50% by mass or less, the uniformity of the layer is good and the durability of the layer is excellent.

<Other Alkali-Soluble Resins>

In the present invention, the "alkali-soluble" means "being solubilized by a treatment for a standard development time in an alkali aqueous solution with a pH of 8.5 to 13.5".

Although the alkali-soluble resin other than the specific polymer compound used in the photosensitive resin composition of the present invention is not particularly limited as long as it has a characteristic of being dissolved by contact with an alkali developer, the alkali-soluble resin preferably has an acidic functional group such as a phenolic hydroxyl group, a sulfonate group, a phosphate group, a sulfonamide group, or an active imide group in the main chain and/or a side chain in the polymer, a resin including 10 mol % or greater of a monomer having such an acidic functional group imparting alkali-solubility is exemplified, and a resin including 20 mol % or greater is more preferable. If the copolymerization component of the monomer imparting alkali-solubility is 10 mol % or greater, sufficient alkali-solubility is obtained, and developability is excellent.

In addition, as the alkali-soluble resin, a novolac resin is also preferably exemplified.

As the novolac resin which can be used in the present invention, novolac resins such as a phenol formaldehyde resin, an m-cresol formaldehyde resin, a p-cresol formaldehyde resin, an m-/p-mixed cresol formaldehyde resin, a phenol/cresol (which may be any mixture of m-, p-, and m-/p-) mixed formaldehyde resin or pyrogallol acetone resins are preferably exemplified.

In addition, a polycondensate of phenol having an alkyl group having 3 to 8 carbon atoms as a substituent and formaldehyde, such as a t-butyl phenol formaldehyde resin or an octyl phenol formaldehyde resin, as described in U.S. Pat. No. 4,123,279A, is exemplified. In addition, the weight-average molecular weight (Mw) thereof is preferably 500 or greater, and more preferably 1,000 to 700,000. In addition, the number average molecular weight (Mn) thereof is preferably 500 or greater, and more preferably 750 to 650,000. The dispersity (weight-average molecular weight/number average molecular weight) is preferably 1.1 to 10.

Other alkali-soluble resins preferably have a weight-average molecular weight of 2,000 or greater and a number average molecular weight of 500 or greater, and more preferably have a weight-average molecular weight of 5,000 to 300,000 and a number average molecular weight of 800 to 250,000. The dispersity (weight-average molecular weight/number average molecular weight) of other alkali-soluble resins is preferably 1.1 to 10.

Other alkali-soluble resins included in the photosensitive resin composition of the present invention as desired may be used alone or in combination of two or more types thereof.

The content of other alkali-soluble resins with respect to the total solid content in the photosensitive resin composition of the present invention is preferably 0% to 98% by mass and more preferably 0% to 80% by mass. In addition, 80 parts by mass or less thereof are preferably included with respect to 100 parts by mass of the specific polymer compound used in the present invention.

<Acid Generator>

The photosensitive resin composition of the present invention preferably contains an acid generator, from the viewpoint of sensitivity improvement.

The acid generator in the present invention is a compound which generates an acid by light or heat, and indicates a compound which generates an acid due to decomposition by irradiation with infrared rays or heating at 100° C. or higher. The acid generated is preferably a strong acid having a pKa of 2 or less such as sulfonic acid or hydrochloric acid. The permeability of a developer into the image recording layer of the exposed portion is increased and the solubility of the image recording layer in an alkali aqueous solution is further improved due to an acid generated from this acid generator.

Examples of the acid generator suitably used in the present invention include onium salts such as an iodonium salt, a sulfonium salt, a phosphonium salt, and a diazonium salt. Specifically, the compounds described in U.S. Pat. No. 4,708,925A or JP1995-20629A (JP-H07-20629A) can be exemplified. In particular, an iodonium salt, a sulfonium salt, or a diazonium salt, which has a sulfonate ion as a counter ion, is preferable. As the diazonium salt, the diazonium compound described in U.S. Pat. No. 3,867,147A, the diazonium compound described in U.S. Pat. No. 2,632,703A, or the diazo resins described in JP1989-102456A (JP-H01-102456A) or JP1989-102457A (JP-H01-102457A) are also preferable. In addition, the benzyl sulfonates described in U.S. Pat. No. 5,135,838A or U.S. Pat. No. 5,200,544A are also preferable. Furthermore, the active sulfonic acid esters or the disulfonyl compounds described in JP1990-100054A (JP-H02-100054A), JP1990-100055A (JP-H02-100055A), or JP1997-197671 (JP-H09-197671) are also preferable. In addition, the haloalkyl-substituted S-triazines described in JP1995-271029A (JP-H07-271029A) are also preferable.

Furthermore, the compound described as an "acid precursor" in JP1996-220752A (JP-H08-220752A) or the compound described as "(a) a compound which can generate an acid by irradiation with active light" in JP1997-171254A (JP-H09-171254A) can also be applied as the acid generator of the present invention.

Among these, from the viewpoint of sensitivity and stability, an onium salt compound is preferably used as an acid generator. The onium salt compound will be described below.

As the onium salt compound which can be suitably used in the present invention, compounds known as a compound which generates an acid due to decomposition by infrared ray exposure or heat energy generated from the infrared absorbent by exposure can be exemplified. As the onium salt compound suitable in the present invention, from the viewpoint of sensitivity, known thermal polymerization initiators or compounds having a bond with small bond dissociation energy and having an onium salt structure described below can be exemplified.

Examples of the onium salt suitably used in the present invention include known diazonium salts, iodonium salts, sulfonium salts, ammonium salts, pyridinium salts, and azinium salts, and among these, sulfonate of triarylsulfonium or diaryliodonium, carboxylate, $BF_4^-$, $PF_6^-$, or $ClO_4^-$ is preferable.

Examples of the onium salt which can be used as an acid generator in the present invention include onium salts represented by the following Formulae (III) to (V).

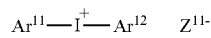

Formula (III)

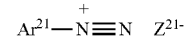

Formula (IV)

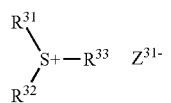

Formula (V)

In Formula (III), $Ar^{11}$ and $Ar^{12}$ each independently represent an aryl group having 20 or less carbon atoms which may have a substituent. Examples of a preferable substituent in a case where the aryl group has a substituent include a halogen atom, a nitro group, an alkyl group having 12 or less carbon atoms, an alkoxy group having 12 or less carbon atoms, and an aryloxy group having 12 or less carbon atoms. $Z^{11-}$ represents a counter ion selected from the group consisting of a halogen ion, a perchlorate ion, a tetrafluoroborate ion, a hexafluorophosphate ion, a sulfonate ion, or a sulfonate ion having a fluorine atom such as a perfluoroalkyl sulfonate ion, and a perchlorate ion, a hexafluorophosphate ion, an aryl sulfonate ion, or a perfluoroalkyl sulfonic acid is preferable.

In Formula (IV), $Ar^{21}$ represents an aryl group having 20 or less carbon atoms which may have a substituent. Examples of a preferable substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms. $Z^{21-}$ represents a counter ion having the same meaning as $Z^{11-}$.

In Formula (V), $R^{31}$, $R^{32}$, and $R^{33}$ may be the same as or different from each other, and $R^{31}$, $R^{32}$, and $R^{33}$ each represent a hydrocarbon group having 20 or less carbon atoms which may have a substituent. Examples of a preferable substituent include a halogen atom, a nitro group, an alkyl group having 12 or less carbon atoms, an alkoxy group having 12 or less carbon atoms, and an aryloxy group having 12 or less carbon atoms. $Z^{31}$— represents a counter ion having the same meaning as $Z^{11}$ Specific examples of onium salts (OI-1 to OI-10) represented by Formula (III), onium salts (ON-1 to ON-5) represented by Formula (IV), and onium salts (OS-1 to OS-6) represented by Formula (V) which can be suitably used in the present invention are exemplified below.

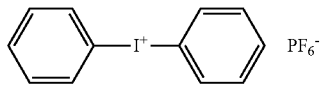

[OI-1]

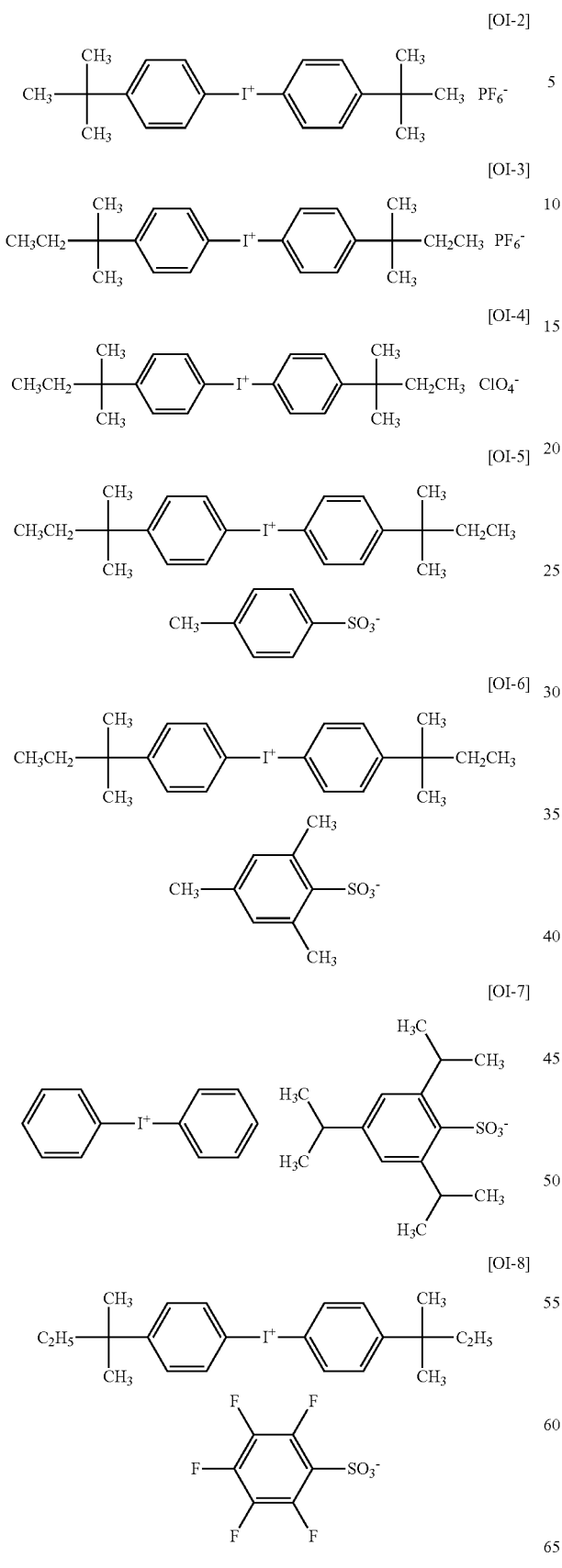
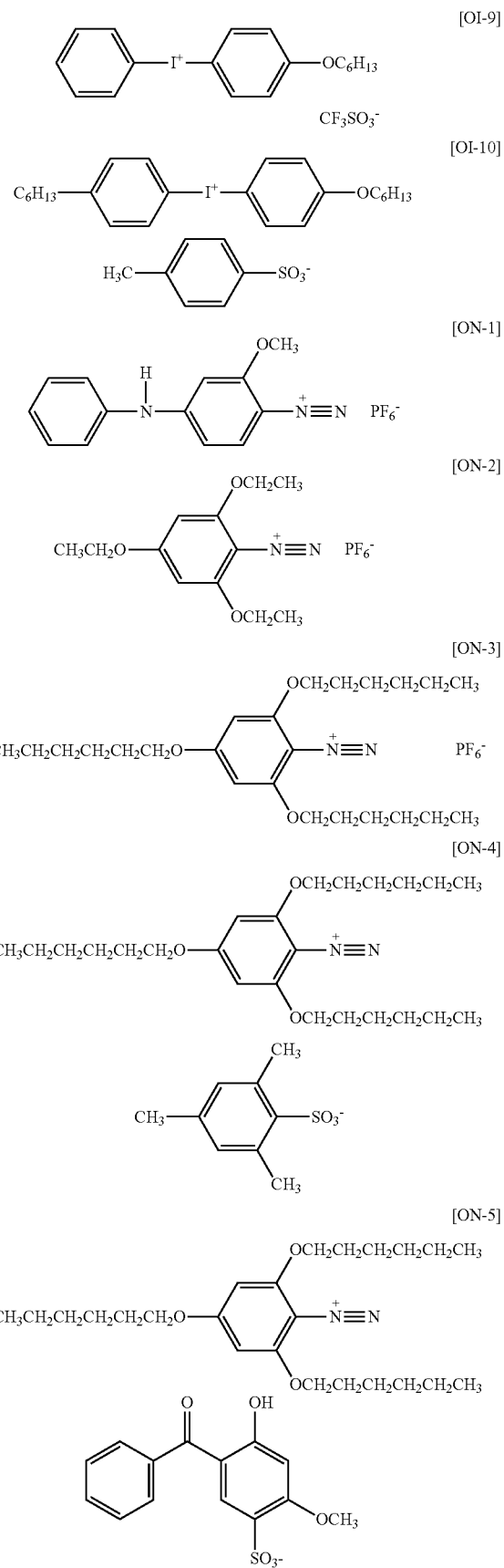

[OS-1]
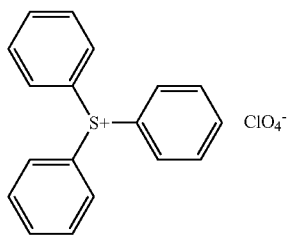

[OS-2]
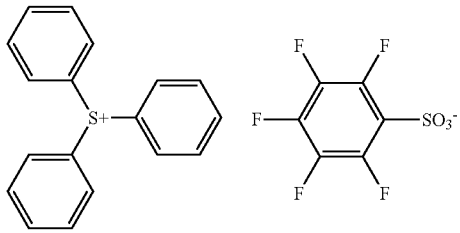

[OS-6]
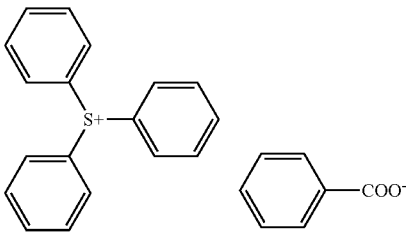

In addition, as another example of the compounds represented by each of Formula (III) to (V), the compounds described as an example of a radical polymerization initiator in paragraphs 0036 to 0045 of JP2008-195018A can be suitably used as an acid generator in the present invention.

Another example of a preferable onium salt as the acid generator used in the present invention includes an azinium salt compound represented by the following Formula (VI).

[OS-3]
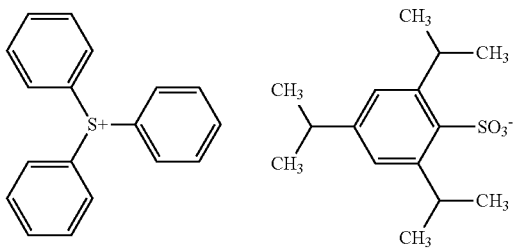

Formula (VI)

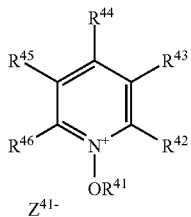

In Formula (VI), $R^{41}$, $R^{42}$, $R^{43}$, $R^{44}$, $R^{45}$, and $R^{46}$ may be the same as or different from each other, and $R^{41}$, $R^{42}$, $R^{43}$, $R^{44}$, $R^{45}$, and $R^{46}$ each represent a hydrogen atom, a halogen atom, or a monovalent substituent.

Examples of the monovalent substituent include a halogen atom, an amino group, a substituted amino group, a substituted carbonyl group, a hydroxyl group, a substituted oxy group, a thiol group, a thioether group, a silyl group, a nitro group, a cyano group, an alkyl group, an alkenyl group, an aryl group, a heterocyclic group, a sulfo group, a substituted sulfonyl group, a sulfonate group, a substituted sulfinyl group, a phosphono group, a substituted phosphono group, a phosphonate group, and a substituted phosphonate group, and in the case of being introducible, each of $R^{41}$, $R^{42}$, $R^{43}$, $R^{44}$, $R^{45}$, and $R^{46}$ may further have a substituent.

[OS-4]
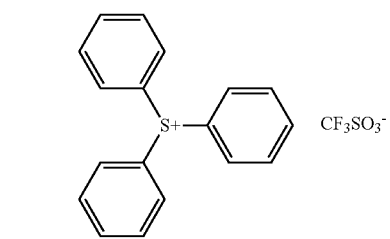

A compound (multimerized form) including two or more cation portions in the molecule as a result of bonding of the skeletons (cation portions) having a specific structure in the compound represented by Formula (VI) to each other through $R^{41}$ is also included in examples of the compound represented by Formula (VI), and such a compound is also suitably used.

$Z^{41-}$ represents a counter ion having the same meaning as $Z^{11-}$.

Specific examples of the azinium salt compound represented by Formula (VI) include the compounds described in paragraphs 0047 to 0056 of JP2008-195018A.

In addition, a compound group having an N—O bond described in JP1988-138345A (JP-S63-138345A), JP1988-142345A (JP-S63-142345A), JP1988-142346A (JP-S63-142346A), JP1988-143537A (JP-S63-143537A), or JP1971-42363B (JP-S46-42363B) is also suitably used as the acid generator in the present invention.

[OS-5]
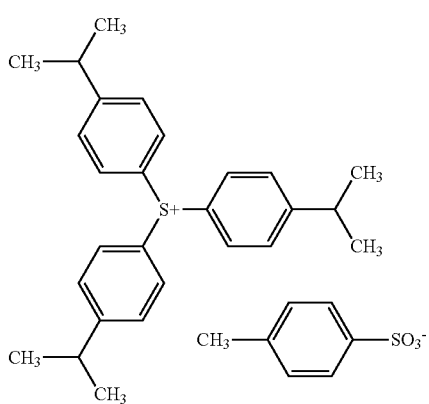

More preferable examples of the acid generator which can be used in the present invention include the following compounds (PAG-1) to (PAG-5).

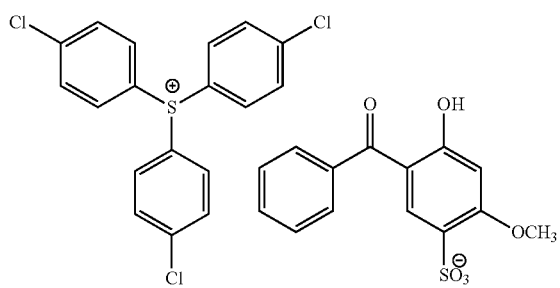

PAG-1

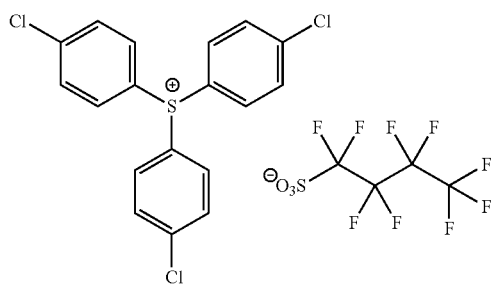

PAG-2

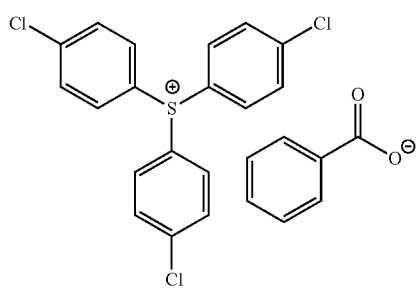

PAG-3

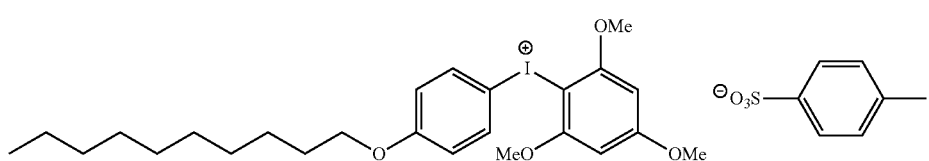

PAG-4

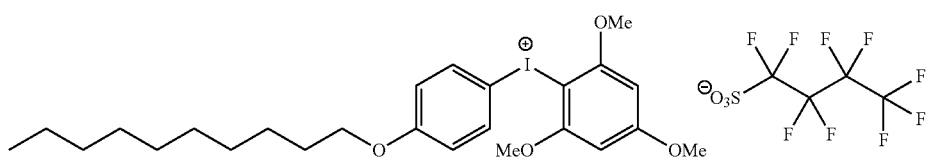

PAG-5

In a case where these acid generators are contained in the photosensitive resin composition of the present invention, these compounds may be used alone or in combination of two or more types thereof.

A preferable addition amount of acid generator is in a range of 0.01% to 50% by mass, preferably in a range of 0.1% to 40% by mass, and more preferably in a range of 0.5% to 30% by mass, with respect to the total solid content in the photosensitive resin composition. If the addition amount is within the above range, improvement of sensitivity which is the effect of the addition of an acid generator is observed, and an occurrence of a residual film in a non-image portion is suppressed.

<Acid Proliferative Agent>

An acid proliferative agent may be added to the recording layer of the present invention. The acid proliferative agent in the present invention is a compound substituted with a residue of a relatively strong acid, and a compound which newly generates an acid by being easily released in the presence of an acid catalyst. That is, the compound is decomposed by an acid catalyzed reaction, and generates an acid (hereinafter, referred to as ZOH in formulae) again. Since one or more acids per reaction are increased, and with the progress of the reaction, the acid concentration is increasingly increased, sensitivity is dramatically improved. The intensity of this generated acid is 3 or less as an acid dissociation constant (pKa), and preferably 2 or less. In the case of a weaker acid than this, it is not possible to cause the elimination reaction by an acid catalyst.

Examples of the acid used in such an acid catalyst include dichloroacetic acid, trichloroacetic acid, methanesulfonic acid, ethanesulfonic acid, benzenesulfonic acid, p-toluenesulfonic acid, naphthalenesulfonic acid, and phenyl sulfonic acid.

As the acid proliferative agent, the acid proliferative agents described in WO95/29968A, WO98/24000A, JP1996-305262A (JP-H08-305262A), JP1997-34106A (JP-H09-34106A), JP1996-248561A (JP-H08-248561A), JP1996-503082A (JP-H08-503082A), U.S. Pat. No. 5,445,917A, JP1996-503081A (JP-H08-503081A), U.S. Pat. Nos. 5,534,393A, 5,395,736A, 5,741,630A, 5,334,489A, 5,582,956A, 5,578,424A, 5,453,345A, 5,445,917A, EP665960B, EP757628B, EP665961B, U.S. Pat. No. 5,667,943A, or JP1998-1598A (JP-H10-1598A) can be used alone or in combination of two or more types thereof.

Preferable specific examples of the acid proliferative agent in the present invention include the compounds described in paragraphs 0056 to 0067 of JP2001-66765A. Among these, the following compounds described as an exemplary compound (ADD-1), (ADD-2), or (ADD-3) can be suitably used.

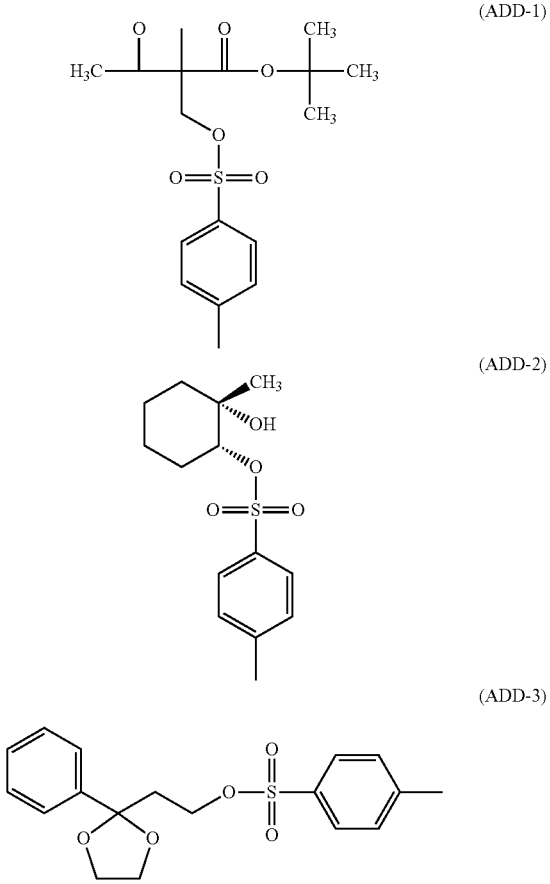

The addition amount in a case where the acid proliferative agent is added in an upper layer is in a range of 0.01% to 20% by mass, preferably in a range of 0.01% to 10% by mass, and more preferably in a range of 0.1% to 5% by mass, expressed in terms of the solid contents. If the addition amount of the acid proliferative agent is within the above range, effects of adding acid proliferative agent is sufficiently obtained, improvement in sensitivity is achieved, and film hardness reduction of an image portion is suppressed.

<Other Additives>

The photosensitive resin composition of the present invention may include a development accelerator, a surfactant, a print-out agent/colorant, a plasticizer, or a wax agent, as other additives.

[Development Accelerator]

For the purpose of improving sensitivity, acid anhydrides, phenols, or organic acids may be added to the photosensitive resin composition of the present invention.

As the acid anhydrides, cyclic acid anhydride is preferable, and specifically, as the cyclic acid anhydride, phthalic anhydride, tetrahydrophthalic anhydride, hexahydrophthalic anhydride, 3,6-endooxytetrahydrophthalic anhydride, tetrachlorophthalic anhydride, maleic anhydride, chloromaleic anhydride, ca-phenylmaleic anhydride, succinic anhydride, or pyromellitic anhydride described in U.S. Pat. No. 4,115,128A can be used. As the non-cyclic acid anhydride, acetic anhydride is exemplified.

Examples of the phenols include bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenxophenone, 4,4',4''-trihydroxytriphenyl methane, and 4,4',3'',4'''-tetrahydroxy-3,5,3',5'-tetramethyltriphenyl methane.

The organic acids are described in JP1985-88942A (JP-S60-88942A), JP1990-96755A (JP-H02-96755A), or the like, and specific examples thereof include p-toluenesulfonic acid, dodecylbenzenesulfonic acid, p-toluenesulfinic acid, ethyl sulfate, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The ratio of the acid anhydrides, the phenols, and the organic acids to the total solid content in the photosensitive resin composition is preferably 0.05% to 20% by mass, more preferably 0.1% to 15% by mass, and particularly preferably 0.1% to 10% by mass.

[Surfactant]

To improve coating properties and stability of a treatment with respect to development conditions, a nonionic surfactant as described in JP1987-251740A (JP-S62-251740A) or JP1991-208514A (JP-H03-208514A), an amphoteric surfactant as described in JP1984-121044A (JP-S59-121044A) or JP1992-13149A (JP-H04-13149A), or a fluorine-containing monomer copolymer such as JP1987-170950A (JP-S62-170950A), JP1999-288093A (JP-H11-288093A), or JP2003-57820A can be added to the photosensitive resin composition of the present invention.

Specific examples of the nonionic surfactant include sorbitan tristearate, sorbitan monopalmitate, sorbitan trioleate, monoglyceride stearate, and polyoxyethylenenonylphenyl ether.

Specific examples of the amphoteric surfactant include alkyl di(aminoethyl)glycine, alkylpolyaminoethylglycine hydrochloride, 2-alkyl-N-carboxyethyl-N-hydroxyethyl imidazolinium betaine, and an N-tetradecyl-N,N-betaine type (for example, product name "AMOGEN K" manufactured by Dai-ichi Kogyo Seiyaku Co., Ltd.).

The ratio of the surfactant to the total solid content in the photosensitive resin composition is preferably 0.01% to 15% by mass, more preferably 0.01% to 5% by mass, and still more preferably 0.05% to 2.0% by mass.

[Print-Out Agent/Colorant]

A print-out agent for obtaining a visible image immediately after heating by exposure or a dye or a pigment as an image colorant can be added to the photosensitive resin composition of the present invention.

Examples of the print-out agent and the colorant are described in detail in paragraphs 0122 and 0123 of JP2009-229917A, and the compounds described here can be applied to the present invention.

The dye is preferably added in a ratio of 0.01% to 10% by mass and more preferably added in a ratio of 0.1% to 3% by mass, with respect to the total solid content of the photosensitive resin composition.

[Plasticizer]

To impart flexibility or the like to the coating film, a plasticizer may be added to the photosensitive resin composition of the present invention. For example, butylphthalyl polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, or an oligomer or a polymer of acrylic acid or methacrylic acid is used.

These plasticizers are preferably added in a ratio of 0.5% to 10% by mass and more preferably added in a ratio of 1.0% to 5% by mass, with respect to the total solid content of the photosensitive resin composition.

[Wax Agent]

For the purpose of imparting resistance against scratches, a compound for reducing the coefficient of static friction of the surface can also be added to the photosensitive resin composition of the present invention. Specifically, the compounds having an ester of a long chain alkyl carboxylic acid as described in U.S. Pat. No. 6,117,913A, JP2003-149799A, JP2003-302750A, or JP2004-12770A can be exemplified.

As a preferable addition amount thereof, the ratio of the wax agent to the solid content of the photosensitive resin composition is preferably 0.1% to 10% by mass and more preferably 0.5% to 5% by mass.

<Compositional Ratio of Respective Components>

The content of the specific polymer compound is preferably 10% to 90% by mass, the content of the infrared absorbent is preferably 0.01% to 50% by mass, the content of other alkali-soluble resins is preferably 0% to 80% by mass, the content of the acid generator is preferably 0% to 30% by mass, the content of the acid proliferative agent is preferably 0% to 20% by mass, the content of the development accelerator is preferably 0% to 20% by mass, the content of the surfactant is preferably 0% to 5% by mass, the content of the print-out agent/colorant is preferably 0% to 10% by mass, the content of the plasticizer is preferably 0% to 10% by mass, and the content of the wax agent is preferably 0% to 10% by mass, with respect to the total solid content mass of the photosensitive resin composition of the present invention.

The photosensitive resin composition of the present invention can be applied to various fields requiring resin pattern formation excellent in durability, for example, various fields such as a resist, a display, a planographic printing plate precursor, and the like, and since the photosensitive resin composition can be recorded with high sensitivity and has excellent image formability, and the durability of the image portion formed of the composition is good, by applying to an infrared sensitive positive type planographic printing plate precursor described in detail below, the effects of the present invention can become significant.

(Planographic Printing Plate Precursor)

The planographic printing plate precursor of the present invention has an image recording layer including the photosensitive resin composition of the present invention, on a support having a hydrophilic surface.

In addition, the planographic printing plate precursor of the present invention is preferably a positive type planographic printing plate precursor.

Furthermore, the planographic printing plate precursor of the present invention is a positive type planographic printing plate precursor including a recording layer which has an lower layer and an upper layer in this order on a support having a hydrophilic surface, and the photosensitive resin composition is preferably contained in at least one of the lower layer or the upper layer, more preferably contained in the lower layer or the upper layer, and still more preferably contained only in the lower layer.

<Recording Layer>

The recording layer used in the present invention can be formed by dissolving respective components of the photosensitive resin composition in a solvent and applying the resulting product to a suitable support.

Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethyl sulfoxide, sulfolane, γ-butyrolactone, and toluene, and the present invention is not limited thereto. These solvents are used alone or in a mixture.

<Formation of Lower Layer and Upper Layer>

In addition, the recording layer of the present invention is preferably a recording layer (hereinafter, also referred to as a "planographic printing plate precursor having a two-layer structure") in which a lower layer and an upper layer are disposed in this order on a support.

The lower layer and the upper layer are preferably separately formed in principle.

As the method of separately forming the two layers, for example, a method of using the difference in the solvent solubilities between the components included in the lower layer and the components included in the upper layer and a method of rapidly drying and removing the solvent after application to the upper layer are exemplified. Since by using the latter method in combination, the separation between the layers is more favorably performed, the method is preferable.

These methods will be described in detail below, but the method of separately applying to the two layers is not limited thereto.

In the method of using the difference in the solvent solubilities between the components included in the lower layer and the components included in the upper layer, when applying a coating solution for an upper layer, a solvent system in which all the components included in the lower layer are insoluble is used. Thus, even in a case where two-layer coating is performed, a coating film can be formed such that each layer thereof is clearly separated. For example, by selecting a component insoluble in a solvent such as methyl ethyl ketone or 1-methoxy-2-propanol which dissolves an alkali-soluble resin which is the upper layer component, as the lower layer component, applying to the lower layer and drying using a solvent system which dissolves the lower layer component, dissolving the alkali-soluble resin-based upper layer in methyl ethyl ketone or 1-methoxy-2-propanol, and applying the resulting product and drying, bilayering is possible.

Next, the method of very rapidly drying the solvent after application to the second layer (upper layer) can be achieved by blowing high-pressure air from a slit nozzle provided substantially at a right angle with respect to the running direction of the web, applying heat energy as conductive heat from the lower surface of the web by a roll (heating roll) into which a heating medium such as steam has been supplied, or combining these.

The photosensitive resin composition of the present invention is preferably included in the upper layer and/or the lower layer, and more preferably included only in the lower layer.

The coating amount after drying of the lower layer applied to the support of the planographic printing plate precursor of the present invention is preferably in a range of 0.5 to 4.0 g/m$^2$ and more preferably in a range of 0.6 to 2.5 g/m$^2$. If the coating amount is 0.5 g/m$^2$ or greater, printing durability is excellent, and if the coating amount is 4.0 g/m$^2$ or less, image reproducibility and sensitivity are excellent.

In addition, the coating amount after drying of the upper layer component is preferably 0.05 to 1.0 g/m$^2$ and more preferably 0.08 to 0.7 g/m$^2$. If the coating amount is 0.05 g/m$^2$ or greater, development latitude and scratch resistance are excellent, and if the coating amount is 1.0 g/m$^2$ or less, sensitivity is excellent.

The coating amount after drying of the lower layer and the upper layer is preferably in a range of 0.6 to 4.0 g/m$^2$ and more preferably in a range of 0.7 to 2.5 g/m$^2$. If the coating amount is 0.6 g/m$^2$ or greater, printing durability is excellent, and if the coating amount is 4.0 g/m$^2$ or less, image reproducibility and sensitivity are excellent.

<Upper Layer>

The upper layer of the planographic printing plate precursor having a two-layer structure of the present invention can be formed using the photosensitive resin composition of the present invention, and is preferably formed using a resin composition other than the photosensitive resin composition of the present invention.

The upper layer of the planographic printing plate precursor having a two-layer structure of the present invention is preferably an infrared sensitive positive type recording layer of which the solubility in an alkali aqueous solution is improved by heat.

The mechanism of improving the solubility in alkali aqueous solution by heat in the upper layer is not particularly limited, and any one can be used as long as it includes a binder resin and improves the solubility of the heated region. As the heat used in image formation, the heat generated in a case where the lower layer including an infrared absorbent is exposed is exemplified.

Preferable examples of the upper layer of which the solubility in an alkali aqueous solution is improved by heat include a layer including an alkali-soluble resin having a hydrogen-bonding capacity such as novolac or urethane, a layer including a water-insoluble and alkali-soluble resin and a compound having a dissolution suppressing action, and a layer including an ablation-possible compound.

In addition, by further adding an infrared absorbent to the upper layer, the heat generated from the upper layer can also be used in image formation. Preferable examples of the constitution of the upper layer including an infrared absorbent include a layer including an infrared absorbent, a water-insoluble and alkali-soluble resin, and a compound having a dissolution suppressing action, and a layer including an infrared absorbent, a water-insoluble and alkali-soluble resin, and an acid generator.

[Water-Insoluble and Alkali-Soluble Resin]

The upper layer according to the present invention preferably contains a water-insoluble and alkali-soluble resin. By containing the water-insoluble and alkali-soluble resin, an interaction is formed between the polar groups of the infrared absorbent and the water-insoluble and alkali-soluble resin, and a layer having a positive type photosensitivity is formed.

General water-insoluble and alkali-soluble resin will be described below in detail, and among these, a polyamide resin, an epoxy resin, a polyacetal resin, an acrylic resin, a methacrylic resin, a polystyrene-based resin, and a novolac-type phenolic resin are preferably exemplified.

The water-insoluble and alkali-soluble resin which can be used in the present invention is not particularly limited as long as it has a characteristic of being dissolved by contact with an alkali developer, and a homopolymer containing an acidic group in the main chain and/or a side chain in the polymer, a copolymer thereof, or a mixture thereof is preferable.

Such a water-insoluble and alkali-soluble resin having an acidic group preferably has a functional group such as a phenolic hydroxyl group, a carboxy group, a sulfonate group, a phosphate group, a sulfonamide group, or an active imide group. Therefore, such a resin can be suitably produced by copolymerizing a monomer mixture including one or more ethylenically unsaturated monomers having a functional group described above. As the ethylenically unsaturated monomer having a functional group described above, in addition to acrylic acid and methacrylic acid, a compound represented by the following formula and a mixture thereof can be preferably exemplified. Moreover, in the following formula, $R^{40}$ represents a hydrogen atom or a methyl group.

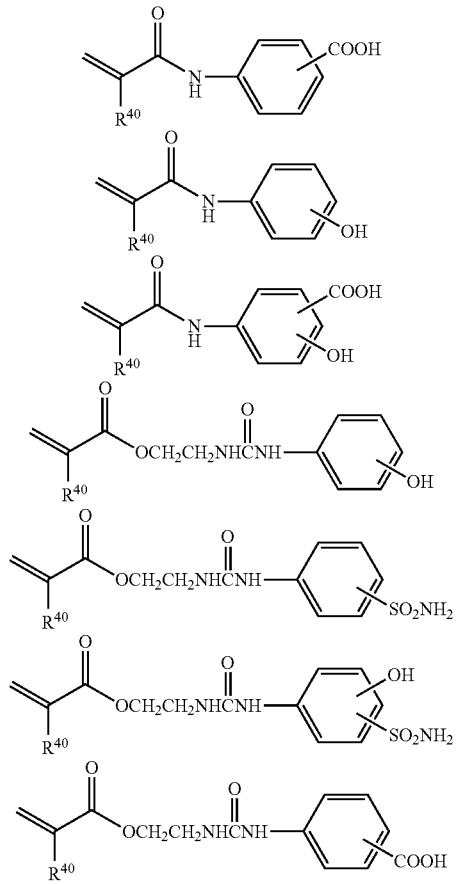

The water-insoluble and alkali-soluble resin which can be used in the present invention is preferably a polymer compound obtained by copolymerizing another polymerizable monomer in addition to the above-mentioned polymerizable monomers. As the copolymerization ratio in this case, a monomer imparting alkali-solubility such as a monomer having a functional group such as a phenolic hydroxyl group, a carboxy group, a sulfonate group, a phosphate group, a sulfonamide group, or an active imide group is preferably included in 10 mol % or greater, and more preferably included in 20 mol % or greater. If the copolymerization component of the monomer imparting alkali-solubility is 10 mol % or greater, sufficient alkali-solubility is obtained, and developability is excellent.

Examples of other usable polymerizable monomers include compounds exemplified below.

Alkyl acrylates or alkyl methacrylates such as methyl acrylate, ethyl acrylate, propyl acrylate, benzyl acrylate, methyl methacrylate, ethyl methacrylate, cyclohexyl methacrylate, and benzyl methacrylate. Acrylic acid esters or methacrylic acid esters having an aliphatic hydroxyl group such as 2-hydroxyethyl acrylate and 2-hydroxyethyl methacrylate. Acrylamides or methacrylamides such as acrylamide, methacrylamide, N-methylacrylamide, N-ethylacrylamide, and N-phenylacrylamide. Vinyl esters such as vinyl acetate, vinyl chloroacetate, vinyl butyrate, and vinyl benzoate. Styrenes such as styrene, ca-methylstyrene, methylstyrene, and chloromethylstyrene. Other nitrogen atom-containing monomers such as N-vinyl pyrrolidone, N-vinyl pyridine, acrylonitrile, and methacrylonitrile. Maleimides such as N-methylmaleimide, N-ethylmaleimide, N-propylmaleimide, N-butylmaleimide, N-phenylmaleimide, N-2-methylphenylmaleimide, N-2,6-diethylphenylmaleimide, N-2-chlorophenylmaleimide, N-cyclohexylmaleimide, N-laurylmaleimide, and N-hydroxyphenylmaleimide.

Among these other ethylenically unsaturated monomers, (meth)acrylic acid esters, (meth)acrylamides, maleimides, or (meth)acrylonitrile is suitably used.

In addition, as the alkali-soluble resin, a novolac resin exemplified as another alkali-soluble resin described as an arbitrary component of the photosensitive resin composition of the present invention may also be preferably exemplified.

In addition, the water-insoluble and alkali-soluble resin described above can also be used in the resin composition of the present invention.

Furthermore, in the upper layer of the present invention, other resins can be used in combination within a range not impairing the effects of the present invention. Since the upper layer is required to express alkali-solubility, in particular, in a non-image portion region, it is necessary to select a resin which does not impair this characteristic. From this viewpoint, as a resin usable in combination, a water-insoluble and alkali-soluble resin is exemplified. General water-insoluble and alkali-soluble resin will be described below in detail, and among these, a polyamide resin, an epoxy resin, a polyacetal resin, an acrylic resin, a methacrylic resin, a polystyrene-based resin, and a novolac-type phenolic resin are preferably exemplified.

In addition, the amount to be mixed is preferably 50% by mass or less with respect to the water-insoluble and alkali-soluble resin.

The water-insoluble and alkali-soluble resin preferably has a weight-average molecular weight of 2,000 or greater and a number average molecular weight of 500 or greater, and more preferably has a weight-average molecular weight of 5,000 to 300,000 and a number average molecular weight of 800 to 250,000. The dispersity (weight-average molecular weight/number average molecular weight) of the alkali-soluble resin is preferably 1.1 to 10.

The alkali-soluble resin in other resins of the photosensitive resin composition of the present invention may be used alone or in combination of two or more types thereof.

The content of the alkali-soluble resin with respect to the total solid content in other resin compositions of the present invention is preferably 2.0% to 99.5% by mass, more preferably 10.0% to 99.0% by mass, and still more preferably 20.0% to 90.0% by mass, in the total solid content. If the addition amount of the alkali-soluble resin is 2.0% by mass or greater, the durability of a recording layer (photosensitive layer) is good, and if the addition amount of the alkali-soluble resin is 99.5% by mass or less, both the sensitivity and the durability are good.

[Infrared Absorbent]

The upper layer may contain an infrared absorbent.

The infrared absorbent is not particularly limited as long as it is a dye which generates heat by absorbing infrared light, and the infrared absorbent used in the resin composition of the present invention, described above, can also be used.

A particularly preferable dye is the cyanine dye represented by Formula (a).

When the upper layer contains an infrared absorbent, the sensitivity is improved.

The addition amount of the infrared absorbent in the upper layer is preferably 0.01% to 50% by mass, more preferably 0.1% to 30% by mass, and particularly preferably 1.0% to 10% by mass, with respect to the total solid content in the upper layer. If the addition amount is 0.01% by mass or greater, the sensitivity is improved, and if the addition amount is 50% by mass or less, the uniformity of the layer is good and the durability of the layer is excellent.

[Other Components]

In addition, the upper layer of the planographic printing plate precursor of the two-layer structure may include an acid generator, an acid proliferative agent, a development accelerator, a surfactant, a print-out agent/colorant, a plasticizer, or a wax agent.

As these components, respective components used in the resin composition of the present invention, described above, can also be used, and preferable aspects thereof are also the same.

<Lower Layer>

The lower layer of the planographic printing plate precursor having a two-layer structure of the present invention is preferably formed by applying the photosensitive resin composition of the present invention.

By using the photosensitive resin composition of the present invention in the lower layer, a printing plate having excellent image formability and printing durability can be obtained.

In addition, by using the photosensitive resin composition of the present invention in the lower layer, in a case where materials such as an ink and paper having particularly poor quality are used, the printing durability is improved.

Though the detailed mechanism by which the effects as described above are obtained is unclear, it is assumed that for the printing durability in printing, the film hardness of the resin used in the lower layer is important, and thus, it is assumed that, since the interaction (hydrogen bonding or the like) between the binders is strong, by using the photosensitive resin composition of the present invention having a high film hardness in the lower layer, the printing durability is improved.

In a case where the photosensitive resin composition of the present invention is used in the upper layer, the lower layer is also preferably formed of the photosensitive resin composition of the present invention, and the lower layer may be formed using a resin composition other than the photosensitive resin composition of the present invention. A preferable aspect of the lower layer in this case is the same as the preferable aspect of the upper layer described above.

<Support>

The support used in the photosensitive resin composition of the present invention is not particularly limited as long as it is a dimensionally stable plate-shaped material having necessary strength and durability, and examples thereof include paper, paper on which plastic (for example, polyethylene, polypropylene, and polystyrene) has been laminated, a metal plate (for example, aluminum, zinc, and copper), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal), and paper or a plastic film on which the above-described metals have been laminated or vapor-deposited.

Moreover, the support in a case where the image forming material of the present invention is applied to a planographic printing plate precursor is preferably a polyester film or an aluminum plate, and among these, the aluminum plate which has good dimensional stability and is relatively inexpensive is particularly preferable. A suitable aluminum plate is a pure aluminum plate or an alloy plate which has aluminum as the main component and includes a small amount of other elements, or may be a plastic film on which aluminum has been laminated or vapor-deposited. Examples of other elements included in the aluminum alloy include silicon, iron, manganese, copper, magnesium, chromium, zinc, bismuth, nickel, and titanium. The content of other elements in the alloy is preferably 10% by mass or less.

Although particularly suitable aluminum in the present invention is pure aluminum, it is difficult to produce completely pure aluminum on refining technique, and thus, other elements may be slightly contained.

The composition of the aluminum plate applied to the present invention as described above is not particularly limited, and aluminum plates formed of known and used materials in the related art can be appropriately used. The thickness of the aluminum plate used in the present invention is preferably 0.1 to 0.6 mm, more preferably 0.15 to 0.4 mm, and particularly preferably 0.2 to 0.3 mm.

Such an aluminum plate may be subjected to a surface treatment such as a surface-roughening treatment and an anodization treatment, if necessary. As the surface treatment of the aluminum support, for example, a degreasing treatment with a surfactant, an organic solvent, or an alkaline aqueous solution, a roughening treatment of a surface, an anodization treatment, or the like, as described in detail in paragraphs 0167 to 0169 of JP2009-175195A, is suitably performed.

The aluminum surface on which an anodization treatment has been performed may be subjected to a hydrophilizing treatment, as necessary.

As the hydrophilizing treatment, the alkali metal silicate (for example, sodium silicate aqueous solution) method, the method of treating with potassium fluoride zirconate or polyvinylphosphonic acid, or the like, as disclosed in paragraph 0169 of JP2009-175195A, is used.

In addition, the supports described in JP2011-245844A can also be preferably used.

<Undercoat Layer>

For example, in a case where the photosensitive resin composition of the present invention is applied to a planographic printing plate precursor, an undercoat layer can be provided between a support and a recording layer, if necessary.

As the undercoat layer component, various organic compounds can be used, and preferable examples thereof include phosphonic acids having an amino group such as carboxymethylcellulose or dextrin, an organic phosphonic acid, an organic phosphorus acid, an organic phosphinic acid, amino acids, and hydrochloride of an amine having a hydroxy group. In addition, these undercoat layer components may be used alone or in a mixture of two or more types thereof. Details of the compound used in the undercoat layer and the method of forming the undercoat layer are described in paragraphs 0171 and 0172 of JP2009-175195A, and those described here are also applied to the present invention.

The coating amount of the undercoat layer is preferably 2 to 200 mg/m$^2$ and more preferably 5 to 100 mg/m$^2$. If the coating amount is within the above range, sufficient printing durability is obtained.

<Back Coat Layer>

A back coat layer is provided on the rear surface of the support of the planographic printing plate precursor of the present invention, if necessary. As the back coat layer, coating layers formed of an organic polymer compound described in JP1993-45885A (JP-H05-45885A) or a metal oxide obtained by hydrolyzing and polycondensing an organic or inorganic metal compound described in JP1994-35174A (JP-H06-35174A) are preferably used. Among these coating layers, alkoxy compounds of silicon such as $Si(OCH_3)_4$, $Si(OC_2H_5)_4$, $Si(OC_3H_7)_4$, and $Si(OC_4H_9)_4$ are easily available at low cost, and coating layers of metal oxides obtained from these have excellent developer resistance, and thus, these are particularly preferable.

(Production Method for Planographic Printing Plate)

The production method of the planographic printing plate of the present invention includes an exposure step of imagewise exposing the planographic printing plate precursor and a development step of performing development using an alkali aqueous solution having a pH of 8.5 to 13.5 in this order.

According to the production method of the planographic printing plate of the present invention, the developability change becomes good, the contamination due to the residual film of the non-image portion does not occur in the obtained planographic printing plate, and the strength of the image portion and the durability are excellent.

Hereinafter, each step of production method of the present invention will be described in detail.

<Exposure Step>

The production method of the planographic printing plate of the present invention includes an exposure step of imagewise exposing the planographic printing plate precursor of the present invention.

As a light source of active light used in image exposure of the planographic printing plate precursor of the present invention, a light source having an emission wavelength in the near infrared region to the infrared region is preferable, and solid-state laser or semiconductor laser is more preferable. Among these, in the present invention, it is particularly preferable that image exposure is performed by solid-state laser or semiconductor laser emitting infrared rays having a wavelength of 750 to 1,400 nm.

The output of the laser is preferably 100 mW or greater, and to shorten the exposure time, a multibeam laser device is preferable used. In addition, the exposure time per pixel is preferably within 20 µseconds.

Energy with which the planographic printing plate precursor is irradiated is preferably 10 to 300 mJ/cm$^2$. If the energy is within the above range, curing sufficiently proceeds and the laser ablation is suppressed, and thus, it is possible to prevent an image from being damaged.

In the exposure in the present invention, it is possible to expose by overlapping a light beam of the light source. The overlapping means that the sub-scanning pitch width is smaller than the beam diameter. For example, when the beam diameter is expressed by the half width (FWHM) of the beam intensity, the overlapping can be quantitatively expressed by FWHM/sub-scanning pitch width (overlap coefficient). In the present invention, this overlap coefficient is preferably 0.1 or greater.

The scanning method of the light source of an exposure apparatus which can be used in the present invention is not particularly limited, and a drum outer surface scanning method, a drum inner surface scanning method, a planar scanning method, or the like can be used. In addition, the channel of the light source may be a single channel or a multichannel, and in the case of drum outer surface scanning method, the multichannel is preferably used.

<Development Step>

The production method of the planographic printing plate of the present invention includes a development step of performing development using an alkali aqueous solution with a pH of 8.5 to 13.5 (hereinafter, also referred to as a "developer").

The developer used in the development step is an aqueous solution with a pH of 8.5 to 13.5 and more preferably an alkali aqueous solution with a pH of 12 to 13.5. A surfactant contributes to improvement of processability.

As the surfactant used in the developer, any of an anionic surfactant, a nonionic surfactant, a cationic surfactant, and an amphoteric surfactant can be used, and as described above, an anionic surfactant or a nonionic surfactant is preferable.

As the anionic surfactant, the nonionic surfactant, the cationic surfactant, and the amphoteric surfactant used in the developer of the present invention, the surfactants described in paragraphs 0128 to 0131 of JP2013-134341A can be used.

In addition, from the viewpoint of stable solubility or turbidity in water, a surfactant preferably has a HLB value of 6 or greater and more preferably has a HLB value of 8 or greater.

As the surfactant used in the developer, an anionic surfactant or a nonionic surfactant is preferable, and an anionic surfactant containing sulfonic acid or sulfonate or a nonionic surfactant having an aromatic ring and an ethylene oxide chain is particularly preferable.

The surfactant can be used alone or in combination of two or more types thereof.

The content of the surfactant in the developer is preferably 0.01% to 10% by mass, and more preferably 0.01% to 5% by mass.

If as a buffer, carbonate ions and hydrogencarbonate ions are included to maintain the pH of the developer at 8.5 to 13.5, it is possible to suppress variations in pH even in a case where the developer is used for a long period of time, and it is possible to suppress developability deterioration and a development scum occurrence due to the variation in pH. To make carbonate ions and hydrogencarbonate ions present in the developer, carbonate and hydrogencarbonate may be added to the developer, or by adjusting the pH after carbonate or hydrogencarbonate is added, carbonate ions and hydrogencarbonate ions may be generated. Although carbonate and hydrogencarbonate are not particularly limited, an alkali metal salt is preferable. Examples of the alkali metal include lithium, sodium, and potassium, and sodium is particularly preferable. These may be used alone or in combination of two or more types thereof.

The total amount of carbonate and hydrogencarbonate is preferably 0.3% to 20% by mass, more preferably 0.5% to 10% by mass, and particularly preferably 1% to 5% by mass, with respect to the total mass of the developer. If the total amount is 0.3% by mass or greater, developability and processing capability are not reduced, and if the total amount is 20% by mass or less, a precipitate or a crystal is less likely to be produced and at the time of the waste liquid treatment of the developer, gelation when neutralizing is less likely to occur, and thus, trouble does not occur in the waste liquid treatment.

In addition, for the purpose of finely adjusting the alkali concentration or assisting dissolution of the non-image portion photosensitive layer, supplementarily, other alkali agents, for example, organic alkali agents may be used in combination. Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. Other alkali agents are used alone or in combination of two or more types thereof.

In addition to the above materials, the developer may contain a wetting agent, a preservative, a chelate compound, an antifoaming agent, an organic acid, an organic solvent, an inorganic acid, an inorganic salt, or the like. If a water-soluble polymer compound is added, in particular, when the developer was fatigued, the plate surface is likely to be sticky, and thus, a water-soluble polymer compound is preferably not added.

As the wetting agent, the wetting agents described in paragraph 0141 of JP2013-134341A can be suitably used. The wetting agent may be used alone or in combination of two or more types thereof. The wetting agent is preferably used in an amount of 0.1% to 5% by mass with respect to the total mass of the developing agent.

As the preservative, the preservatives described in paragraph 0142 of JP2013-134341A can be suitably used. Two or more preservatives are preferably used in combination such that the preservatives have effect of sterilization of various molds. The addition amount of the preservative is an amount in which the effect is stably exhibited on bacteria, fungi, yeast or the like, and although the addition amount varies depending on the type of bacteria, molds, or yeast, the addition amount is preferably in a range of 0.01% to 4% by mass with respect to the total mass of the developer.

As the chelate compound, the chelate compounds described in paragraph 0143 of JP2013-134341A can be suitably used. As the chelating agent, a chelating agent which is stably present in the developer composition and does not impair the printability is selected. The addition amount is suitably 0.001% to 1.0% by mass with respect to the total mass of the developer.

As the antifoaming agent, the antifoaming agents described in paragraph 0144 of JP2013-134341A can be suitably used. The content of the antifoaming agent is suitably in a range of 0.001% to 1.0% by mass with respect to the total mass of the developer.

As the organic acid, the antifoaming agents described in paragraph 0145 of JP2013-134341A can be suitably used. The content of the organic acid is preferably 0.01% to 0.5% by mass with respect to the total mass of the developer.

Examples of the organic solvent include aliphatic hydrocarbons (hexane, heptane, "Isopar E, H, G" (manufactured by Exxon Chemical Company), gasoline, kerosene, and the like), aromatic hydrocarbons (toluene, xylene, and the like), halogenated hydrocarbons (methylene dichloride, ethylene dichloride, trichlene, monochlorobenzene, and the like), and polar solvents.

Examples of the polar solvent include alcohols (methanol, ethanol, propanol, isopropanol, benzyl alcohol, ethylene glycol monomethyl ether, 2-ethoxyethanol, and the like), ketones (methyl ethyl ketone, cyclohexanone, and the like), esters (ethyl acetate, methyl lactate, propylene glycol monomethyl ether acetate, and the like), others (triethyl phosphate, tricresyl phosphate, N-phenylethanolamine, N-phenyldiethanolamine, and the like).

In addition, in a case where the organic solvent is insoluble in water, it is also possible to use by solubilizing the organic solvent in water using a surfactant or the like. In a case where the developer contains an organic solvent, from the viewpoint of safety and inflammability, the concentration of the solvent is preferably less than 40% by mass.

Examples of the inorganic acid and the inorganic salt include phosphoric acid, metaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, and nickel sulfate. The content of the inorganic salt is preferably 0.01% to 0.5% by mass with respect to the total mass of the developer.

Although the temperature of development is not particularly limited as long as, at the temperature, developing is possible, the temperature is preferably at 60° C. or lower, and more preferably 15° C. to 40° C. In the development treatment using an automatic developing device, the developer becomes fatigued according to the treatment amount, and thus, the processing capability may be restored using a replenisher or a fresh developer. As one example of the development or the treatment after the development, a method of performing alkali development, removing the alkali in a post-water washing step, performing a gum treatment in a gumming step, and drying in a drying step can be exemplified. In addition, as another example, a method of performing pre-water washing, developing, and gumming at the same time by using an aqueous solution containing carbonate ions, hydrogencarbonate ions, and a surfactant can be preferably exemplified. Thus, particularly, the pre-water washing step may not be performed, and only by using one solution, pre-water washing, developing, and gumming are performed in one bath, and then, a drying step may be preferably performed. After developing, drying is preferably performed after the excess developer is removed using a squeeze roller or the like.

The development step can be suitably performed by an automatic processing machine equipped with a rubbing member. Examples of the automatic processing machine include an automatic processing machine which performs a rubbing treatment while transporting the planographic printing plate precursor after image exposure, described in JP1990-220061A (JP-H02-220061A) and JP1985-59351A (JP-S60-59351A), and an automatic processing machine which performs a rubbing treatment on the planographic printing plate precursor after image exposure, set on a cylinder while rotating the cylinder, described in U.S. Pat. Nos. 5,148,746A, 5,568,768A, and GB2297719B. Among these, as the rubbing member, an automatic processing machine using a rotating brush roll is particularly preferable.

The rotating brush roll used in the present invention can be suitably selected in consideration of the difficulty in flawing of the image portion and the stiffness of the support of the planographic printing plate precursor. As the rotating brush roll, a known rotating brush roll formed by implanting a brush material into a plastic or metal roll can be used. For example, the brush rolls described in JP1983-159533A (JP-S58-159533A) or JP1991-100554A (JP-H03-100554A) or a brush roll formed by closely and radially wrapping a metal or plastic grooved material into which a brush material has been implanted in a row on a plastic or metal roll which becomes a core, as described in JP1987-167253Y (JP-S62-167253Y), can be used.

As the brush material, plastic fibers (for example, polyester-based synthetic fibers such as polyethylene terephthalate and polybutylene terephthalate, polyamide-based synthetic fibers such as nylon 6.6 and nylon 6.10, polyacryl-based synthetic fibers such as polyacrylonitrile and polyalkyl (meth)acrylate, and polyolefin-based synthetic fibers such as polypropylene and polystyrene) can be used, and for example, a plastic fiber having a diameter of a fiber hair of 20 to 400 μm and a length of a hair of 5 to 30 mm can be suitably used.

The outer diameter of the rotating brush roll is preferably 30 to 200 mm, and the circumferential speed of the front end of the brush rubbing the plate surface is preferably 0.1 to 5 m/sec. A plurality of the rotating brush rolls is preferably used.

Although the rotation direction of the rotating brush roll may be the same direction or may be the reverse direction, with respect to the transporting direction of the planographic printing plate precursor, in a case where two or more rotating brush rolls are used, it is preferable that at least one rotating brush roll rotates in the same direction and at least one rotating brush roll rotates in the reverse direction. Thus, removal of the photosensitive layer of the non-image portion becomes more reliable. Furthermore, it is also effective to swing the rotating brush roller in the rotation axis direction of the brush roll.

After the development step, a continuous or discontinuous drying step is preferably performed. Drying is performed by hot air, infrared rays, or far infrared rays.

As the automatic processing machine suitably used in the production method of the planographic printing plate of the present invention, an apparatus having a developing portion and a drying portion, and developing, and gumming are performed on the planographic printing plate precursor in developer tank, and then, the planographic printing plate precursor is dried in the drying portion, whereby a planographic printing plate is obtained.

In addition, for the purpose of improving printing durability or the like, it is also possible to heat the printing plate after developing in very strong conditions. The heating temperature is preferably in a range of 200° C. to 500° C. If the temperature is low, sufficient image strengthening effects are not obtained, and in a case where the temperature is too high, there is a possibility that problems such as deterioration of the support or thermal decomposition of the image portion occur.

The planographic printing plate obtained in this manner is mounted on an offset printing machine, and can be suitably used in printing a large number of sheets.

(Polymer Compound)

The polymer compound of the present invention has a polycyclic structure and a sulfonamide group in the main chain.

The polymer compound of the present invention has the same definition as that for the specific polymer compound in the photosensitive resin composition of the present invention which has been described above and the preferred embodiments thereof are the same as the preferred embodiments of the specific polymer compound.

EXAMPLES

Hereinafter, the present invention will be described in detail using examples, but the present invention is not limited thereto. Moreover, "part" and "%" in the following examples respectively represent "part(s) by mass" and "% by mass" unless otherwise specified.

Synthesis Example

<Synthesis of Sulfonamide-Containing Diamine (SA-1)>

139.82 g of chlorosulfonic acid was weighed in a three-neck flask provided with a condenser and a stirrer, 29.43 g of xanthone (manufactured by Tokyo Chemical Industry Co., Ltd.) was added thereto at room temperature, and the resulting solution was stirred at room temperature for 1 hour. The temperature of the reaction solution was raised to 80° C., and the reaction solution was stirred for 8 hours. This reaction solution was cooled to room temperature while being stirred, and crystallized in 2 L of ice-cold water, followed by stirring for 10 minutes. This was collected by filtration, and the collected product was dissolved in 3 L of ethyl acetate. This ethyl acetate solution was transferred to a separating funnel, washing with pure water and liquid-liquid separation was performed two times, and washing with saturated saline and liquid-liquid separation was performed. After the organic layer was transferred to an Erlenmeyer flask, 30 g of magnesium sulfate was added thereto, followed by stirring, the solid content was removed by filtration, the ethyl acetate was distilled off using an evaporator, and the resulting product was vacuum-dried at 40° C. for 24 hours, whereby 28 g of a precursor S-1 (disulfonic chloride) which was a target substance was obtained. It was confirmed from the NMR (nuclear magnetic resonance) spectrum that the obtained product was the precursor (S-1). The precursor S-1 was analyzed using $^1$NMR. The result thereof is shown below.

$^1$NMR data (deuterated dimethyl sulfoxide (deuterated DMSO), 400 MHz, internal standard: tetramethylsilane)

δ (ppm)=7.62-7.65 (d, 2H), 8.02-8.05 (d, 2H), 8.40 (s, 2H)

32.44 g of 1,4-phenylenediamine (manufactured by Tokyo Chemical Industry Co., Ltd.) and 170 g of tetrahydrofuran were weighed in a three-neck flask provided with a condenser and a stirrer, and the resulting mixture was stirred while being cooled to 0° C. to 5° C. After 19.66 g of the precursor (S-1) obtained in the above-described manner was dissolved in 170 g of tetrahydrofuran, the solution was transferred to a dropping funnel, added dropwise to the three-neck flask for 1 hour during stirring, and stirred for 1 hour. After the temperature of the reaction solution was returned to room temperature and the reaction solution was stirred for 2 hours, 205.0 g of a 1 mol/L sodium hydroxide aqueous solution was added to the reaction solution and then 150 g of pure water was added thereto and dissolved therein. The reaction solution was transferred to a separating funnel and washed with 300 mL of ethyl acetate three times, and then the water layer was recovered. Next, an aqueous solution obtained by dissolving 11.10 g of ammonium chloride (manufactured by Kanto Chemical Co., Inc.) in 500 mL of pure water was stirred, the water layer was added dropwise using a dropping funnel, and crystals were filtered. The filtrate was washed with 500 mL of pure water, washed with 500 mL of hexane, and filtered, thereby obtaining crystals. The crystals were vacuum-dried at 40° C. for 24 hours, whereby 20.1 g of a target substance (SA-1) was obtained. It was confirmed from the NMR spectrum that the obtained product was the target substance.

The target substance (SA-1) was analyzed using $^1$NMR. The result thereof is shown below.

$^1$NMR data (deuterated DMSO, 400 MHz, internal standard: tetramethylsilane)

δ (ppm)=4.63 (s, 4H), 6.36-6.38 (d, 4H), 6.67-6.69 (d, 4H), 7.81-7.83 (d, 2H), 7.99-8.01 (d, 2H), 8.43 (s, 2H), 9.66 (s, 2H)

In the same manner as described above, SA-2 to SA-17 can be synthesized.

<Synthesis of Sulfonamide-Containing Diamine (SA-18)>

36.06 g of ethylenediamine (manufactured by Tokyo Chemical Industry Co., Ltd.) and 40 g of tetrahydrofuran were weighed in a three-neck flask provided with a condenser and a stirrer, and the resulting mixture was stirred while being cooled to 0° C. to 5° C. 11.79 g of the precursor (S-1) obtained in the above-described manner was dissolved in 66 g of tetrahydrofuran, the solution was transferred to a dropping funnel, added dropwise to the three-neck flask for 1 hour during stirring, and stirred for 1 hour after the dropwise addition. When the temperature of the reaction solution was returned to room temperature and the reaction solution was stirred for 2 hours, since the solid component and the liquid component were separated from each other, the liquid component was decanted. Next, the solid component in the flask was dissolved in 150 g of N,N-dimethylacetamide (manufactured by Kanto Chemical Co., Ltd.) and 20 g of pure water and crystallized in 2 L of an aqueous solution in which 20 g of sodium hydrogen carbonate was dissolved, and then the resultant was filtered. The filtrate was washed with 500 mL of pure water, washed with 500 mL of tetrahydrofuran, and filtered, thereby obtaining crystals. The crystals were vacuum-dried at 60° C. for 24 hours, whereby 10.1 g of a target substance (SA-18) was obtained. It was confirmed from the NMR spectrum that the obtained product was the target substance.

The target substance (SA-18) was analyzed using $^1$NMR. The result thereof is shown below.

$^1$NMR data (deuterated DMSO, 400 MHz, internal standard: tetramethylsilane)

δ (ppm)=2.52-2.55 (t, 4H), 2.75-2.79 (t, 4H), 7.93-7.95 (d, 2H), 8.22-8.25 (d, 2H), 8.57 (s, 2H)

In the same manner as described above, SA-19 and SA-20 can be synthesized.

<Synthesis of Sulfonamide-Containing Diol (SB-5)>

54.07 g of 2-aminoethanol (manufactured by Tokyo Chemical Industry Co., Ltd.) and 30.0 g of tetrahydrofuran were weighed in a three-neck flask provided with a condenser and a stirrer, and the resulting mixture was stirred while being cooled to 0° C. to 5° C. 21.07 g of 4,4'-biphenyl disulfonyl chloride (manufactured by Tokyo Chemical Industry Co., Ltd.) was dissolved in 170 g of tetrahydrofuran, the solution was transferred to a dropping funnel, added dropwise to the three-neck flask for 1 hour during stirring, and stirred for 1 hour. After the temperature of the reaction solution was returned to room temperature and the reaction solution was stirred for 2 hours, the solution was crystallized in 1 L of a 1 mol/L hydrochloric acid aqueous solution, and the crystallized result was filtered, transferred to a beaker, stirred with 1 L of pure water, washed, and then filtered. Next, the crystals were transferred to a beaker, stirred with 500 mL of acetonitrile and washed, thereby obtaining crystals. The crystals were vacuum-dried at 40° C. for 24 hours, whereby 20.5 g of a target substance (SB-5) was obtained. It was confirmed from the NMR spectrum that the obtained product was the target substance.

The target substance (SB-5) was analyzed using $^1$NMR. The result thereof is shown below.

$^1$NMR data (deuterated DMSO, 400 MHz, internal standard: tetramethylsilane)

δ (ppm)=2.81-2.86 (q, 4H), 3.37-3.42 (q, 4H), 4.69-4.72 (t, 2H), 7.70-7.73 (t, 2H), 7.90-7.92 (d, 4H), 7.96-7.98 (d, 2H)

In the same manner as described above, SB-1 to SB-4 and SB-6 to SB-19 can be synthesized.

<Polyurea Having Xanthone Structure and Sulfonamide Group in Main Chain>

[Synthesis of PU-1]

42.93 g of SA-1, 0.027 g of aniline (manufactured by Wako Pure Chemical Industries, Ltd.), and 169.16 g of N,N-dimethylacetamide (manufactured by Kanto Chemical Co., Inc.) were weighed in a three-neck flask provided with a condenser and a stirrer, and the temperature of the reaction solution was set to room temperature to obtain a uniform solution. Next, 13.45 g of hexamethylene diisocyanate (manufactured by Tokyo Chemical Industry Co., Ltd.) was added dropwise using a dropping funnel at room temperature for 15 minutes, the resulting solution was stirred at room temperature for 30 minutes for a reaction, and the reaction solution was heated to 60° C. and stirred for 3 hours. Subsequently, 1.00 g of aniline (manufactured by Wako Pure Chemical Industries, Ltd.) and 50 mL of methanol were added to the reaction solution, and the resulting solution was reacted at 60° C. for 1 hour and then cooled to room temperature.

The reaction solution was poured into a mixed solution of 2 L of pure water and 2 L of methanol, and as a result, a polymer was precipitated. The resultant was collected by filtration, washed, and dried, whereby 51.9 g of a binder polymer (PU-1) having a weight-average molecular weight of 56,000 was obtained.

It was confirmed from the NMR spectrum, the IR spectrum, and GPC (polystyrene conversion) that the obtained product was the target substance. In the same manner as described above, PU-2 to PU-43 can be synthesized.

Further, the structure of PU-1 is shown below.

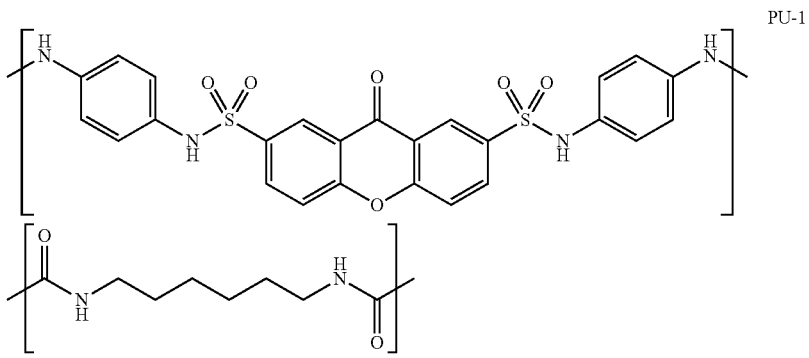

PU-1

[Synthesis of PU-44]

35.24 g of SA-18, 0.078 g of n-butylamine (manufactured by Wako Pure Chemical Industries, Ltd.), and 200.0 g of N,N-dimethylacetamide (manufactured by Kanto Chemical Co., Inc.) were weighed in a three-neck flask provided with a condenser and a stirrer, and the temperature of the reaction solution was set to room temperature to obtain a uniform solution. Next, 15.54 g of 1,3-bis(isocyanatomethyl)cyclohexane (manufactured by Tokyo Chemical Industry Co., Ltd.) and 80.0 g of N,N-dimethylacetamide (manufactured by Kanto Chemical Co., Inc.) were weighed and added dropwise using a dropping funnel at room temperature for 30 minutes, and the resulting solution was stirred at room temperature for 30 minutes for a reaction. Subsequently, 1.00 g of n-butylamine (manufactured by Wako Pure Chemical Industries, Ltd.) and 50 mL of methanol were added to the reaction solution, and the resulting solution was reacted at room temperature for 30 minutes.

The reaction solution was poured into a mixed solution of 2 L of pure water and 2 L of methanol, and as a result, a polymer was precipitated. The resultant was collected by filtration, washed, and dried, whereby 46.7 g of a binder polymer (PU-44) having a weight-average molecular weight of 53,000 was obtained.

It was confirmed from the NMR spectrum, the IR spectrum, and GPC (polystyrene conversion) that the obtained product was the target substance. In the same manner as described above, PU-45 to PU-55 can be synthesized.

Further, the structure of PU-44 is shown below.

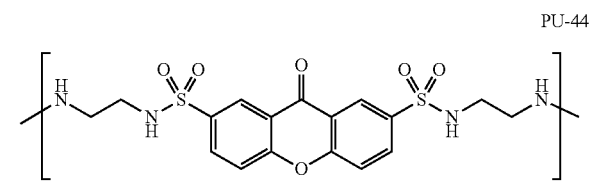

PU-44

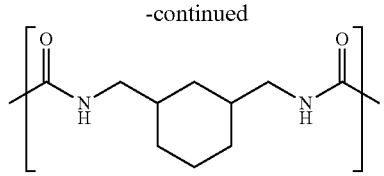

[Synthesis of PU-53]

PU-53 was synthesized using the same method as that for PU-44. The details are described below.

31.72 g of SA-18, 1.76 g of diethylene glycol bis(3-aminopropyl)ether (manufactured by Tokyo Chemical Industry Co., Ltd.), 0.078 g of n-butylamine (manufactured by Wako Pure Chemical Industries, Ltd.), and 200.0 g of N,N-dimethylacetamide (manufactured by Kanto Chemical Co., Inc.) were weighed in a three-neck flask provided with a condenser and a stirrer, and the temperature of the reaction solution was set to room temperature to obtain a uniform solution. Next, 15.54 g of 1,3-bis(isocyanatomethyl)cyclohexane (manufactured by Tokyo Chemical Industry Co., Ltd.) and 78.0 g of N,N-dimethylacetamide (manufactured by Kanto Chemical Co., Inc.) were weighed and added dropwise using a dropping funnel at room temperature for 30 minutes, and the resulting solution was stirred at room temperature for 30 minutes for a reaction. Subsequently, 1.00 g of n-butylamine (manufactured by Wako Pure Chemical Industries, Ltd.) and 50 mL of methanol were added to the reaction solution, and the resulting solution was reacted at room temperature for 30 minutes.

The reaction solution was poured into a mixed solution of 2 L of pure water and 2 L of methanol, and as a result, a polymer was precipitated. The resultant was collected by filtration, washed, and dried, whereby 45.8 g of a binder polymer (PU-53) having a weight-average molecular weight of 51,000 was obtained.

It was confirmed from the NMR spectrum, the IR spectrum, and GPC (polystyrene conversion) that the obtained product was the target substance.

Further, the structure of PU-53 is shown below.

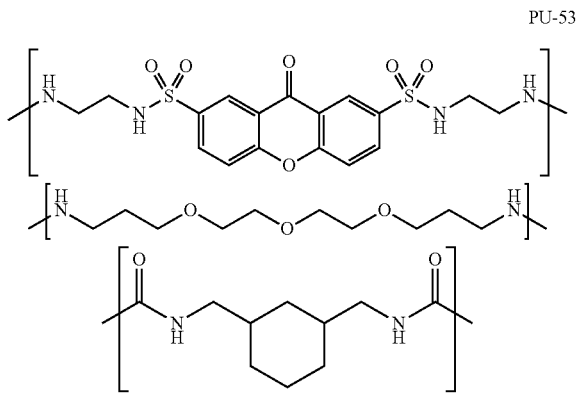

<Polyurethane Having Xanthone Structure and Sulfonamide Group in Main Chain>

[Synthesis of PT-2]

44.25 g of SB-1 and 149.50 g of N,N-dimethylacetamide (manufactured by Kanto Chemical Co., Inc.) were weighed in a three-neck flask provided with a condenser and a stirrer, and the temperature of the reaction solution was set to room temperature to obtain a uniform solution. Next, 20.98 g of 1,3-bis(isocyanatomethyl)cyclohexane (manufactured by Tokyo Chemical Industry Co., Ltd.) and 0.1 g of NEOSTANN U-600 (manufactured by NITTO KASEI CO., LTD.: bismuth catalyst) were added at room temperature, the resulting solution was stirred at room temperature for 30 minutes for a reaction, and the reaction solution was heated to 70° C. and stirred for 10 hours. 100.87 g of N,N-dimethylacetamide (manufactured by Kanto Chemical Co., Inc.) and 50 mL of methanol (manufactured by Wako Pure Chemical Industries, Ltd.) were added to the reaction solution, and the resulting solution was reacted at 70° C. for 2 hours and then cooled to room temperature.

The reaction solution was poured into a mixed solution of 2 L of pure water and 2 L of methanol, and as a result, a polymer was precipitated. The resultant was collected by filtration, washed, and dried, whereby 61.5 g of a binder polymer (PT-2) having a weight-average molecular weight of 52,000 was obtained.

It was confirmed from the NMR spectrum, the IR spectrum, and GPC (polystyrene conversion) that the obtained product was the target substance. In the same manner as described above, PT-1 and PT-3 to PT-66 can be synthesized.

Further, the structure of PT-2 is shown below.

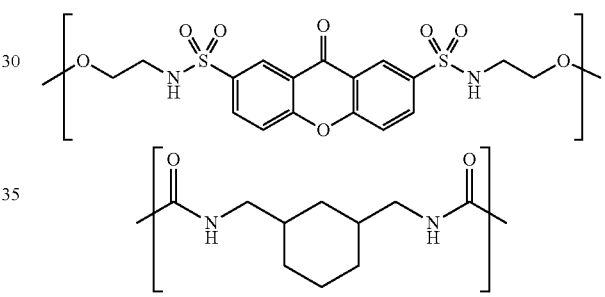

<Polyamide Imide Having Biphenyl Structure and Sulfonamide Group in Main Chain>

[Synthesis of PA-5]

34.62 g of SA-5, 7.79 g of triethylamine (manufactured by Kanto Chemical Co., Inc.), and 140.00 g of N,N-dimethylacetamide (manufactured by Kanto Chemical Co., Inc.) were weighed in a three-neck flask provided with a condenser and a stirrer, and the reaction solution was ice-cooled so that the temperature thereof was adjusted to be in a range of 0° C. to 5° C. Next, 14.74 g of trimellitic anhydride chloride (manufactured by Tokyo Chemical Industry Co., Ltd.) was added to the reaction solution during the ice-cooling, the reaction solution was stirred at room temperature for 30 minutes for a reaction, the temperature of the reaction solution was adjusted to room temperature, and then the reaction solution was stirred for 3 hours. Subsequently, 139.70 g of N,N-dimethylacetamide (manufactured by Kanto Chemical Co., Inc.), 22.10 g of pyridine (manufactured by Kanto Chemical Co., Inc.), and 7.86 g of acetic anhydride (manufactured by Kanto Chemical Co., Inc.) were added to the reaction solution, the resulting solution was reacted at 80° C. for 3 hours and then cooled to room temperature, and then 20 mL of a 36% hydrochloric acid aqueous solution was added thereto.

The reaction solution was poured into a mixed solution of 2 L of pure water and 2 L of methanol, and as a result, a polymer was precipitated. The resultant was collected by filtration, washed, and dried, whereby 35.20 g of a binder polymer (PA-5) having a weight-average molecular weight of 52,000 was obtained.

It was confirmed from the NMR spectrum, the IR spectrum, and GPC (polystyrene conversion) that the obtained product was the target substance. In the same manner as described above, PA-1 to PA-4 and PA-6 to PA-32 can be synthesized.

PA-5

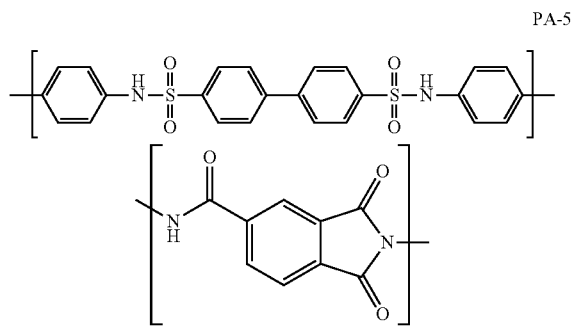

<Polycarbonate Having Xanthone Structure and Sulfonamide Group in Main Chain>

[Synthesis of PK-2]

40 parts by mass of a mixture of each monomer diol in total, 60 parts by mass of diethyl carbonate, and 60 parts by mass of a 20% sodium ethoxide ethanol solution were mixed with each other in a nitrogen-substituted three-neck flask provided with a stirrer and a reflux tube, and heated to 120° C. Thereafter, the pressure in the reactor was reduced by approximately 30 kPa and the mixture was stirred for 1 hour. Next, the mixture was further stirred in a vacuum at 0.1 kPa for 3 hours. The mixture was cooled to room temperature and the reactant was added dropwise to 500 parts by mass of pure water during stirring. The obtained white powder was collected by filtration and dried by blowing air, whereby a binder polymer PK-2 having a weight-average molecular weight of 42,000 was obtained. It was confirmed from the NMR spectrum, the IR spectrum, and GPC (polystyrene conversion) that the obtained product was the target substance. In the same manner as described above, PK-1 and PK-3 to PK-13 can be synthesized.

In the examples, "weight-average molecular weight" is calculated by a standard polystyrene conversion method using gel permeation chromatography (GPC). Here, as the GPC column, a column filled with polystyrene crosslinked gel (TSKgel SuperAWM-H; manufactured by Tosoh Corporation) was used, and as the GPC solvent, N-methylpyrrolidone (0.01 mol/L of each of phosphoric acid and lithium bromide) was used.

Examples 1 to 26 and Comparative Examples 1 to 3

<Production of Support>

An aluminum alloy plate having a thickness of 0.3 mm of a material 1S was subjected to the treatment shown in the following Table 10 from among the following (A) to (F), whereby and a support for a planographic printing plate was manufactured. Moreover, during all treatment steps, a washing treatment with water was performed, and after the washing treatment with water, liquid cutting was performed using a nip roller.

[Treatment A]

(A-a) Mechanical Roughening Treatment (Brush Grain Method)

While supplying a suspension of pumice (specific gravity of 1.1 g/cm$^3$) to the surface of an aluminum plate as a polishing slurry liquid, a mechanical roughening treatment was performed using rotating bundle bristle brushes.

The median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having 300 mm. The distance between two support rollers (φ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(A-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m$^2$.

(A-c) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The liquid temperature was 35° C. The desmutting treatment was performed for 3 seconds by spraying the desmutting liquid using a spray.

(A-d) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 185 C/dm$^2$ as the sum total of electric quantity at the time of anodization of the aluminum plate. Thereafter, washing with water by spraying was performed.

(A-e) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 g/m$^2$.

(A-f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The liquid temperature was 30° C. The desmutting treatment was performed for 3 seconds by spraying the desmutting liquid using a spray.

(A-g) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1, the electrochemical surface-roughening treatment was performed using a carbon electrode as a counter electrode. As an auxiliary anode, ferrite was used.

The current density was 25 $A/dm^2$ as the peak current value, and the electric quantity ($C/dm^2$) in the hydrochloric acid electrolysis was 63 $C/dm^2$ as the sum total of electric quantity at the time of anodization of the aluminum plate. Thereafter, washing with water by spraying was performed.

(A-h) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 $g/m^2$.

(A-i) Desmutting Treatment in Acidic Aqueous Solution

Next, a desmutting treatment was performed in a sulfuric acid aqueous solution. Specifically, the desmutting treatment was performed at a liquid temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(A-j) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(A-k) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 $mg/m^2$. Thereafter, washing with water by spraying was performed.

[Treatment B]

(B-a) Mechanical Roughening Treatment (Brush Grain Method)

While supplying a suspension of pumice (specific gravity of 1.1 $g/cm^3$) to the surface of an aluminum plate as a polishing slurry liquid, a mechanical roughening treatment was performed using rotating bundle bristle brushes.

The median diameter ($\mu m$) of a polishing material was 30 $\mu m$, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having 300 mm. The distance between two support rollers (200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(B-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 $g/m^2$.

(B-c) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The liquid temperature was 35° C. The desmutting treatment was performed for 3 seconds by spraying the desmutting liquid using a spray.

(B-d) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 $A/dm^2$ as the peak current value, and 5% of the current from the power source was separately flowed to the auxiliary anode. The electric quantity ($C/dm^2$) was 185 $C/dm^2$ as the sum total of electric quantity at the time of anodization of the aluminum plate. Thereafter, washing with water by spraying was performed.

(B-e) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 $g/m^2$.

(B-f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The liquid temperature was 30° C. The desmutting treatment was performed for 3 seconds by spraying the desmutting liquid using a spray.

(B-g) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1, the electrochemical surface-roughening treatment was performed using a carbon electrode as a counter electrode. As an auxiliary anode, ferrite was used.

The current density was 25 A/dm$^2$ as the peak current value, and the electric quantity (C/dm$^2$) in the hydrochloric acid electrolysis was 63 C/dm$^2$ as the sum total of electric quantity at the time of anodization of the aluminum plate. Thereafter, washing with water by spraying was performed.

(B-h) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(B-i) Desmutting Treatment in Acidic Aqueous Solution

Next, a desmutting treatment was performed in a sulfuric acid aqueous solution. Specifically, the desmutting treatment was performed at a liquid temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(B-j) First Stage of Anodization Treatment

A first stage of the anodization treatment was performed using an anodization apparatus by DC electrolysis. The anodization treatment was performed using a solution obtained by dissolving aluminum ions of 7 g/L in a sulfuric acid aqueous solution of 170 g/L as an electrolytic bath under the conditions of a liquid temperature of 43° C. and a current density of 30 A/dm$^2$. The depth of the micropores was 27 μm, and the obtained coating amount was 0.13 g/m$^2$.

(B-k) Pore-Widening Treatment

A pore-widening treatment was performed by immersing the aluminum plate subjected to the anodization treatment in a caustic soda aqueous solution in which the concentration of caustic soda was 5% by mass and the concentration of aluminum ions was 0.5% by mass at a temperature of 35° C. for 1 second. Thereafter, washing with water by spraying was performed.

(B-l) Second Stage of Anodization Treatment

A second stage of the anodization treatment was performed using anodization apparatus by DC electrolysis. The anodization treatment was performed using a solution obtained by dissolving aluminum ions of 7 g/L in a sulfuric acid aqueous solution of 170 g/L as an electrolytic bath under the conditions of a liquid temperature of 55° C. and a current density of 20 A/dm$^2$. The obtained coating amount was 2.6 g/m$^2$.

(B-m) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment (C)]

(C-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 1.0 g/m$^2$.

(C-b) Desmutting Treatment in Acidic Aqueous Solution (First Desmutting Treatment)

Next, a desmutting treatment was performed in an acidic aqueous solution. As the acidic aqueous solution used in the desmutting treatment, a sulfuric acid aqueous solution having a concentration of 150 g/L was used. The liquid temperature was 30° C. The desmutting treatment was performed for 3 seconds by spraying the desmutting liquid using a spray. Thereafter, a washing treatment with water was performed.

(C-c) Electrochemical Roughening Treatment in Hydrochloric Acid Aqueous Solution Next, an electrolytic surface-roughening treatment was performed using an electrolyte in which the concentration of hydrochloric acid was 14 g/L, the concentration of aluminum ions was 13 g/L, and the concentration of sulfuric acid was 3 g/L using an AC current. The liquid temperature of the electrolyte was 30° C. The concentration of aluminum ions was adjusted by adding aluminum chloride.

The waveform of AC was a sine wave in which the positive waveform and the negative waveform were symmetrical, the frequency was 50 Hz, the anode reaction time and the cathode reaction time at one period of AC was 1:1, and the current density was 75 A/dm$^2$ at the peak current value of AC waveform. In addition, the electric quantity was 450 C/dm$^2$ as the sum total of electric quantity which the aluminum plate taken in the anode reaction, and the electrolytic treatment was performed four times with an interval of 4 seconds by 125 C/dm$^2$. As the counter electrode of the aluminum plate, a carbon electrode was used. Thereafter, a washing treatment with water was performed.

(C-d) Alkali Etching Treatment

The aluminum plate after the electrochemical roughening treatment was subjected to an etching treatment by spraying a caustic soda aqueous solution in which the concentration of caustic soda was 5% by mass and the concentration of aluminum ions was 0.5% by mass using a spray tube at a temperature of 35° C. The amount of aluminum dissolved on the surface subjected to the electrochemical roughening treatment was 0.1 g/m$^2$. Thereafter, a washing treatment with water was performed.

(C-e) Desmutting Treatment in Acidic Aqueous Solution

Next, a desmutting treatment was performed in an acidic aqueous solution. As the acidic aqueous solution used in the desmutting treatment, the waste liquid (aluminum ions of 5.0 g/L were dissolved in a sulfuric acid aqueous solution of 170 g/L) generated in the anodization treatment step was used. The liquid temperature was 30° C. The desmutting treatment was performed for 3 seconds by spraying the desmutting liquid using a spray.

(C-f) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(C-g) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment (D)]

(D-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 5 g/m$^2$.

(D-b) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The liquid temperature was 35° C. The desmutting treatment was performed for 3 seconds by spraying the desmutting liquid using a spray.

(D-c) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 250 C/dm$^2$ as the sum total of electric quantity at the time of anodization of the aluminum plate. Thereafter, washing with water by spraying was performed.

(D-d) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.2 g/m$^2$.

(D-e) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The liquid temperature was 30° C. The desmutting treatment was performed for 3 seconds by spraying the desmutting liquid using a spray.

(D-f) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 25 A/dm$^2$ as the peak current value, and the electric quantity (C/dm$^2$) in the hydrochloric acid electrolysis was 63 C/dm$^2$ as the sum total of electric quantity at the time of anodization of the aluminum plate. Thereafter, washing with water by spraying was performed.

(D-g) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(D-h) Desmutting Treatment in Acidic Aqueous Solution

Next, a desmutting treatment was performed in a sulfuric acid aqueous solution. Specifically, the desmutting treatment was performed at a liquid temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(D-i) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(D-j) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m². Thereafter, washing with water by spraying was performed.

[Treatment (E)]

(E-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 5 g/m².

(E-b) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The liquid temperature was 35° C. The desmutting treatment was performed for 3 seconds by spraying the desmutting liquid using a spray.

(E-c) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm² as the peak current value, and 5% of the current from the power source was separately flowed to the auxiliary anode. The electric quantity (C/dm²) was 250 C/dm² as the sum total of electric quantity at the time of anodization of the aluminum plate. Thereafter, washing with water by spraying was performed.

(E-d) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.2 g/m².

(E-e) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The liquid temperature was 30° C. The desmutting treatment was performed for 3 seconds by spraying the desmutting liquid using a spray.

(E-f) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 25 A/dm² as the peak current value, and the electric quantity (C/dm²) in the hydrochloric acid electrolysis was 63 C/dm² as the sum total of electric quantity at the time of anodization of the aluminum plate. Thereafter, washing with water by spraying was performed.

(E-g) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m².

(E-h) Desmutting Treatment in Acidic Aqueous Solution

Next, a desmutting treatment was performed in a sulfuric acid aqueous solution. Specifically, the desmutting treatment was performed at a liquid temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(E-i) First Stage of Anodization Treatment

A first stage of the anodization treatment was performed using an anodization apparatus by DC electrolysis.

The anodization treatment was performed using a solution obtained by dissolving aluminum ions of 7 g/L in a sulfuric acid aqueous solution of 170 g/L as an electrolytic bath under the conditions of a liquid temperature of 43° C. and a current density of 30 A/dm². The depth of the micropores was 27 μm, and the obtained coating amount was 0.13 g/m².

(E-j) Pore-Widening Treatment

A pore-widening treatment was performed by immersing the aluminum plate subjected to the anodization treatment in a caustic soda aqueous solution in which the concentration of caustic soda was 5% by mass and the concentration of aluminum ions was 0.5% by mass at a temperature of 35° C. for 1 second. Thereafter, washing with water by spraying was performed.

(E-k) Second Stage of Anodization Treatment

A second stage of the anodization treatment was performed using an anodization apparatus by DC electrolysis. The anodization treatment was performed using a solution obtained by dissolving aluminum ions of 7 g/L in a sulfuric acid aqueous solution of 170 g/L as an electrolytic bath under the conditions of a liquid temperature of 40° C. and a current density of 20 A/dm². The obtained coating amount was 2.6 g/m².

(E-l) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m². Thereafter, washing with water by spraying was performed.

[Treatment (F)]

(F-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 5 g/m².

(F-b) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The liquid temperature was 35° C. The desmutting treatment was performed for 3 seconds by spraying the desmutting liquid using a spray.

(F-c) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm² as the peak current value, and 5% of the current from the power source was separately flowed to the auxiliary anode. The electric quantity (C/dm²) was 250 C/dm² as the sum total of electric quantity at the time of anodization of the aluminum plate. Thereafter, washing with water by spraying was performed.

(F-d) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.2 g/m².

(F-e) Desmutting Treatment in Acidic Aqueous Solution

Next, the desmutting treatment was performed at a liquid temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed in a sulfuric acid aqueous solution. The desmutting treatment was performed for 3 seconds by spraying the desmutting liquid using a spray.

(F-f) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(F-g) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m². Thereafter, washing with water by spraying was performed.

[Treatment (G)]

(G-a) Mechanical Roughening Treatment (Brush Grain Method)

While supplying a suspension of pumice (specific gravity of 1.1 g/cm³) to the surface of an aluminum plate as a polishing slurry liquid, a mechanical roughening treatment was performed using rotating bundle bristle brushes.

In the mechanical roughening treatment, the median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having 4300 mm. The distance between two support rollers (4200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(G-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m².

(G-c) Desmutting Treatment in Acidic Aqueous Solution

Next, a desmutting treatment was performed in an acidic aqueous solution. As the acidic aqueous solution used in the desmutting treatment, the waste liquid (aluminum ions of 5.0 g/L were dissolved in a sulfuric acid aqueous solution of 170 g/L) generated in the anodization treatment step was used. The liquid temperature was 30° C. The desmutting treatment was performed for 3 seconds by spraying the desmutting liquid using a spray.

(G-d) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(G-e) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m². Thereafter, washing with water by spraying was performed.

[Treatment (H)]

(H-a) Mechanical Roughening Treatment (Brush Grain Method)

While supplying a suspension of pumice (specific gravity of 1.1 g/cm³) to the surface of an aluminum plate as a polishing slurry liquid, a mechanical roughening treatment was performed using rotating bundle bristle brushes.

In the mechanical roughening treatment, the median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having 4300 mm. The distance between two support rollers (4200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(H-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 g/m².

(H-c) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The liquid temperature was 35° C. The desmutting treatment was performed for 3 seconds by spraying the desmutting liquid using a spray.

(H-d) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm² as the peak current value, and 5% of the current from the power source was separately flowed to the auxiliary anode. The electric quantity (C/dm²) was 185 C/dm² as the sum total of electric quantity at the time of anodization of the aluminum plate. Thereafter, washing with water by spraying was performed.

(H-e) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 g/m².

(H-f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The liquid temperature was 30° C. The desmutting treatment was performed for 3 seconds by spraying the desmutting liquid using a spray.

(H-g) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(H-h) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m². Thereafter, washing with water by spraying was performed.

<Formation of Undercoat Layer>

An undercoat layer coating solution 1 shown below was applied to each of the supports A to F produced in the above manner, followed by drying at 80° C. for 15 seconds, whereby supports A-1 to F-1 provided with an undercoat layer were obtained. The coating amount after drying was 15 mg/m².

(Undercoat Layer Coating Solution 1)

Following copolymer having a weight-average molecular weight of 28,000:0.3 parts Methanol: 100 parts Water: 1 part

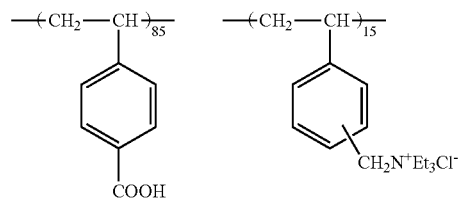

<Formation of Image Recording Layer>

After a coating solution composition (I) for forming a lower layer having the following compositional ratio was applied to the obtained supports A-1 to F-1 using a wire bar, the resulting product was dried in a drying oven at 150° C. for 40 seconds such that the coating amount became 1.0 g/m², whereby a lower layer was provided. After the lower layer was provided, a coating solution composition (II) for forming an upper layer having the following compositional ratio was applied using a wire bar, whereby an upper layer was provided. After application, the resulting product was dried at 150° C. for 40 seconds, whereby a planographic printing plate precursor in which the amount of the lower layer and the upper layer coated was 1.2 g/m² was obtained.

(Coating Solution Composition (I) for Forming Lower Layer)

Specific polymer compound described in Table 10: 3.5 parts m,p-Cresol novolac (m/p ratio=6/4, weight-average molecular weight of 6,000): 0.6 parts Infrared absorbent (IR coloring agent (1): following structure): 0.2 parts
4,4'-Bishydroxyphenyl sulfone: 0.3 parts
Tetrahydrophthalic acid: 0.4 parts
p-Toluenesulfonic acid: 0.02 parts
3-Methoxy-4-diazodiphenylamine hexafluorophosphate: 0.06 parts
Product obtained by replacing a counter ion of ethyl violet with 6-hydroxynaphthalenesulfonic acid: 0.15 parts
Fluorine-based surfactant (MEGAFAC F-780, manufactured by DIC Corporation): 0.07 parts
Methyl ethyl ketone: 30 parts
1-Methoxy-2-butyrolactone: 15 parts
γ-Butyrolactone: 15 parts
IR Coloring Agent (1)

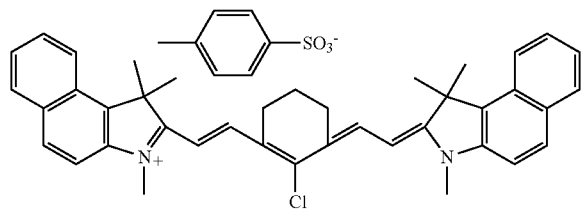

(Coating Solution Composition (II) for Forming Upper Layer)
Novolac resin (m-cresol/p-cresol/phenol=3/2/5, Mw of 8,000): 0.68 parts
Infrared absorbent (IR coloring agent (1): above structure): 0.045 parts
Fluorine-based surfactant (MEGAFAC F-780, manufactured by DIC Corporation): 0.03 parts
Methyl ethyl ketone: 15.0 parts
1-Methoxy-2-propanol: 30.0 parts
5-Benzoyl-4-hydroxy-2-methoxybenzenesulfonate of 1-(4-methylbenzyl)-1-phenylpiperidinium: 0.01 parts The following evaluations were performed on the obtained planographic printing plate precursor, and the results are shown in the following Table 10.

<Evaluation of Non-Image Portion Development Time>

Drawing of a test pattern in an image shape was performed on the planographic printing plate precursor using a Trendsetter VX manufactured by Creo company while changing the exposure energy. Thereafter, the resulting product was immersed in a developing bath charged with a developer XP-D (which was made to have a conductivity of 43 mS/cm by diluting) manufactured by Fujifilm Corporation, and the time required for developing the non-image portion at a developing temperature of 30° C. was measured. The immersion time in which the image density became equal to the image density of the Al support was taken as a non-image portion development time. As the non-image portion development time is shorter, the solubility of a non-image portion in an alkali aqueous solution is excellent and an alkali aqueous solution developability (highlight reproducibility) is good. The results are shown in Table 10.

<Evaluation of Printing Durability>

Drawing of a test pattern in an image shape was performed on the planographic printing plate precursor using a Trendsetter manufactured by Creo company at a beam intensity of 9 W and a drum rotation speed of 150 rpm. Thereafter, using PS PROCESSOR LP940H manufactured by Fujifilm Corporation charged with a developer XP-D (which was made to have a conductivity of 43 mS/cm by diluting) manufactured by Fujifilm Corporation, development was performed at a developing temperature of 30° C. and a development time of 12 seconds. This was continuously printed using a printer LITHRONE manufactured by KOMORI Corporation. As the ink, a tokunen black ink manufactured by TOYO INK CO., LTD. which contains calcium carbonate, as a model of low-grade material was used. At this time, by visually observing how much sheets could be printed while maintaining a sufficient ink density, the printing durability was evaluated. As the number of sheets was larger, the printing durability was evaluated to be excellent. The results are shown in Table 10.

<Evaluation of Chemical Resistance>

Exposure, development, and printing were performed on the planographic printing plate precursors of the examples in the same manner as in the evaluation of the printing durability. In this time, every time 5,000 sheets were printed, a step of wiping the plate surface with a cleaner (manufactured by Fujifilm Corporation, multi cleaner) was performed, and the chemical resistance was evaluated. The printing durability at this time was evaluated as 1 in a case where the number of printed sheets was 95% to 100% of the number of printing endurable sheets described above, evaluated as 2 in a case where the number of printed sheets was 80% or greater and less than 95%, evaluated as 3 in a case where the number of printed sheets was 60% or greater and less than 80%, and evaluated as 4 in a case where the number of printed sheets was less than 60%. Even in a case where the step of wiping the plate surface with a cleaner was performed, as the change in the printing durability index was smaller, the chemical resistance was evaluated to be excellent. The results are shown in the following Table 10.

TABLE 10

| | Support | Specific polymer compound | Non-image portion development time (sec) | Printing durability number of printed sheets (×10000 sheets) | Chemical resistance |
|---|---|---|---|---|---|
| Example-1 | A-1 | PU-44 | 6 | 13 | 1 |
| Example-2 | B-1 | PU-44 | 6 | 13 | 1 |
| Example-3 | C-1 | PU-44 | 6 | 13 | 1 |
| Example-4 | D-1 | PU-44 | 6 | 13 | 1 |
| Example-5 | E-1 | PU-44 | 6 | 13 | 1 |
| Example-6 | F-1 | PU-44 | 6 | 13 | 1 |
| Example-7 | A-1 | PU-1 | 8 | 13 | 1 |
| Example-8 | A-1 | PU-2 | 6 | 12 | 1 |
| Example-9 | A-1 | PU-15 | 8 | 13 | 1 |
| Example-10 | A-1 | PU-37 | 2 | 12 | 1 |
| Example-11 | A-1 | PU-53 | 7 | 13 | 1 |
| Example-12 | A-1 | PT-1 | 5 | 11 | 1 |
| Example-13 | A-1 | PT-2 | 5 | 13 | 1 |
| Example-14 | A-1 | PT-3 | 5 | 13 | 1 |
| Example-15 | A-1 | PT-15 | 6 | 13 | 2 |
| Example-16 | A-1 | PT-18 | 6 | 11 | 2 |
| Example-17 | A-1 | PA-1 | 5 | 13 | 1 |
| Example-18 | A-1 | PA-5 | 6 | 12 | 1 |
| Example-19 | A-1 | PA-19 | 6 | 11 | 2 |
| Example-20 | A-1 | PK-1 | 6 | 12 | 1 |
| Example-21 | A-1 | PK-10 | 5 | 10 | 2 |
| Example-22 | A-1 | PT-61 | 5 | 13 | 1 |
| Example-23 | A-1 | PT-62 | 5 | 12 | 2 |
| Example-24 | A-1 | PT-63 | 5 | 12 | 1 |
| Example-25 | A-1 | PT-65 | 5 | 13 | 1 |
| Example-26 | A-1 | PT-66 | 6 | 13 | 1 |
| Comparative Example-1 | A-1 | CP-1 | 150 | 12 | 2 |

TABLE 10-continued

| | Support | Specific polymer compound | Non-image portion development time (sec) | Printing durability number of printed sheets (×10000 sheets) | Chemical resistance |
|---|---|---|---|---|---|
| Comparative Example-2 | A-1 | CP-2 | 150 | 7 | 4 |
| Comparative Example-3 | A-1 | CP-3 | 20 | 5 | 1 |

Synthesis Example of Comparative Example 1 (CP-1)

Into a three-neck flask provided with a condenser and a stirrer, 12.51 g of 4,4'-diaminodiphenylmethane (manufactured by Tokyo Chemical Industry Co., Ltd.) and 112.59 g of N-methylpyrrolidone (manufactured by Kanto Chemical Co., Inc.) were put, and by being stirred under ice-cooling to obtain a uniform solution. Next, into a dropping funnel, 5.95 g of methylenediphenyl 4,4'-diisocyanate (manufactured by Tokyo Chemical Industry Co., Ltd.) and 53.5 g of N-methylpyrrolidone (manufactured by Kanto Chemical Co., Inc.) were put, followed by dissolving, and the resulting solution was added dropwise to the reaction solution over a period of 1 hour. The resulting product was stirred at 0° C. to 10° C. for 1 hour, and allowed to react at room temperature for 2 hours. The reaction solution was added dropwise to a mixed solution of 0.5 L of pure water and 0.5 L of methanol, and as a result, a polymer was precipitated. This was collected by filtration, washed, and dried, whereby 14.8 g of a binder polymer (CP-1) having a weight-average molecular weight of 76,000 was obtained. It was confirmed from the NMR spectrum, the IR spectrum, and GPC (polystyrene conversion) that the obtained product was the target substance.

Synthesis Example of Comparative Example 2 (CP-2)

Into a three-neck flask provided with a condenser and a stirrer, 6.97 g of 1,6-hexanediamine (manufactured by Tokyo Chemical Industry Co., Ltd.) and 53.9 g of N-methylpyrrolidone (manufactured by Kanto Chemical Co., Inc.) were put, and by being stirred at room temperature under a nitrogen flow to obtain a uniform solution. Next, 9.49 g of pyridine (manufactured by Kanto Chemical Co., Inc.) and 7.33 g of 4-dimethylaminopyridine (manufactured by Tokyo Chemical Industry Co., Ltd.) was added to the reaction solution, followed by dissolving. Next, 22.03 g of 4,4'-oxybis(benzenesulfonylchloride) (manufactured by Tokyo Chemical Industry Co., Ltd.) was added to the flask, followed by stirring at room temperature for 1 hour, then, the temperature was raised to 60° C., and the resulting solution was allowed to react for 10 hours. The reaction solution was added dropwise to a mixed solution of 0.5 L of pure water and 0.5 L of methanol, and as a result, a polymer was precipitated. This was collected by filtration, washed, and dried, whereby 25.5 g of a binder polymer (CP-2) having a weight-average molecular weight of 52,000 was obtained. It was confirmed from the NMR spectrum, the IR spectrum, and GPC (polystyrene conversion) that the obtained product was the target substance.

Synthesis Example of Comparative Example 3 (CP-3)

Into a three-neck flask provided with a condenser and a stirrer, 5.80 g of N,N'-dimethylformamide (manufactured by Wako Pure Chemical Industries, Ltd.) was put, and the solution was stirred at 65° C. for 30 minutes under a nitrogen flow. Next, into a dropping funnel, a 7.21 g of 4-methacrylamidebenzene sulfonamide (manufactured by FUJIFILM Finechemicals Co., Ltd.), 3.00 g of methyl methacrylate (manufactured by Wako Pure Chemical Industries, Ltd.), 2.12 g of acrylonitrile (manufactured by Tokyo Chemical Industry Co., Ltd.), 23.0 g of N,N'-dimethylformamide (manufactured by Wako Pure Chemical Industries, Ltd.), and 0.324 g of azobisisobutyronitrile (manufactured by Wako Pure Chemical Industries, Ltd.) were put, followed by dissolving, and the resulting solution was added dropwise to the flask over a period of 2 hours. The resulting product was stirred at 65° C. for 3 hours. The reaction solution was added dropwise to a mixed solution of 0.5 L of pure water and 0.5 L of methanol, and as a result, a polymer was precipitated. This was collected by filtration, washed, and dried, whereby 11.2 g of a binder polymer (CP-3) having a weight-average molecular weight of 53,000 was obtained. It was confirmed from the NMR spectrum, the IR spectrum, and GPC (polystyrene conversion) that the obtained product was the target substance.

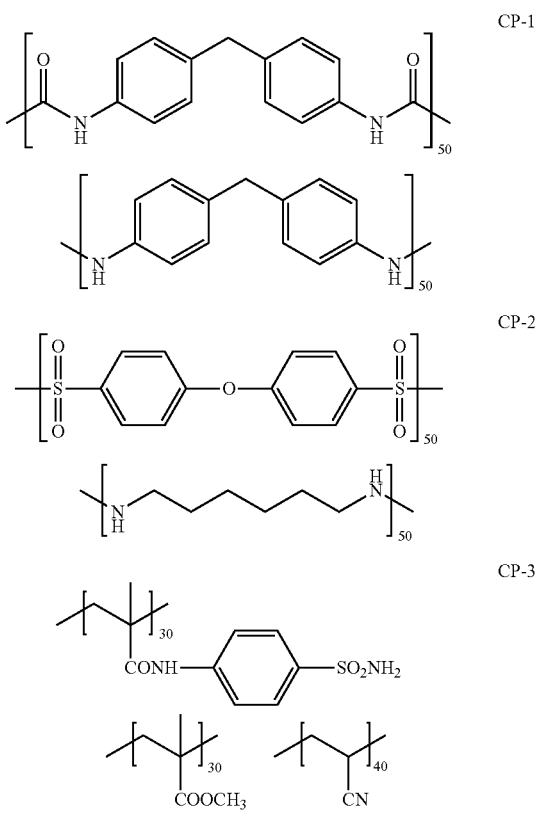

As apparent from the results shown in Table 10, it is found that, in a case where the photosensitive resin composition of the present invention is used, developability, chemical resistance, and printing durability are improved.

Examples 27 to 52 and Comparative Examples 4 to 6

<Production of Support>

In the same manner as in Examples 1 to 26, supports [A] to [F] were produced.

<Formation of Undercoat Layer>

In the same manner as in Examples 1 to 26, supports [A-1] to [F-1] having an undercoat layer were produced.

<Formation of Recording Layer>

After a coating solution composition (III) for forming a lower layer having the following compositional ratio was applied to the obtained supports [A-1] to [F-1] using a wire bar, the resulting product was dried in a drying oven at 150° C. for 40 seconds such that the coating amount became 1.0 g/m², whereby a lower layer was provided. After the lower layer was provided, a coating solution composition (IV) for forming an upper layer having the following compositional ratio was applied using a wire bar, whereby an upper layer was provided. After application, the resulting product was dried at 150° C. for 40 seconds, whereby a planographic printing plate precursor in which the amount of the lower layer and the upper layer coated was 1.2 g/m² was obtained.

(Coating Solution Composition (III) for Forming Lower Layer)

Copolymer (weight-average molecular weight of 65,000) of N-(p-aminosulfonylphenyl)methacrylamide/methyl methacrylate/acrylonitrile=35/35/30 (molar ratio): 3.5 parts m,p-Cresol novolac (m/p ratio=6/4, weight-average molecular weight of 6,000): 0.6 parts Infrared absorbent (above IR coloring agent (1)): 0.2 parts 4,4'-Bishydroxyphenyl sulfone: 0.3 parts Tetrahydrophthalic acid: 0.4 parts p-Toluenesulfonic acid: 0.02 parts 3-Methoxy-4-diazodiphenylamine hexafluorophosphate: 0.06 parts Product obtained by replacing a counter ion of ethyl violet with 6-hydroxynaphthalenesulfonic acid: 0.15 parts Fluorine-based surfactant (MEGAFAC F-780, manufactured by DIC Corporation): 0.07 parts Methyl ethyl ketone: 30 parts 1-Methoxy-2-butyrolactone: 15 parts γ-butyrolactone: 15 parts (Coating Solution Composition (IV) for Forming Upper Layer)

Specific polymer compound described in Table 11: 0.3 parts

Novolac resin (m-cresol/p-cresol/phenol=3/2/5, Mw 8,000): 0.4 parts

Infrared absorbent (above IR coloring agent (1)): 0.045 parts

Fluorine-based surfactant (MEGAFAC F-780, manufactured by DIC Corporation): 0.03 parts Methyl ethyl ketone: 15.0 parts 1-Methoxy-2-propanol: 30.0 parts 5-Benzoyl-4-hydroxy-2-methoxybenzenesulfonate of 1-(4-methylbenzyl)-1-phenylpiperidinium: 0.01 parts Evaluation was performed on the obtained planographic printing plate precursor under the same conditions as in Example 1. The results are shown in the following Table 11.

TABLE 11

| | Support | Specific polymer compound | Non-image portion development time (sec) | Printing durability number of printed sheets (×10000 sheets) | Chemical resistance |
|---|---|---|---|---|---|
| Example-27 | A-1 | PU-44 | 6 | 11 | 1 |
| Example-28 | B-1 | PU-44 | 6 | 11 | 1 |
| Example-29 | C-1 | PU-44 | 6 | 11 | 1 |
| Example-30 | D-1 | PU-44 | 6 | 11 | 1 |
| Example-31 | E-1 | PU-44 | 6 | 11 | 1 |
| Example-32 | F-1 | PU-44 | 6 | 11 | 1 |
| Example-33 | A-1 | PU-1 | 8 | 11 | 1 |
| Example-34 | A-1 | PU-2 | 6 | 10 | 1 |
| Example-35 | A-1 | PU-15 | 8 | 11 | 1 |
| Example-36 | A-1 | PU-37 | 2 | 10 | 1 |
| Example-37 | A-1 | PU-53 | 7 | 11 | 1 |
| Example-38 | A-1 | PT-1 | 5 | 9 | 1 |
| Example-39 | A-1 | PT-2 | 5 | 11 | 1 |
| Example-40 | A-1 | PT-3 | 5 | 11 | 1 |
| Example-41 | A-1 | PT-15 | 6 | 11 | 2 |
| Example-42 | A-1 | PT-18 | 6 | 9 | 2 |
| Example-43 | A-1 | PA-1 | 5 | 11 | 1 |
| Example-44 | A-1 | PA-5 | 6 | 10 | 1 |
| Example-45 | A-1 | PA-19 | 6 | 9 | 2 |
| Example-46 | A-1 | PK-1 | 6 | 10 | 1 |
| Example-47 | A-1 | PK-10 | 5 | 8 | 2 |
| Example-48 | A-1 | PT-61 | 5 | 11 | 1 |
| Example-49 | A-1 | PT-62 | 5 | 10 | 1 |
| Example-50 | A-1 | PT-63 | 5 | 11 | 1 |
| Example-51 | A-1 | PT-65 | 6 | 11 | 1 |
| Example-52 | A-1 | PT-66 | 6 | 11 | 1 |
| Comparative Example-4 | A-1 | CP-1 | 150 | 10 | 2 |
| Comparative Example-5 | A-1 | CP-2 | 150 | 6 | 4 |
| Comparative Example-6 | A-1 | CP-3 | 19 | 5 | 1 |

As apparent from the results shown in Table 11, it is found that, in a case where the photosensitive resin composition of the present invention is used, chemical resistance, developability, and printing durability are improved.

Examples 53 to 78 and Comparative Examples 7 to 9

<Production of Support>

In the same manner as in Examples 1 to 26, supports [A] to [F] were produced.

<Formation of Undercoat Layer>

An undercoat layer coating solution 2 shown below was applied to each of the supports [A] to [F] produced in the above manner, followed by drying at 80° C. for 15 seconds, whereby supports [A-1] to [F-1] provided with an undercoat layer were obtained. The coating amount after drying was 15 mg/m².

(Undercoat layer coating solution 2)

β-alanine: 0.5 parts

Methanol: 95 parts

Water: 5 parts

<Formation of Recording Layer>

After a coating solution composition (V) for forming a lower layer having the following compositional ratio was applied to the obtained supports [A-1] to [F-1] using a wire bar such that the coating amount became 1.5 g/m², the resulting product was dried in a drying oven at 16° C. for 40 seconds and, immediately, cooled until the temperature of the support reached 35° C. using a cold air at 17° C. to 20° C., whereby a lower layer was provided. After the lower layer was provided, a coating solution composition (VI) for forming an upper layer having the following compositional ratio was applied thereto using a wire bar such that the coating amount became 0.5 g/m², and by drying the resulting product at 130° C. for 40 seconds and slowly cooling using an air at 20° C. to 26° C., an upper layer was provided, whereby a planographic printing plate precursor was obtained.

(Coating Solution Composition (V) for Forming Lower Layer)
  Specific polymer compound described in Table 12: 0.8 parts
  Infrared absorbent (IR coloring agent (1): above structure): 0.017 parts
  CRYSTAL VIOLET (manufactured by HODOGAYA CHEMICAL CO., LTD.): 0.017 parts
  MEGAFAC F-177 (manufactured by DIC Corporation, fluorine-based surfactant): 0.015 parts
  γ-Butyrolactone: 10 parts
  Methyl ethyl ketone: 10 parts
  1-Methoxy-2-propanol: 8 parts (Coating Solution Composition (VI) for Forming Upper Layer)
  Styrene/acrylonitrile/methacrylic acid copolymers (compositional ratio of 69 mol %/25 mol %/6 mol %, weight-average molecular weight=45,000): 20 parts
  Alkali-soluble resin: following polyurethane 1: 10 parts
  Ethyl Violet: 0.03 parts
  MEGAFAC F-177 (manufactured by DIC Corporation, fluorine-based surfactant): 0.05 parts
  3-Pentanone: 60 parts
  Propylene glycol monomethyl ether-2-acetate: 8 parts (Polyurethane 1)
A diisocyanate compound and a diol compound represented by the following formulae were polymerized to be a molar ratio of 1:1 (weight-average molecular weight of 36,000).

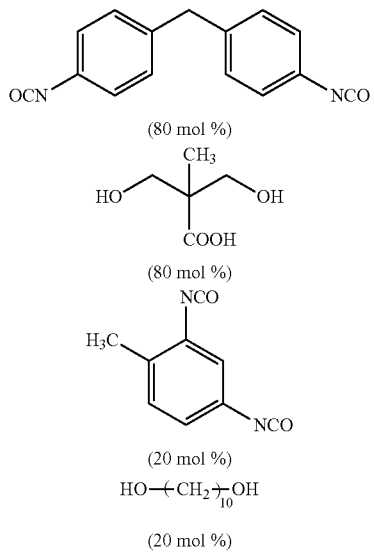

Evaluation was performed on the obtained planographic printing plate precursor under the same conditions as in Examples 1 to 26 except that the specific developer A described below was used in a development treatment. The results are shown in the following Table 12.

(Compositional Ratio of Specific Developer A)
Water: 796 parts
Sodium carbonate: 12.8 parts
Sodium hydrogen carbonate: 7.0 parts
Sodium gluconate: 15.5 parts
Softazoline LPB-R (30% aqueous solution): 154.0 parts
Softazoline LAO (30% aqueous solution): 38.0 parts
Ethylenediamine disuccinate: 6.7 parts
pH 9.85

TABLE 12

| | Support | Specific polymer compound | Non-image portion development time (sec) | Printing durability number of printed sheets (×10000 sheets) | Chemical resistance |
|---|---|---|---|---|---|
| Example-53 | A-1 | PU-44 | 4 | 15 | 1 |
| Example-54 | B-1 | PU-44 | 4 | 15 | 1 |
| Example-55 | C-1 | PU-44 | 4 | 15 | 1 |
| Example-56 | D-1 | PU-44 | 4 | 15 | 1 |
| Example-57 | E-1 | PU-44 | 4 | 15 | 1 |
| Example-58 | F-1 | PU-44 | 4 | 15 | 1 |
| Example-59 | A-1 | PU-1 | 6 | 15 | 1 |
| Example-60 | A-1 | PU-2 | 4 | 14 | 1 |
| Example-61 | A-1 | PU-15 | 6 | 14 | 1 |
| Example-62 | A-1 | PU-37 | 2 | 14 | 1 |
| Example-63 | A-1 | PU-53 | 5 | 14 | 1 |
| Example-64 | A-1 | PT-1 | 4 | 14 | 1 |
| Example-65 | A-1 | PT-2 | 4 | 14 | 1 |
| Example-66 | A-1 | PT-3 | 4 | 14 | 1 |
| Example-67 | A-1 | PT-15 | 4 | 13 | 2 |
| Example-68 | A-1 | PT-18 | 4 | 12 | 2 |
| Example-69 | A-1 | PA-1 | 4 | 12 | 1 |
| Example-70 | A-1 | PA-5 | 4 | 12 | 1 |
| Example-71 | A-1 | PA-19 | 4 | 11 | 2 |
| Example-72 | A-1 | PK-1 | 4 | 11 | 1 |
| Example-73 | A-1 | PK-10 | 4 | 11 | 2 |
| Example-74 | A-1 | PT-61 | 4 | 15 | 1 |
| Example-75 | A-1 | PT-62 | 4 | 14 | 1 |
| Example-76 | A-1 | PT-63 | 4 | 15 | 1 |
| Example-77 | A-1 | PT-65 | 4 | 15 | 1 |
| Example-78 | A-1 | PT-66 | 4 | 15 | 1 |
| Comparative Example-7 | A-1 | CP-1 | 150 | 13 | 2 |
| Comparative Example-8 | A-1 | CP-2 | 150 | 9 | 4 |
| Comparative Example-9 | A-1 | CP-3 | 18 | 7 | 1 |

As apparent from the results shown in Table 12, it is found that, in a case where the photosensitive resin composition of the present invention is used, chemical resistance, developability, and printing durability are improved.

Examples 79 to 104 and Comparative Examples 10 to 12

<Production of Support>
In the same manner as in Examples 1 to 26, supports [A] to [F] were produced.
<Formation of Undercoat Layer>
In the same manner as in Examples 1 to 26, supports [A-1] to [F-1] having an undercoat layer were produced.
<Formation of Recording Layer>
After a coating solution composition (VII) for forming a lower layer having the following compositional ratio was applied to the obtained supports [A-1] to [F-1] using a wire bar such that the coating amount became 1.5 g/m², the resulting product was dried in a drying oven at 160° C. for 40 seconds and, immediately, cooled until the temperature of the support reached 35° C. using a cold air at 17° C. to 20° C., whereby a lower layer was provided. After the lower layer was provided, a coating solution composition (VIII) for forming an upper layer having the following compositional ratio was applied thereto using a wire bar such that the coating amount became 0.5 g/m², and by drying the resulting product at 130° C. for 40 seconds and slowly cooling using an air at 20° C. to 26° C., an upper layer was provided, whereby a planographic printing plate precursor was obtained.

(Coating Solution Composition (VII) for Forming Lower Layer)

N-phenylmaleimide/methacrylic acid/methacrylic amide copolymer (copolymerization ratio of 60 mol %/15 mol %/25 mol %, weight-average molecular weight=50,000): 0.8 parts Infrared absorbent (IR coloring agent (1): above structure): 0.017 parts CRYSTAL VIOLET (manufactured by HODOGAYA CHEMICAL CO., LTD.): 0.017 parts MEGAFAC F-177 (manufactured by DIC Corporation, fluorine-based surfactant): 0.015 parts γ-Butyrolactone: 10 parts Methyl ethyl ketone: 10 parts 1-Methoxy-2-propanol: 8 parts (Coating Solution Composition (VIII) for Forming Upper Layer)

Specific polymer compound described in Table 13: 20 parts

Alkali-soluble resin: the above-described polyurethane 1: 10 parts

Ethyl Violet: 0.03 parts

MEGAFAC F-177 (manufactured by DIC Corporation, fluorine-based surfactant): 0.05 parts 3-Pentanone: 60 parts Propylene glycol monomethyl ether-2-acetate: 8 parts Evaluation was performed on the obtained planographic printing plate precursor under the same conditions as in Examples 1 to 26. The results are shown in the following Table 13.

TABLE 13

| | Support | Specific polymer compound | Non-image portion development time (sec) | Printing durability number of printed sheets (×10000 sheets) | Chemical resistance |
|---|---|---|---|---|---|
| Example-79 | A-1 | PU-44 | 4 | 14 | 1 |
| Example-80 | B-1 | PU-44 | 4 | 14 | 1 |
| Example-81 | C-1 | PU-44 | 4 | 14 | 1 |
| Example-82 | D-1 | PU-44 | 4 | 14 | 1 |
| Example-83 | E-1 | PU-44 | 4 | 14 | 1 |
| Example-84 | F-1 | PU-44 | 4 | 14 | 1 |
| Example-85 | A-1 | PU-1 | 6 | 14 | 1 |
| Example-86 | A-1 | PU-2 | 4 | 13 | 1 |
| Example-87 | A-1 | PU-15 | 6 | 13 | 1 |
| Example-88 | A-1 | PU-37 | 2 | 13 | 1 |
| Example-89 | A-1 | PU-53 | 5 | 13 | 1 |
| Example-90 | A-1 | PT-1 | 4 | 13 | 1 |
| Example-91 | A-1 | PT-2 | 4 | 13 | 1 |
| Example-92 | A-1 | PT-3 | 4 | 13 | 1 |
| Example-93 | A-1 | PT-15 | 4 | 12 | 2 |
| Example-94 | A-1 | PT-18 | 4 | 11 | 2 |
| Example-95 | A-1 | PA-1 | 4 | 12 | 1 |
| Example-96 | A-1 | PA-5 | 4 | 12 | 1 |
| Example-97 | A-1 | PA-19 | 4 | 11 | 2 |
| Example-98 | A-1 | PK-1 | 4 | 11 | 1 |
| Example-99 | A-1 | PK-10 | 4 | 11 | 2 |
| Example-100 | A-1 | PT-61 | 4 | 13 | 1 |
| Example-101 | A-1 | PT-62 | 4 | 13 | 1 |
| Example-102 | A-1 | PT-63 | 4 | 13 | 1 |
| Example-103 | A-1 | PT-65 | 4 | 13 | 1 |
| Example-104 | A-1 | PT-66 | 4 | 13 | 1 |
| Comparative Example-10 | A-1 | CP-1 | 150 | 12 | 2 |
| Comparative Example-11 | A-1 | CP-2 | 150 | 8 | 4 |
| Comparative Example-12 | A-1 | CP-3 | 16 | 6 | 1 |

As apparent from the results shown in Table 13, it is found that, in a case where the photosensitive resin composition of the present invention is used, chemical resistance, developability, and printing durability are improved.

Examples 105 to 120 and Comparative Examples 13 to 15

<Production of Support>

In the same manner as in Examples 1 to 26, supports [A] to [F] were produced.

<Formation of Undercoat Layer>

In the same manner as in Examples 1 to 26, supports [A-I] to [F-I] having an undercoat layer were produced.

<Formation of Recording Layer>

After a coating solution composition (IX) having the following compositional ratio was applied to the obtained supports [A-I] to [F-I] using a wire bar, the resulting product was dried in a drying oven at 140° C. for 50 seconds, whereby a planographic printing plate precursor having a coating amount of 1.0 g/m² was obtained.

(Coating Solution Composition (IX))

m,p-Cresol novolac (m/p ratio=6/4, weight-average molecular weight of 5,000): 0.474 parts Specific polymer compound described in Table 14: 2.37 parts Infrared absorbent (above IR coloring agent (1)): 0.155 parts 2-Methoxy-4-(N-phenylamino)benzenediazonium hexafluorophosphate: 0.03 parts Tetrahydrophthalic anhydride: 0.19 parts Product obtained by replacing an counter ion of ethyl violet with 6-hydroxy-β-naphthalenesulfonic acid: 0.11 parts Fluorine-based surfactant (MEGAFAC F-780, manufactured by Dainippon Ink and Chemicals): 0.07 parts p-Toluenesulfonic acid: 0.008 parts Bis-p-hydroxyphenyl sulfone: 0.13 parts 3,3'-Dimyristyl thiodipropionate: 0.04 parts Lauryl stearate: 0.02 parts γ-Butyrolactone: 13 parts Methyl ethyl ketone: 24 parts 1-Methoxy-2-propanol: 11 parts Evaluation was performed on the obtained planographic printing plate precursor under the same conditions as in Example 1 except that a developer LH-DS manufactured by Fujifilm Corporation was used in a development treatment, and the results are shown in the following Table 14.

TABLE 14

| | Support | Specific polymer compound | Non-image portion development time (sec) | Printing durability number of printed sheets (×10000 sheets) | Chemical resistance |
|---|---|---|---|---|---|
| Example-105 | A-1 | PU-44 | 8 | 13 | 1 |
| Example-106 | B-1 | PU-44 | 8 | 13 | 1 |
| Example-107 | C-1 | PU-44 | 8 | 13 | 1 |
| Example-108 | D-1 | PU-44 | 8 | 13 | 1 |
| Example-109 | E-1 | PU-44 | 8 | 13 | 1 |
| Example-110 | F-1 | PU-44 | 8 | 13 | 1 |
| Example-111 | A-1 | PU-1 | 8 | 13 | 1 |
| Example-112 | A-1 | PU-2 | 9 | 12 | 1 |
| Example-113 | A-1 | PU-15 | 11 | 13 | 1 |
| Example-114 | A-1 | PU-37 | 3 | 12 | 1 |
| Example-115 | A-1 | PU-53 | 12 | 13 | 1 |
| Example-116 | A-1 | PT-1 | 8 | 11 | 1 |
| Example-117 | A-1 | PT-2 | 8 | 13 | 1 |
| Example-118 | A-1 | PT-3 | 12 | 13 | 1 |
| Example-119 | A-1 | PT-15 | 9 | 13 | 2 |
| Example-120 | A-1 | PT-18 | 4 | 11 | 2 |
| Example-121 | A-1 | PA-1 | 7 | 13 | 1 |
| Example-122 | A-1 | PA-5 | 7 | 12 | 1 |
| Example-123 | A-1 | PA-19 | 6 | 11 | 2 |
| Example-124 | A-1 | PK-1 | 7 | 12 | 1 |
| Example-125 | A-1 | PK-10 | 7 | 10 | 2 |
| Example-126 | A-1 | PT-61 | 8 | 13 | 1 |
| Example-127 | A-1 | PT-62 | 8 | 12 | 1 |
| Example-128 | A-1 | PT-63 | 9 | 13 | 1 |
| Example-129 | A-1 | PT-65 | 8 | 13 | 1 |
| Example-130 | A-1 | PT-66 | 8 | 13 | 1 |
| Comparative Example-13 | A-1 | CP-1 | 150 | 11 | 2 |
| Comparative Example-14 | A-1 | CP-2 | 150 | 9 | 4 |
| Comparative Example-15 | A-1 | CP-3 | 25 | 5 | 1 |

As apparent from the results shown in Table 14, it is found that, in a case where the photosensitive resin composition of the present invention is used, chemical resistance, developability, and printing durability are improved.

What is claimed is:

1. A photosensitive resin composition, comprising:
a polymer compound which has a polycyclic structure and a sulfonamide group in a main chain thereof; and
an infrared absorbent,
wherein the polycyclic structure comprises at least one structure selected from the group consisting of a fused cyclic hydrocarbon structure and a fused polycyclic aromatic structure, wherein
the polymer compound comprises a structure represented by any one of the following Formulae A-1 to A-3:

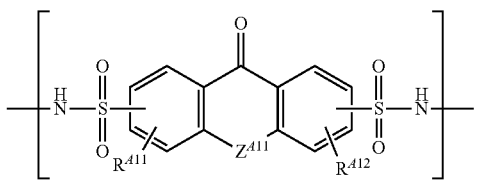
(A-1)

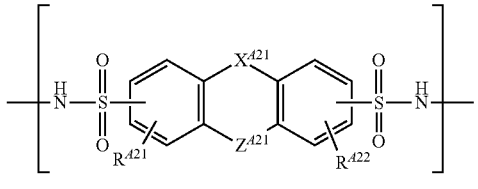
(A-2)

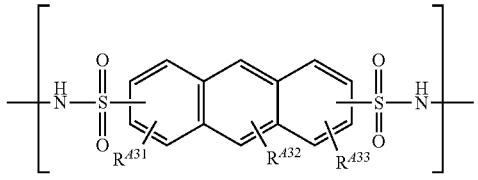
(A-3)

wherein, in Formulae A-1 to A-3, $R^{A11}$, $R^{A12}$, $R^{A21}$, $R^{A22}$, and $R^{A31}$ to $R^{A33}$ each independently represent a hydrogen atom, a sulfonamide group, a hydroxyl group, a carboxy group, an alkyl group, or a halogen atom; $Z^{A11}$ and $Z^{A21}$ each independently represent —C(R)$_2$—, —O—, —NR—, —S—, or a single bond, wherein R represents a hydrogen atom or an alkyl group; and $X^{A21}$ represents —C(R')$_2$—, —O—, —NR'—, —S—, or a single bond, wherein R' represents a hydrogen atom or an alkyl group.

2. The photosensitive resin composition according to claim 1, wherein the polymer compound comprises a structure represented by any one of the following Formulae B-1 to B-3:

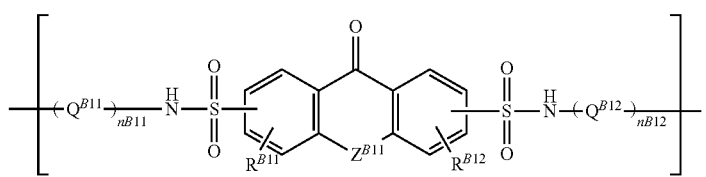
(B-1)

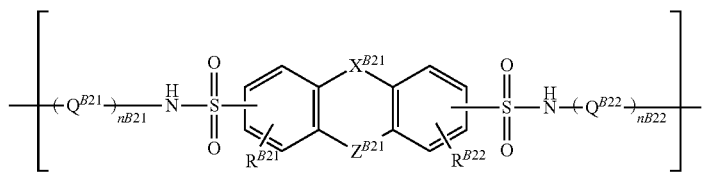
(B-2)

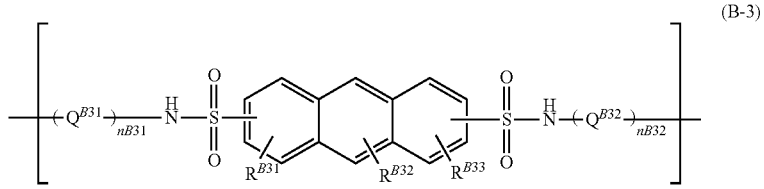

wherein, in Formulae B-1 to B-3, $R^{B11}$, $R^{B12}$, $R^{B21}$, $R^{B22}$, and $R^{B31}$ to $R^{B33}$ each independently represent a hydrogen atom, a sulfonamide group, a hydroxyl group, a carboxy group, an alkyl group, or a halogen atom; $Z^{B11}$ and $Z^{B21}$ each independently represent —C(R)$_2$—, —O—, —NR—, —S—, or a single bond, wherein R represents a hydrogen atom or an alkyl group; $X^{B21}$ represents —C(R')$_2$—, —O—, —NR'—, —S—, or a single bond, wherein R' represents a hydrogen atom or an alkyl group; $Q^{B11}$, $Q^{B12}$, $Q^{B21}$, $Q^{B22}$, $Q^{B31}$, and $Q^{32}$ each independently represent an alkylene group, an arylene group, a divalent saturated alicyclic hydrocarbon group, a divalent unsaturated alicyclic hydrocarbon group, or a divalent group formed by a plurality of these groups being linked to each other; and nB11, nB12, nB21, nB22, nB31, and nB32 each independently represent an integer of 1 or larger.

3. The photosensitive resin composition according to claim 2, wherein the polymer compound comprises a structure represented by the following Formula C-1 or C-2 as the structure represented by Formula B-1 or comprises a structure represented by the following Formula C-3 or C-4 as the structure represented by Formula B-2:

wherein, in Formulae C-1 to C-4, $R^{C11}$, $R^{C12}$, $R^{C21}$, $R^{C22}$, $R^{C31}$, $R^{C32}$, $R^{C41}$, and $R^{C42}$ each independently represent a hydrogen atom, a sulfonamide group, a hydroxyl group, a carboxy group, an alkyl group, or a halogen atom; $Q^{C11}$, $Q^{C12}$, $Q^{C21}$, $Q^{C22}$, $Q^{C31}$, $Q^{C32}$, $Q^{C41}$, and $Q^{C42}$ each independently represent an alkylene group, an arylene group, a divalent saturated alicyclic hydrocarbon group, a divalent unsaturated alicyclic hydrocarbon group, or a divalent group formed by a plurality of these groups being linked to each other; and nC11, nC12, nC21, nC22, nC31, nC32, nC41, and nC42 each independently represent an integer of 1 or larger.

4. The photosensitive resin composition according to claim 3, wherein the polymer compound comprises the structure represented by Formula C-1 or C-2.

5. The photosensitive resin composition according to claim 1, wherein the polymer compound further comprises an alkyleneoxy group in the main chain thereof.

6. The photosensitive resin composition according to claim 1, wherein the polymer compound further comprises at least one selected from the group consisting of a urea bond, a urethane bond, an imide bond, an amide bond, a

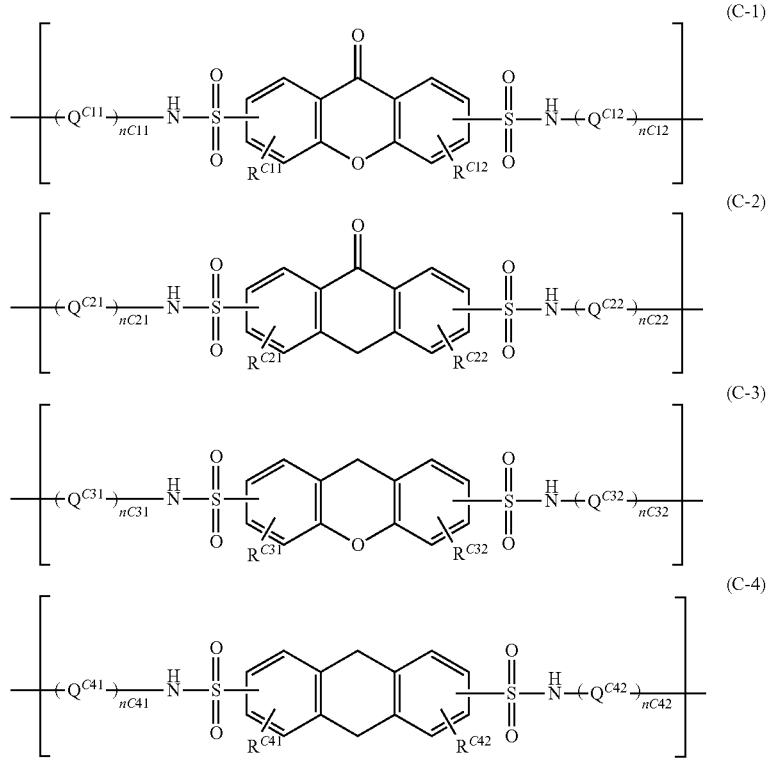

carbonate bond, and a linking group formed by two or more of these bonds being bonded to each other, in the main chain thereof.

7. A planographic printing plate precursor, comprising:
a support having a hydrophilic surface; and
an image recording layer which comprises the photosensitive resin composition according to claim 1, on the support.

8. The planographic printing plate precursor according to claim 7, which is a positive type planographic printing plate precursor.

9. The planographic printing plate precursor according to claim 7, which is a positive type planographic printing plate precursor, wherein the image recording layer comprises a lower layer and an upper layer in this order, on the support having a hydrophilic surface, and wherein at least one of the lower layer or the upper layer comprises the photosensitive resin composition.

10. The planographic printing plate precursor according to claim 7, further comprising an undercoat layer between the support having a hydrophilic surface and the image recording layer.

11. A method for producing a planographic printing plate, comprising in the following order:
image-wise exposing the planographic printing plate precursor according to claim 7; and
performing development using an alkali aqueous solution having a pH of 8.5 to 13.5.

12. A polymer compound, comprising a structure represented by any one of the following Formulae B-1, B-2, B-3 and B-6:

wherein, in Formulae B-1, B-2, B-3 and B-6, $R^{B11}$, $R^{B12}$, $R^{B21}$, $R^{B22}$, $R^{B31}$ to $R^{B33}$, and $R^{B61}$ to $R^{B63}$ each independently represent a hydrogen atom, a sulfonamide group, a hydroxyl group, a carboxy group, an alkyl group, or a halogen atom; $Z^{B11}$ and $Z^{B21}$ each independently represent —C(R)$_2$—, —O—, —NR—, —S—, or a single bond, wherein R represents a hydrogen atom or an alkyl group; $X^{B21}$ represents —C(R')$_2$—, —O—, —NR'—, —S—, or a single bond, wherein R' represents a hydrogen atom or an alkyl group; $Q^{B11}$, $Q^{B12}$, $Q^{B21}$, $Q^{B22}$, $Q^{B31}$, $Q^{32}$, $Q^{B61}$, and $Q^{B62}$ each independently represent an alkylene group, an arylene group, a divalent saturated alicyclic hydrocarbon group, a divalent unsaturated alicyclic hydrocarbon group, or a divalent group formed by a plurality of these groups being linked to each other; and nB11, nB12, nB21, nB22, nB31, nB32, nB61, and nB62 each independently represent an integer of 1 or larger.

13. The polymer compound according to claim 12, which comprises a structure represented by the following Formula C-1 or C-2 as the structure represented by Formula B-1 or comprises a structure represented by the following Formula C-3 or C-4 as the structure represented by Formula B-2:

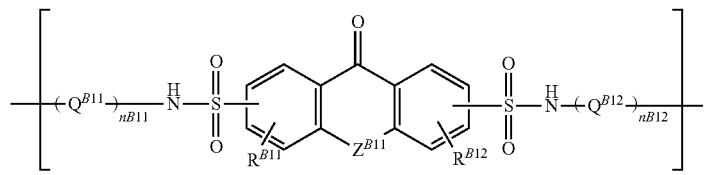
(B-1)

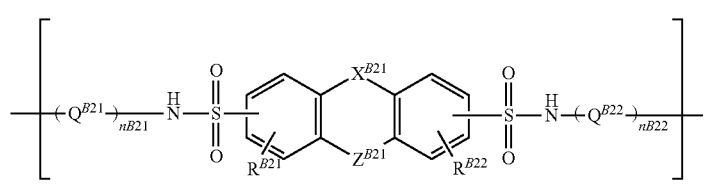
(B-2)

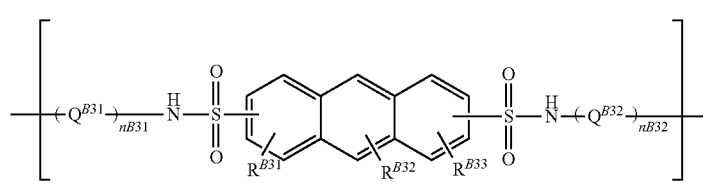
(B-3)

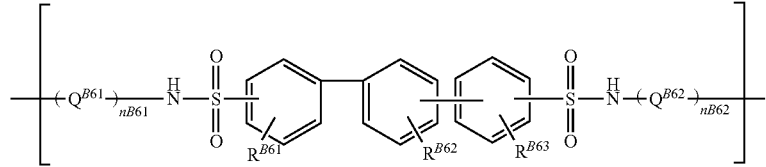
(B-6)

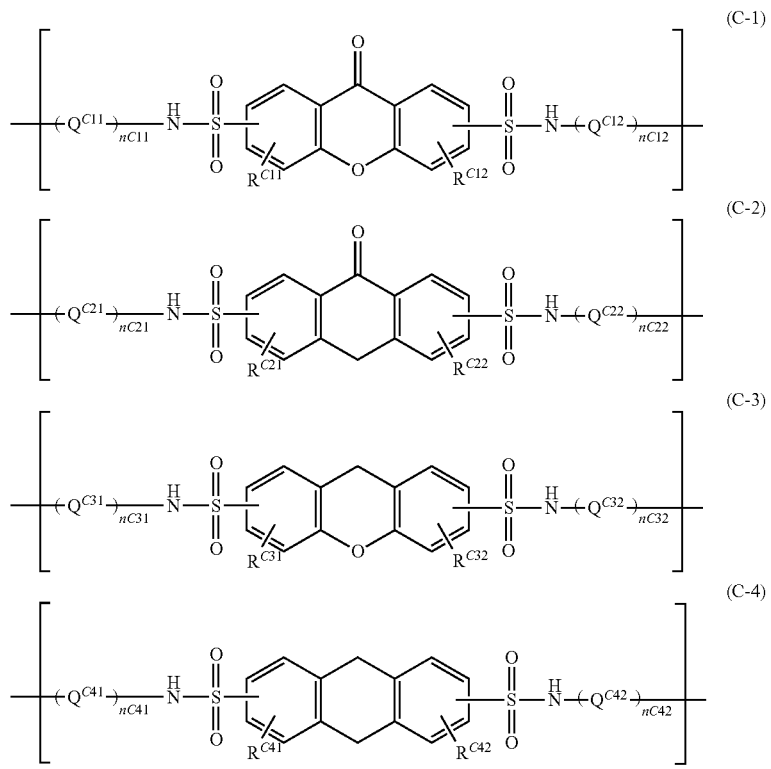

wherein, in Formulae C-1 to C-4, $R^{C11}$, $R^{C12}$, $R^{C21}$, $R^{C22}$, $R^{C31}$, $R^{C32}$, $R^{C41}$, and $R^{C42}$ each independently represent a hydrogen atom, a sulfonamide group, a hydroxyl group, a carboxy group, an alkyl group, or a halogen atom; $Q^{C11}$, $Q^{C12}$, $Q^{C21}$, $Q^{C22}$, $Q^{C31}$, $Q^{C32}$, $Q^{C41}$, and $Q^{C42}$ each independently represent an alkylene group, an arylene group, a divalent saturated alicyclic hydrocarbon group, a divalent unsaturated alicyclic hydrocarbon group, or a divalent group formed by a plurality of these groups being linked to each other; and nC11, nC12, nC21, nC22, nC31, nC32, nC41, and nC42 each independently represent an integer of 1 or larger.

14. The polymer compound according to claim 13, which comprises the structure represented by Formula C-1 or C-2.

15. The polymer compound according to claim 12, comprising an alkyleneoxy group in a main chain thereof.

16. The polymer compound according to claim 12, further comprising at least one selected from the group consisting of a urea bond, a urethane bond, an imide bond, an amide bond, a carbonate bond, and a linking group formed by two or more of these bonds being bonded to each other, in the main chain thereof.

* * * * *